US011284655B2

(12) United States Patent
Pavalarajan et al.

(10) Patent No.: US 11,284,655 B2
(45) Date of Patent: *Mar. 29, 2022

(54) SURGICAL HELMET

(71) Applicant: Zimmer, Inc., Warsaw, IN (US)

(72) Inventors: Ganesh B Pavalarajan, Massillon, OH (US); Douglas C Barker, Canton, OH (US); John Bartholomew, Hilliard, OH (US); George Brand, Dublin, OH (US); Anna Diorio-Blum, Columbus, OH (US); Larry Keith Hooks, Jr., Gahanna, OH (US); Steven E. Huckaby, Blacklick, OH (US); Russell Kittel, Gahanna, OH (US); James Prescott, Columbus, OH (US); Krista I. A. Smith, Dublin, OH (US)

(73) Assignee: Zimmer, Inc., Warsaw, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/874,227

(22) Filed: May 14, 2020

(65) Prior Publication Data

US 2020/0268073 A1    Aug. 27, 2020

Related U.S. Application Data

(63) Continuation of application No. 15/713,334, filed on Sep. 22, 2017, now Pat. No. 10,687,568.
(Continued)

(51) Int. Cl.
*A41D 13/11* (2006.01)
*A41D 13/12* (2006.01)
(Continued)

(52) U.S. Cl.
CPC ...... *A41D 13/1153* (2013.01); *A41D 13/1218* (2013.01); *A42B 3/225* (2013.01);
(Continued)

(58) Field of Classification Search
CPC ............ A41D 13/1209; A41D 13/0025; A41D 13/11; A41D 13/1153; A41D 13/1192;
(Continued)

(56) References Cited

U.S. PATENT DOCUMENTS 3,783,450 A    1/1974  O'Connor
3,793,644 A *  2/1974  Kellner .................. A41B 13/10
                                                              2/48
(Continued)

FOREIGN PATENT DOCUMENTS

DE         853263 C      10/1952
EP       2853169 A1       4/2015
(Continued)

OTHER PUBLICATIONS

"U.S. Appl. No. 15/332,389, Non Final Office Action dated Jun. 26, 2020", 5 pgs.
(Continued)

*Primary Examiner* — Robert H Muromoto, Jr.
(74) *Attorney, Agent, or Firm* — Schwegman Lundberg & Woessner. P.A.

(57) ABSTRACT

Implementations described herein include surgical helmet assemblies that have a helmet enclosure shaped to encircle a head of a user. The helmet enclosure retains a fan and includes a brow bar portion at a front of the helmet enclosure that is shaped to extend along a brow or a forehead of the user and having a light positioned therein. The helmet enclosure also includes a stabilizer extending downward from the helmet enclosure in front of the ears of a user, a face shield that is transparent and coupleable to at least the brow bar portion, a headband shaped to extend across an occiput region of the user's head, and a surgical garment for covering at least the head and shoulders of a user in use. The brow bar portion includes vents disposed therein to direct
(Continued)

airflow pushed through the helmet enclosure from the fan onto the user. The face shield is coupleable to the helmet enclosure by one or more of a hook and loop fastener on the helmet enclosure or the stabilizer and a post protruding from the brow bar portion.

20 Claims, 48 Drawing Sheets

Related U.S. Application Data

(60) Provisional application No. 62/410,131, filed on Oct. 19, 2016, provisional application No. 62/399,067, filed on Sep. 23, 2016, provisional application No. 62/399,051, filed on Sep. 23, 2016, provisional application No. 62/399,071, filed on Sep. 23, 2016.

(51) Int. Cl.
| | | |
|---|---|---|
| *A42B 3/22* | (2006.01) | |
| *A42B 3/28* | (2006.01) | |
| *A41D 13/02* | (2006.01) | |
| *A62B 17/04* | (2006.01) | |
| *A62B 18/04* | (2006.01) | |

(52) U.S. Cl.
  CPC .............. *A42B 3/286* (2013.01); *A62B 17/04* (2013.01); *A62B 18/045* (2013.01)

(58) Field of Classification Search
  CPC ............ A41D 13/1227; A41D 19/0089; A41D 2500/30; A41D 13/04; A41D 15/002; A41D 31/30; A62B 18/045; A62B 17/04; A62B 18/082; A62B 18/003; A42B 3/286; A42B 3/225; A61B 2090/401; A61B 2090/502; A61B 90/05; A61B 46/00; A61F 9/029; A61F 9/06
  See application file for complete search history.

(56) References Cited

U.S. PATENT DOCUMENTS

| | | | |
|---|---|---|---|
| 3,925,821 A | 12/1975 | Lewicki | |
| 4,622,700 A | 11/1986 | Sundahl | |
| 4,901,716 A | 2/1990 | Stackhouse et al. | |
| 4,995,117 A | 2/1991 | Mirage | |
| 5,010,598 A | 4/1991 | Flynn et al. | |
| 5,054,480 A | 10/1991 | Bare et al. | |
| 5,577,495 A * | 11/1996 | Murphy ................ | A42B 3/225 128/201.22 |
| 6,081,929 A | 7/2000 | Rothrock et al. | |
| 6,393,617 B1 | 5/2002 | Paris et al. | |
| 6,427,253 B1 | 8/2002 | Penny | |
| 6,442,767 B1 | 9/2002 | Meckes et al. | |
| 6,471,019 B1 | 10/2002 | Miller | |
| 6,481,019 B2 * | 11/2002 | Diaz ...................... | A41D 13/11 128/201.19 |
| 6,532,602 B2 | 3/2003 | Walters et al. | |
| 6,711,748 B2 | 3/2004 | Paris et al. | |
| 6,837,239 B2 * | 1/2005 | Beizndtsson ........ | A62B 17/005 128/201.25 |
| 6,955,444 B2 | 10/2005 | Gupta | |
| 6,973,677 B2 * | 12/2005 | Diaz ...................... | A41D 13/11 128/201.19 |
| 6,990,691 B2 * | 1/2006 | Klotz ................ | A41D 13/1153 2/171.3 |
| 7,192,151 B2 | 3/2007 | Clupper et al. | |
| 7,200,873 B2 | 4/2007 | Klotz et al. | |
| 7,694,353 B2 | 4/2010 | Weston | |
| 7,752,682 B2 | 7/2010 | Vanderwoude et al. | |
| 7,937,775 B2 * | 5/2011 | Manzella, Jr. ..... | A41D 13/0025 128/201.22 |
| 8,156,570 B1 | 4/2012 | Hockaday | |
| 8,196,224 B2 * | 6/2012 | Manzella, Jr. ..... | A41D 13/0025 128/201.22 |
| 8,282,234 B2 | 10/2012 | Vanderwoude et al. | |
| 8,819,869 B2 * | 9/2014 | VanDerWoude ... | A41D 13/1153 2/410 |
| 8,955,168 B2 * | 2/2015 | Manzella, Jr. ..... | A41D 13/0025 2/410 |
| 9,173,437 B2 * | 11/2015 | VanDerWoude ......... | A42B 3/30 |
| 9,706,808 B2 * | 7/2017 | Sclafani ............. | A41D 13/1218 |
| 10,037,754 B1 * | 7/2018 | Hollmann .............. | A42B 3/166 |
| 10,384,084 B2 * | 8/2019 | Isham ........................ | F21L 4/00 |
| 10,687,568 B2 * | 6/2020 | Pavalarajan ........ | A41D 13/1153 |
| 10,709,911 B2 * | 7/2020 | Pavalarajan ........... | A42B 3/286 |
| 2001/0032348 A1 | 10/2001 | Diaz et al. | |
| 2001/0046588 A1 * | 11/2001 | Sturtevant ................ | B05D 5/02 428/141 |
| 2003/0024529 A1 * | 2/2003 | Beizndtsson ........ | A62B 17/005 128/201.29 |
| 2005/0010992 A1 * | 1/2005 | Klotz ..................... | A42B 3/285 2/171.3 |
| 2005/0109337 A1 * | 5/2005 | Diaz ..................... | A62B 18/045 128/201.22 |
| 2005/0117327 A1 | 6/2005 | Gupta | |
| 2006/0081262 A1 * | 4/2006 | Vega ........................ | A61F 9/06 128/857 |
| 2006/0133069 A1 | 6/2006 | Clupper et al. | |
| 2006/0213523 A1 | 9/2006 | Vanderwoude et al. | |
| 2007/0000014 A1 * | 1/2007 | Rotella .............. | A41D 19/0089 2/114 |
| 2007/0050898 A1 * | 3/2007 | Larson ............... | A41D 13/1209 2/456 |
| 2007/0089221 A1 * | 4/2007 | Manzella, Jr. ..... | A41D 13/0025 2/456 |
| 2008/0006278 A1 * | 1/2008 | Henke-Sarmento ... | A61B 46/10 128/849 |
| 2008/0155728 A1 * | 7/2008 | Hafer .................. | A41D 13/1209 2/69 |
| 2008/0221705 A1 * | 9/2008 | Scussel ...................... | A61F 2/80 623/32 |
| 2008/0221706 A1 * | 9/2008 | Scussel .................. | A61F 2/7812 623/32 |
| 2009/0151054 A1 | 6/2009 | Vanderwoude et al. | |
| 2010/0294270 A1 | 11/2010 | Curran et al. | |
| 2011/0004979 A1 | 1/2011 | Vanderwoude et al. | |
| 2011/0047668 A1 * | 3/2011 | Manzella, Jr. ..... | A41D 13/0025 2/9 |
| 2011/0201982 A1 * | 8/2011 | Thompson ............ | A61F 13/041 602/3 |
| 2012/0183786 A1 * | 7/2012 | Laroche ................... | B05D 7/56 428/429 |
| 2012/0216341 A1 * | 8/2012 | Manzella, Jr. ..... | A41D 13/0025 2/424 |
| 2013/0327325 A1 * | 12/2013 | VanDerWoude ... | A41D 13/0025 128/201.29 |
| 2014/0273689 A1 * | 9/2014 | Carroll ................ | D06N 3/0059 442/123 |
| 2014/0352037 A1 * | 12/2014 | VanDerWoude ....... | A62B 17/04 2/410 |
| 2015/0090254 A1 * | 4/2015 | Pavalarajan ......... | A62B 18/045 128/201.23 |
| 2016/0165999 A1 * | 6/2016 | Sclafani ............. | A41D 13/1153 2/424 |
| 2018/0084848 A1 * | 3/2018 | Pavalarajan ........... | A42B 3/286 |
| 2018/0125127 A1 * | 5/2018 | Harris ................ | A41D 13/1209 |
| 2018/0140450 A1 * | 5/2018 | Danek .................. | A61F 5/0111 |
| 2018/0220724 A1 | 8/2018 | Bunn | |
| 2019/0111288 A1 * | 4/2019 | Isham .................... | F21V 23/003 |
| 2020/0001123 A1 * | 1/2020 | VanDerWoude ....... | A62B 18/04 |

FOREIGN PATENT DOCUMENTS

| | | |
|---|---|---|
| EP | 2853169 B1 | 9/2016 |
| GB | 2452490 A | 3/2009 |
| WO | WO-2014031671 A1 | 2/2014 |

(56) References Cited

FOREIGN PATENT DOCUMENTS

WO     WO-2014189364 A1     11/2014
WO     WO-2018057920 A1     3/2018

OTHER PUBLICATIONS

"U.S. Appl. No. 15/332,389, Response filed Sep. 28, 2020 to Non Final Office Action dated Jun. 26, 2020", 14 pgs.
"U.S. Appl. No. 14/038,855, Advisory Action dated Apr. 2, 2019", 3 pgs.
"U.S. Appl. No. 14/038,855, Examiner Interview Summary dated Jan. 2, 2020", 3 pgs.
"U.S. Appl. No. 14/038,855, Examiner Interview Summary dated Feb. 13, 2017", 2 pgs.
"U.S. Appl. No. 14/038,855, Examiner Interview Summary dated Apr. 23, 2018", 2 pgs.
"U.S. Appl. No. 14/038,855, Examiner Interview Summary dated Nov. 4, 2016", 3 pgs.
"U.S. Appl. No. 14/038,855, Examiner Interview Summary dated Dec. 13, 2017", 2 pgs.
"U.S. Appl. No. 14/038,855, Final Office Action dated Feb. 13, 2018", 18 pgs.
"U.S. Appl. No. 14/038,855, Final Office Action dated May 8, 2017", 13 pgs.
"U.S. Appl. No. 14/038,855, Final Office Action dated Jul. 20, 2016", 17 pgs.
"U.S. Appl. No. 14/038,855, Final Office Action dated Nov. 4, 2019", 23 pgs.
"U.S. Appl. No. 14/038,855, Final Office Action dated Dec. 5, 2018", 23 pgs.
"U.S. Appl. No. 14/038,855, Non Final Office Action dated Jun. 5, 2019", 23 pgs.
"U.S. Appl. No. 14/038,855, Non Final Office Action dated Jun. 25, 2018", 18 pgs.
"U.S. Appl. No. 14/038,855, Non Final Office Action dated Sep. 15, 2017", 15 pgs.
"U.S. Appl. No. 14/038,855, Non Final Office Action dated Dec. 21, 2016", 13 pgs.
"U.S. Appl. No. 14/038,855, Non Final Office Action dated Dec. 24, 2015", 12 pgs.
"U.S. Appl. No. 14/038,855, Notice of Allowance dated Mar. 3, 2020", 13 pgs.
"U.S. Appl. No. 14/038,855, Response filed Feb. 4, 2020 to Final Office Action dated Nov. 4, 2019", 22 pgs.
"U.S. Appl. No. 14/038,855, Response filed Feb. 5, 2019 to Final Office action dated Dec. 5, 2018", 16 pgs.
"U.S. Appl. No. 14/038,855, Response filed Feb. 8, 2017 to Non Final Office Action dated Dec. 21, 2016", 10 pgs.
"U.S. Appl. No. 14/038,855, Response filed Jun. 13, 2018 to Final Office Action dated Feb. 13, 2018", 14 pgs.
"U.S. Appl. No. 14/038,855, Response filed Jun. 24, 2016 to Non Final Office Action dated Dec. 24, 2015", 18 pgs.
"U.S. Appl. No. 14/038,855, Response filed Aug. 8, 2017 to Final Office Action dated May 8, 2017", 12 pgs.
"U.S. Appl. No. 14/038,855, Response filed Sep. 4, 2019 to Non Final Office Action dated Jun. 5, 2019", 20 pgs.
"U.S. Appl. No. 14/038,855, Response filed Sep. 24, 2018 to Non Final Office Action dated Jun. 25, 2018", 16 pgs.
"U.S. Appl. No. 14/038,855, Response filed Nov. 17, 2016 to Final Office Action dated Jul. 20, 2016", 12 pgs.
"U.S. Appl. No. 14/038,855, Response filed Dec. 15, 2017 to Non Final Office Action dated Sep. 15, 2017", 14 pgs.
"U.S. Appl. No. 15/332,389, Non Final Office Action dated Apr. 8, 2019", 6 pgs.
"U.S. Appl. No. 15/332,389, Response filed Jul. 8, 2019 to Non Final Office action dated Apr. 8, 2019", 10 pgs.
"U.S. Appl. No. 15/332,389, Response filed Nov. 29, 2018 to Restriction Requirement dated Oct. 4, 2018", 7 pgs.
"U.S. Appl. No. 15/332,389, Restriction Requirement dated Oct. 4, 2018", 7 pgs.
"U.S. Appl. No. 15/713,334, Non Final Office Action dated Jun. 28, 2019", 15 pgs.
"U.S. Appl. No. 15/713,334, Notice of Allowance dated Feb. 12, 2020", 13 pgs.
"U.S. Appl. No. 15/713,334, Response filed Sep. 27, 2019 to Non-Final Office Action dated Jun. 28, 2019", 19 pgs.
"European Application Serial No. 14186411.6, Decision to grant dated Aug. 19, 2016", 2 pgs.
"European Application Serial No. 14186411.6, Extended European Search Report dated Feb. 12, 2015", 7 pgs.
"European Application Serial No. 14186411.6, Intention to grant dated Mar. 22, 2016", 1 pg.
"European Application Serial No. 14186411.6, Response filed Oct. 1, 2015 to Extended European Search Report dated Feb. 12, 2015", 13 pgs.
"European Application Serial No. 16187934.1, Communication Pursuant to Article 94(3) EPC dated Aug. 10, 2018", 4 pgs.
"European Application Serial No. 16187934.1, Communication Pursuant to Article 94(3) EPC dated Dec. 8, 2017", 5 pgs.
"European Application Serial No. 16187934.1, Extended European Search Report dated Jan. 2, 2017", 6 pgs.
"European Application Serial No. 16187934.1, Response filed Apr. 20, 2018 to Office Action dated Dec. 8, 2017", 40 pgs.
"European Application Serial No. 16187934.1, Response filed Aug. 8, 2017 to Extended European Search Report dated Jan. 2, 2017", 26pgs.
"European Application Serial No. 16187934.1, Response filed Nov. 22, 2018 to Communication Pursuant to Article 94(3) EPC dated Aug. 10, 2018", 31 pgs.
"European Application Serial No. 17778146.5, Response to Communication pursuant to Rules 161(1) and 162 EPC filed Nov. 19, 2019", 14 pgs.
"International Application Serial No. PCT/US2017/052995, International Preliminary Report on Patentability dated Apr. 4, 2019", 9 pgs.
"International Application Serial No. PCT/US2017/052995, International Search Report dated Nov. 29, 2017", 7 pgs.
"International Application Serial No. PCT/US2017/052995, Written Opinion dated Nov. 29, 2017", 9 pgs.
"Turkey Application Serial No. 14186411.6, Office Action dated Jun. 24, 2019", 3 pgs.

* cited by examiner

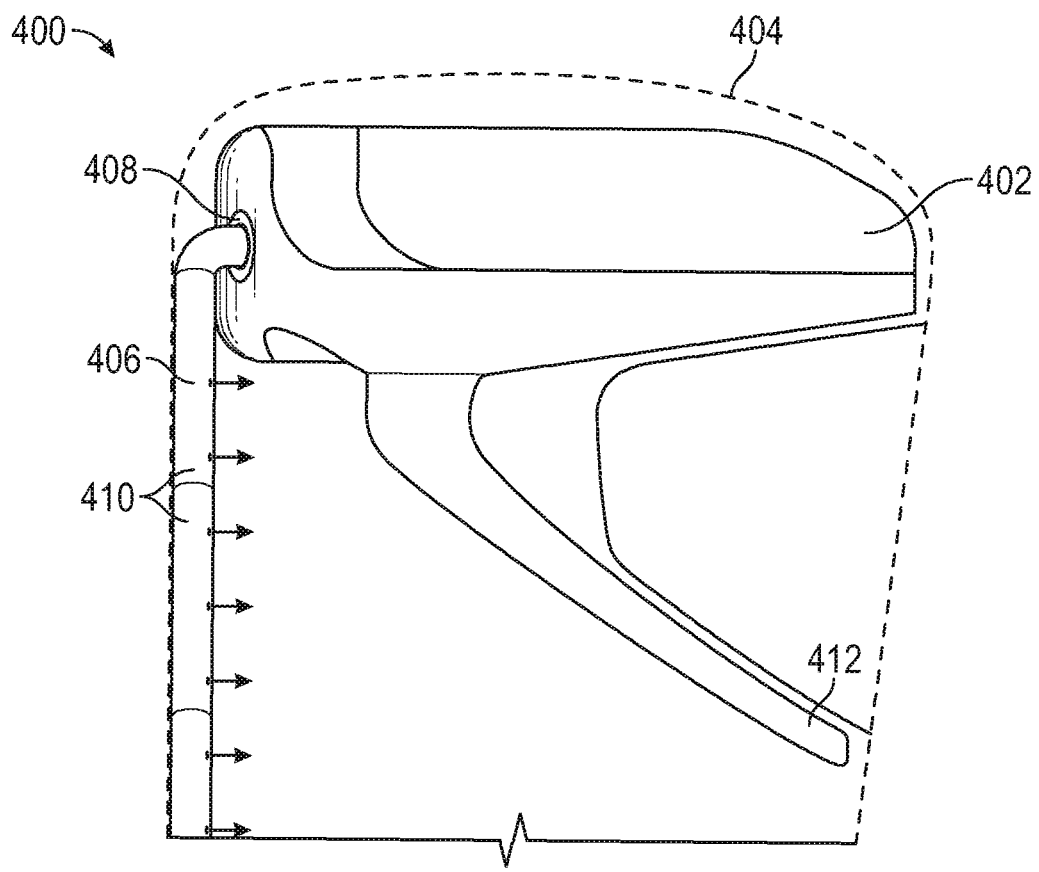
FIG. 4A
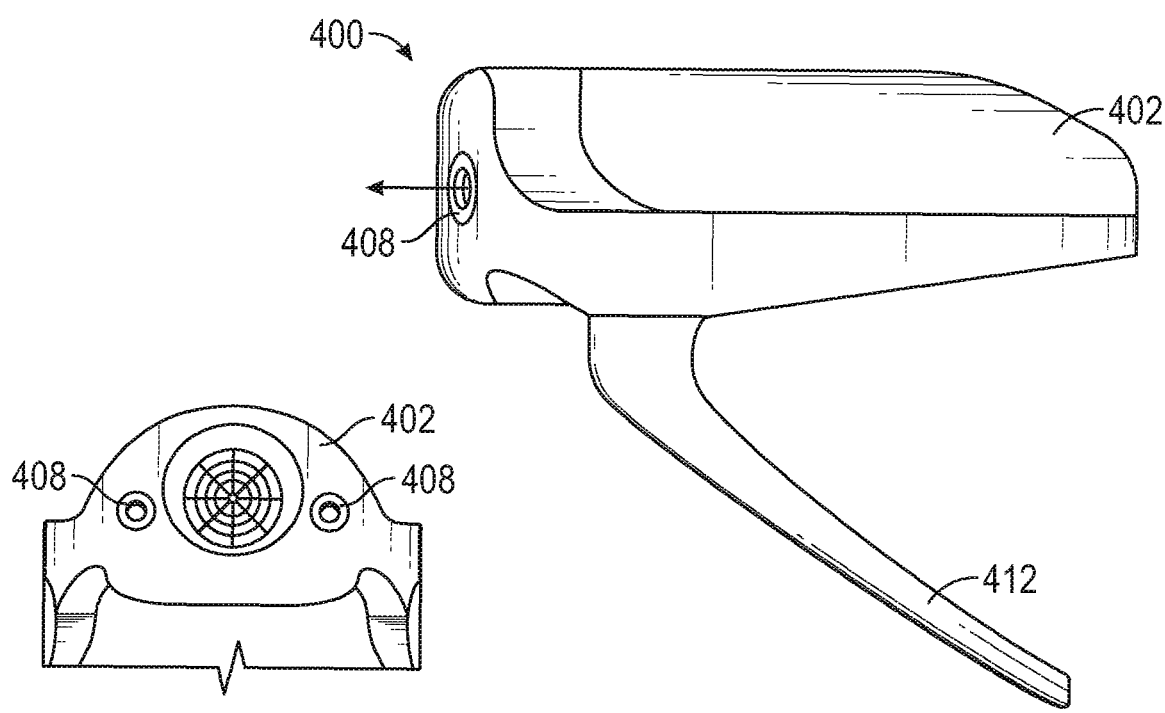
FIG. 4C
FIG. 4B

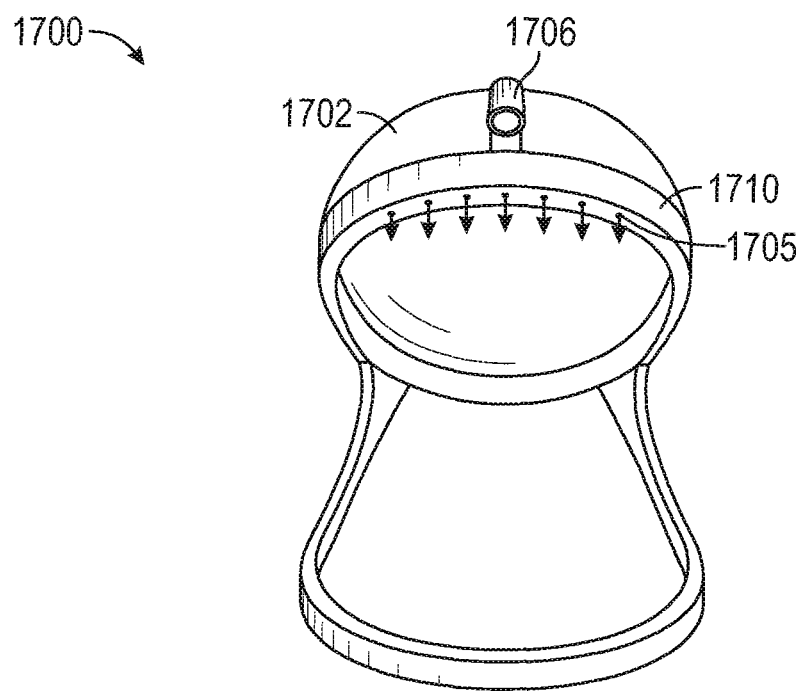
FIG. 21A
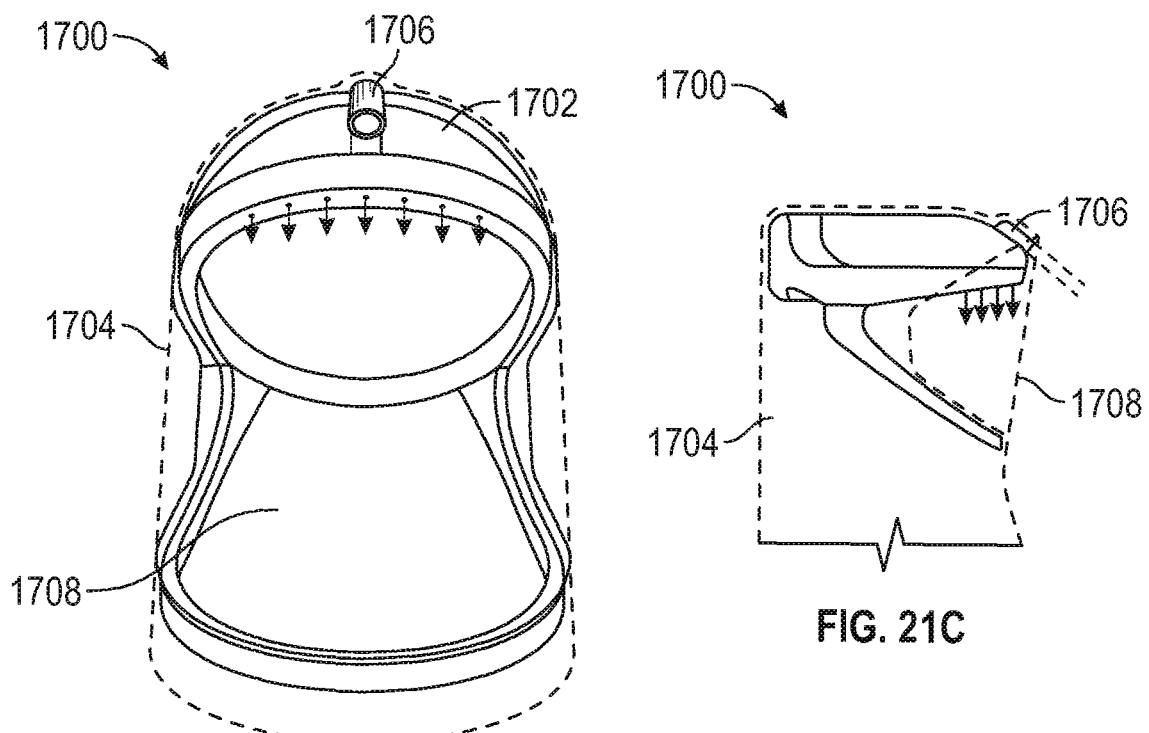
FIG. 21B
FIG. 21C

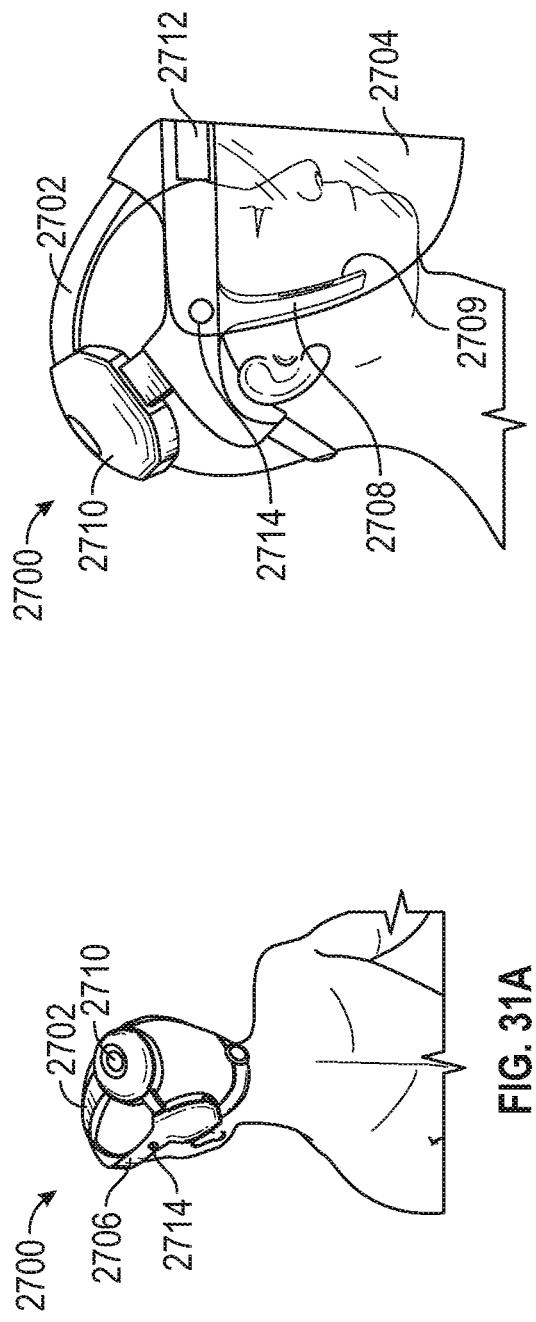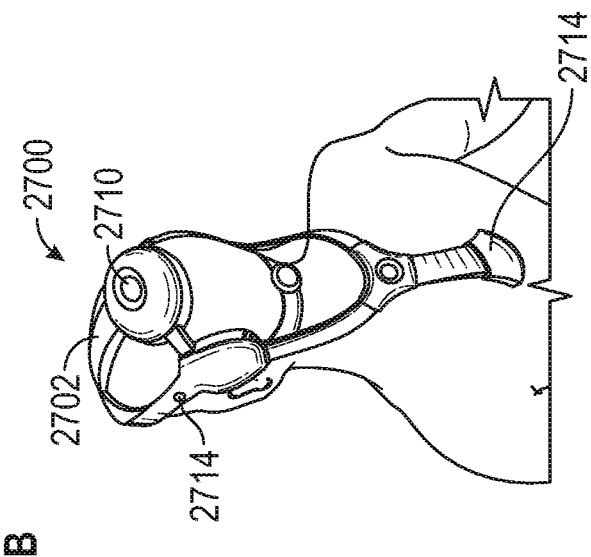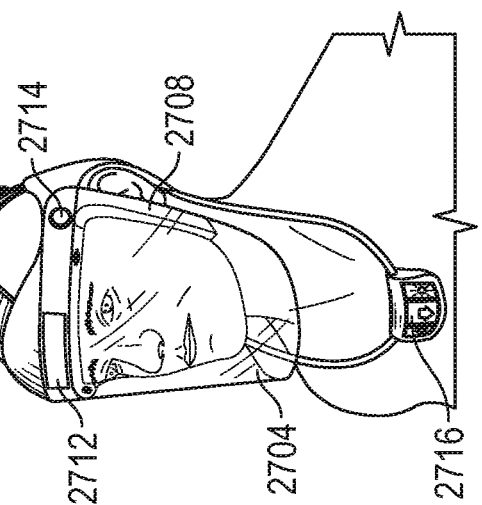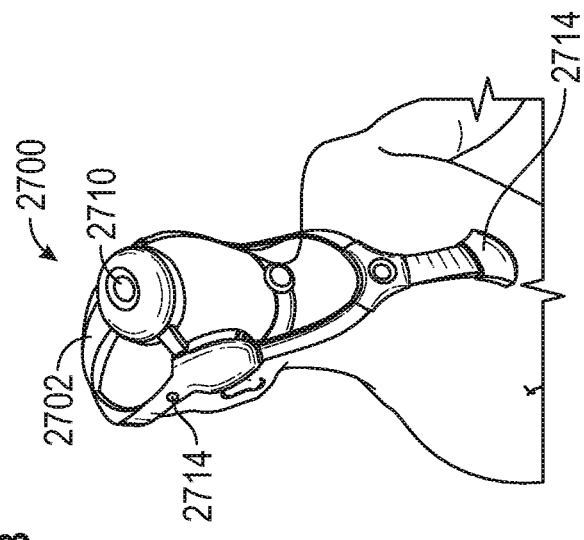

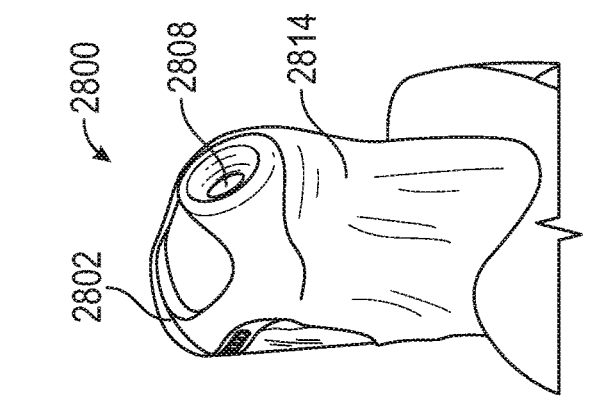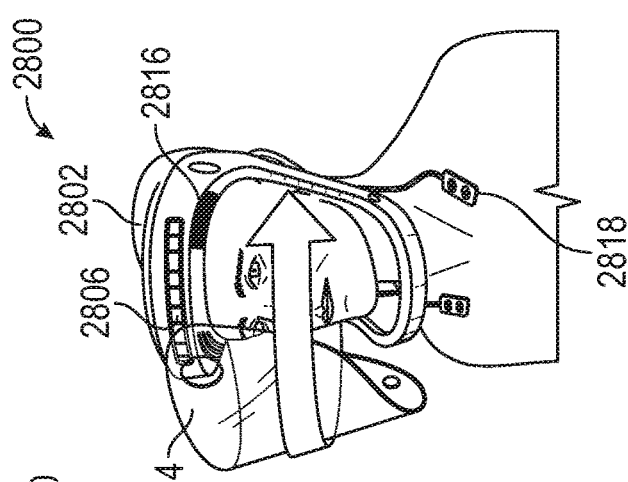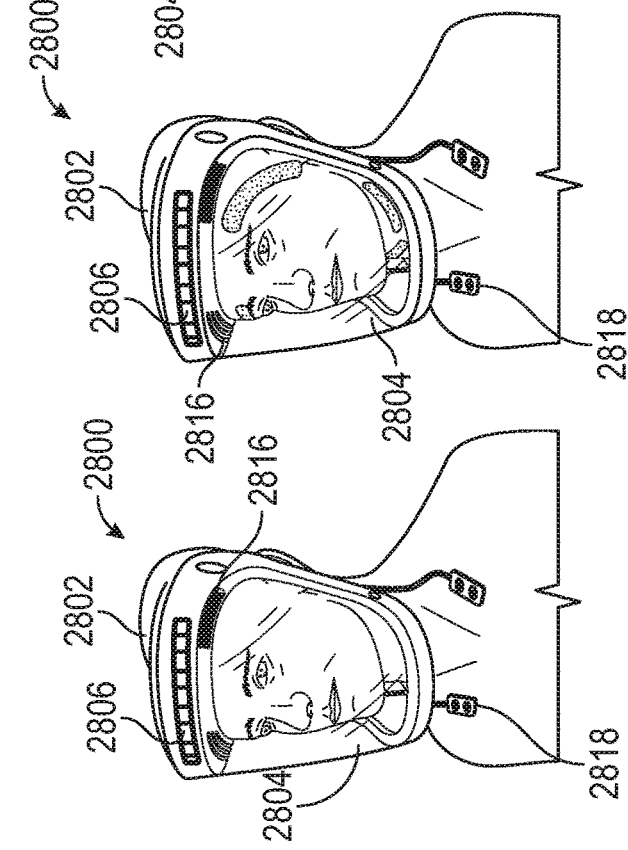

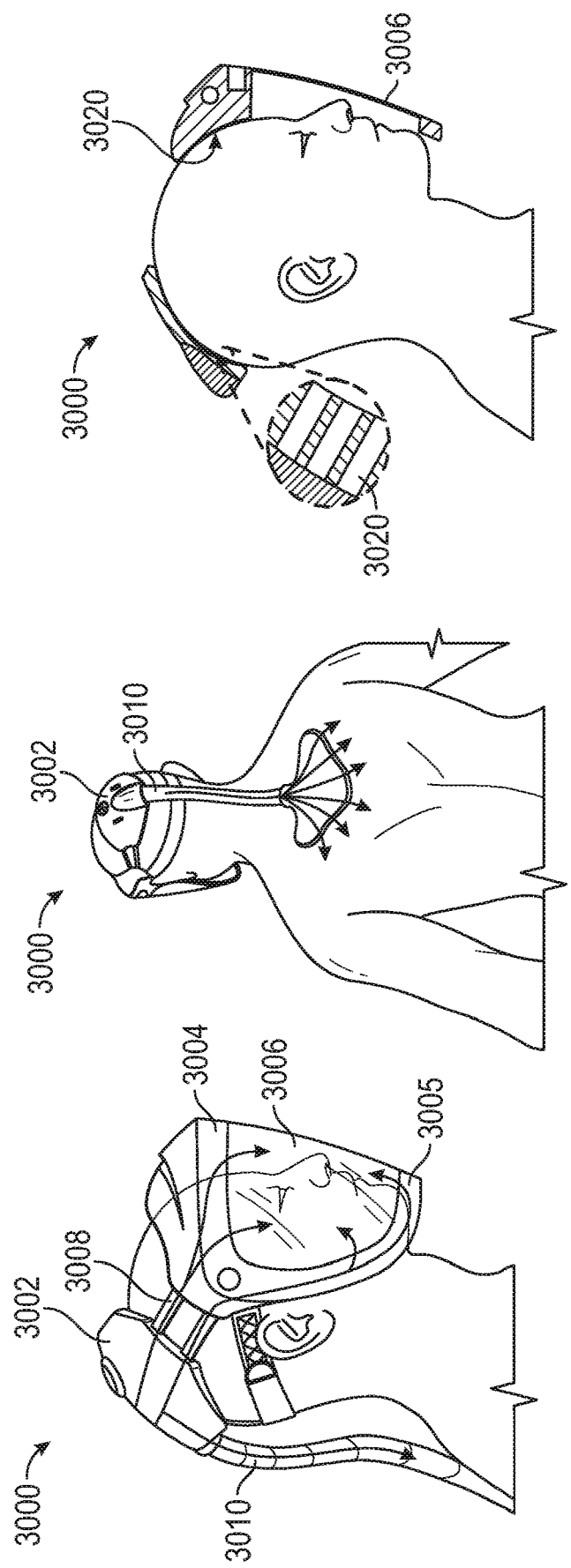

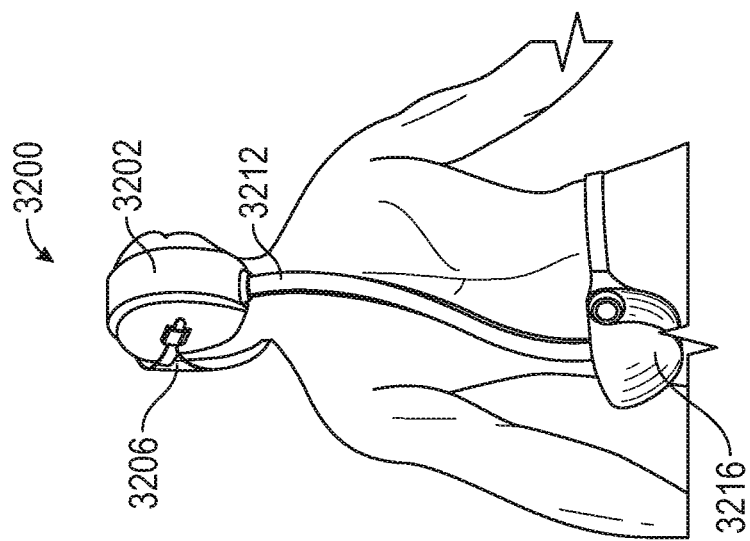
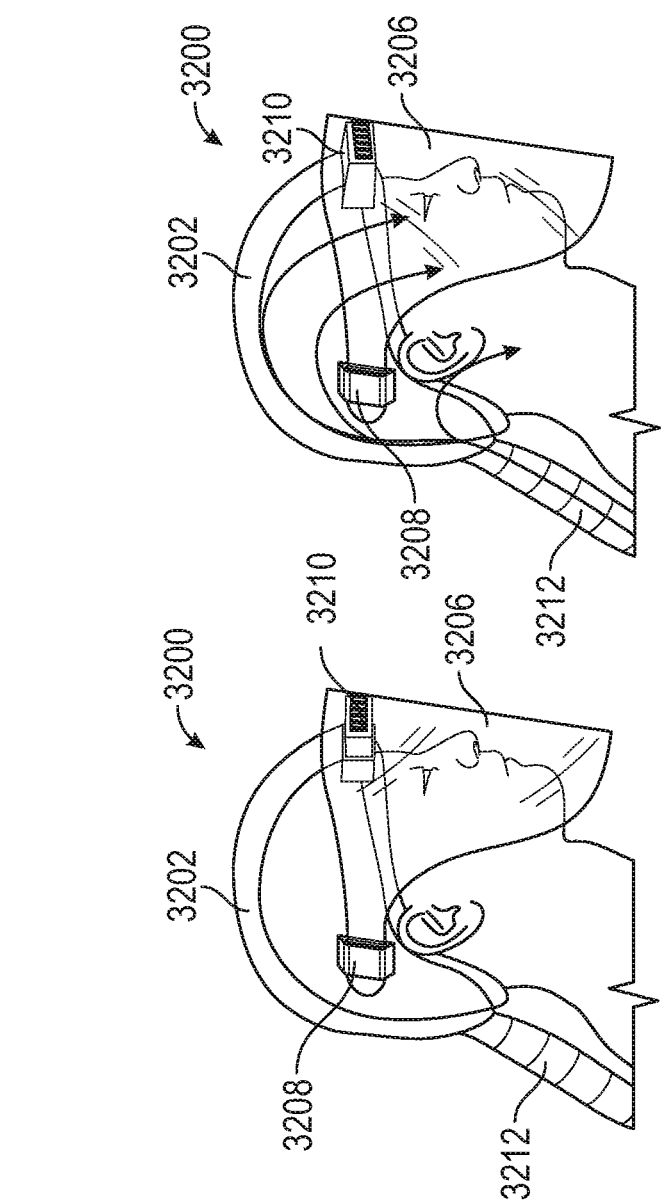
FIG. 43A
FIG. 43B
FIG. 43C

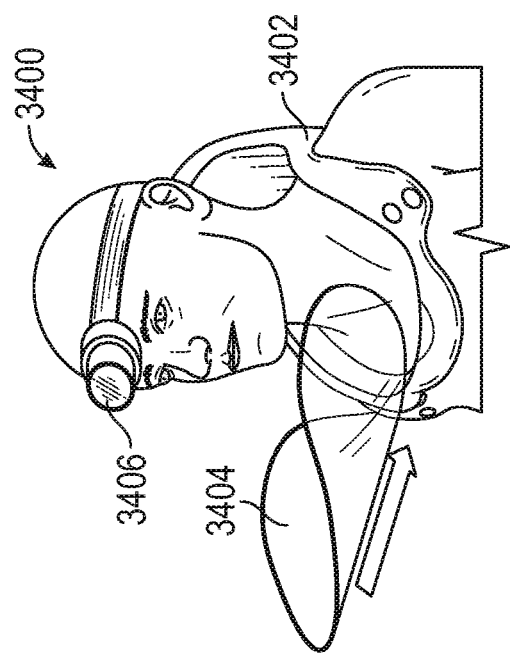
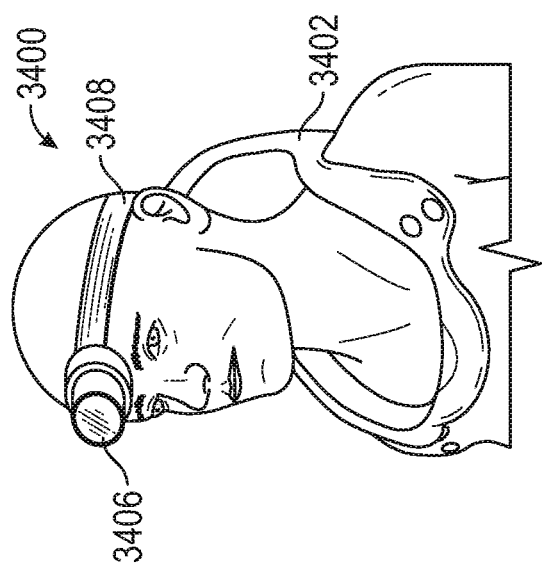
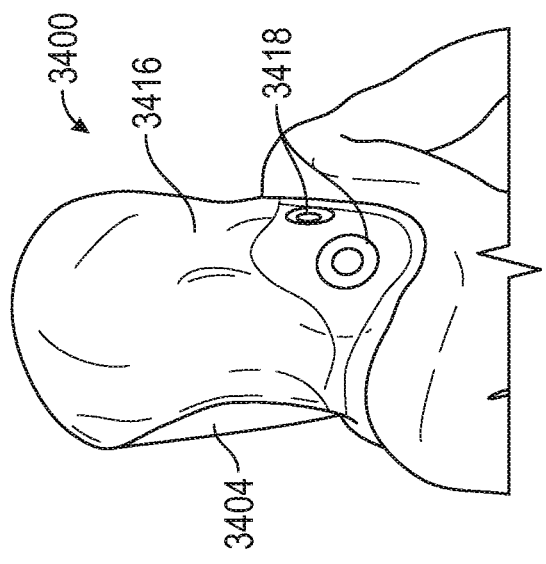
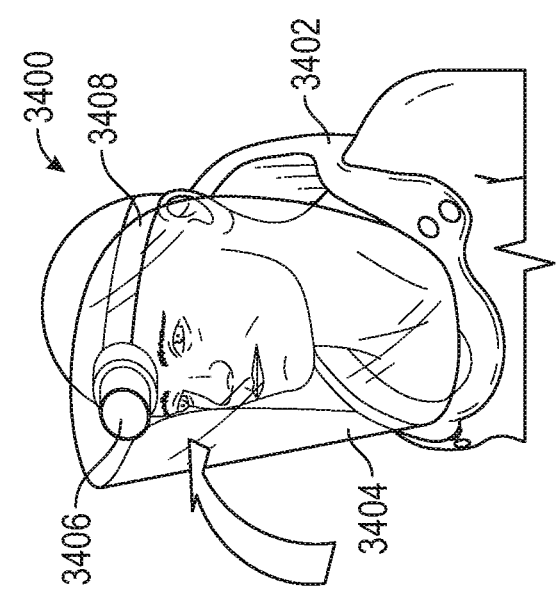

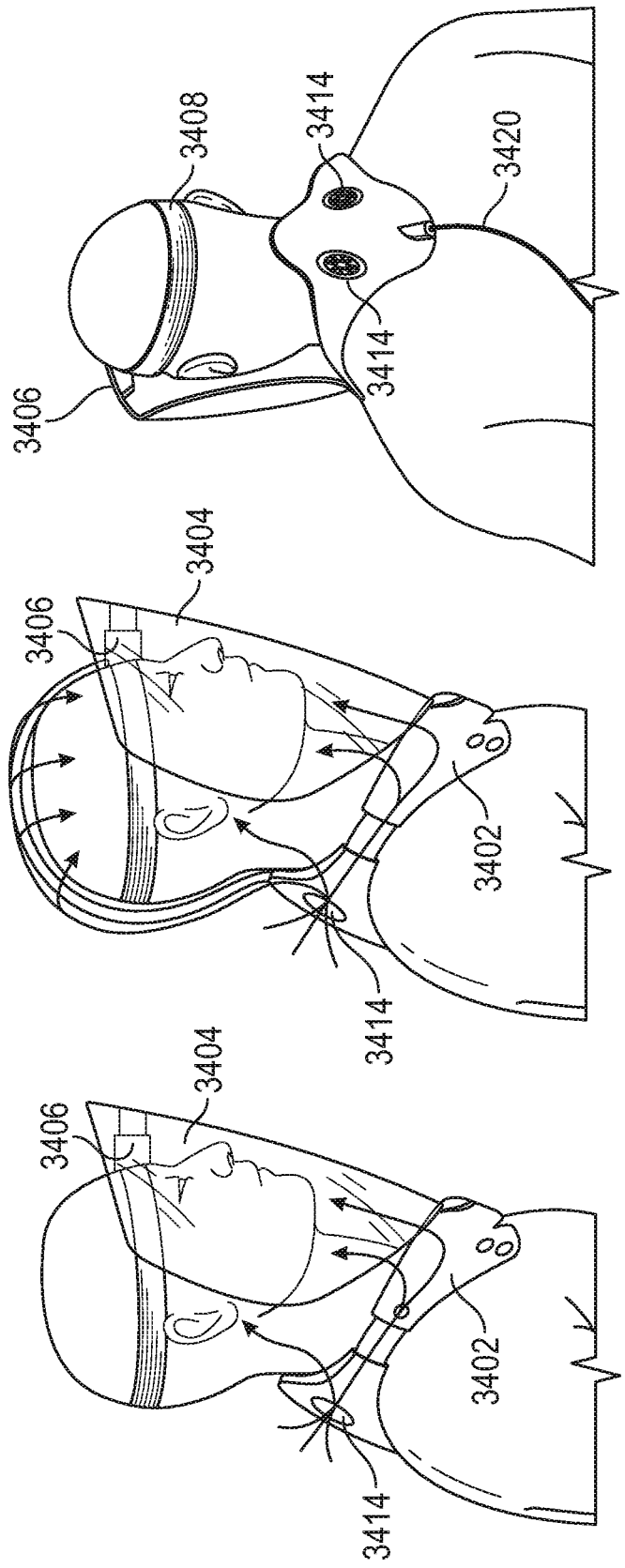

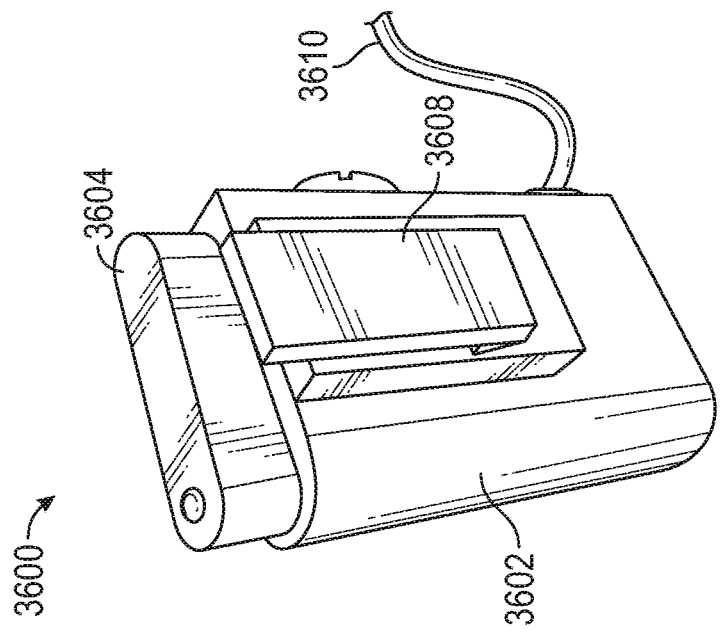
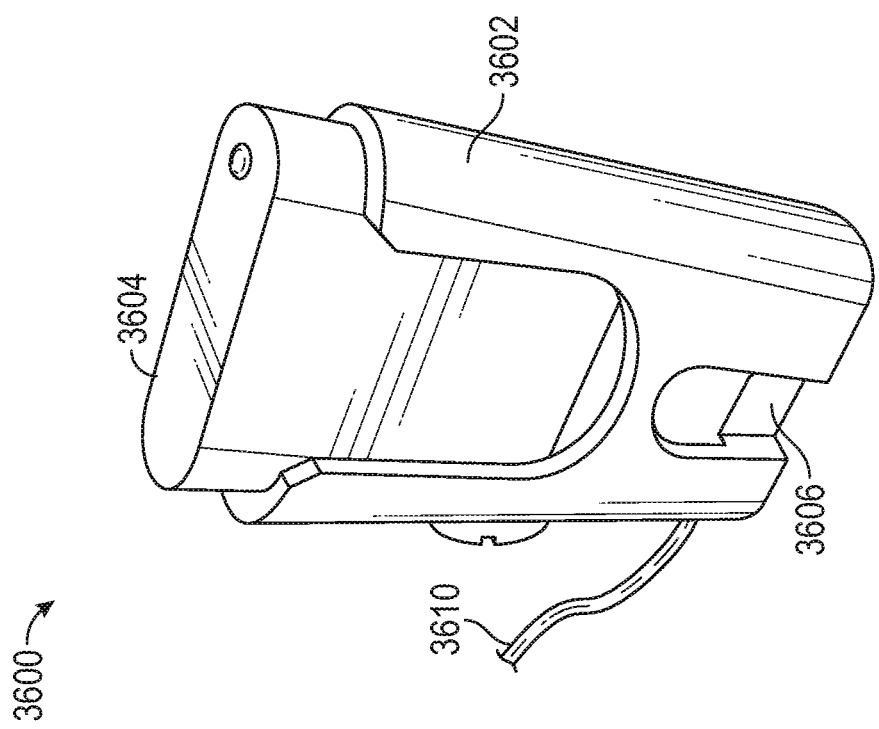
FIG. 52A
FIG. 52B

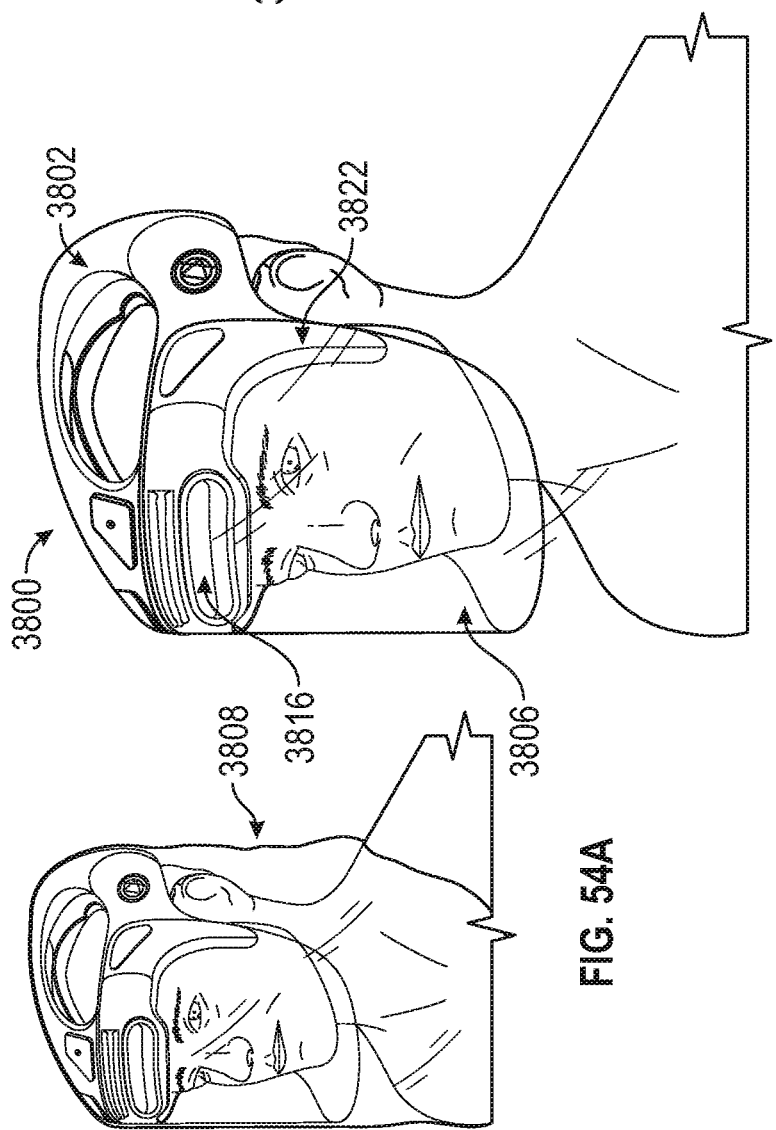
FIG. 54A
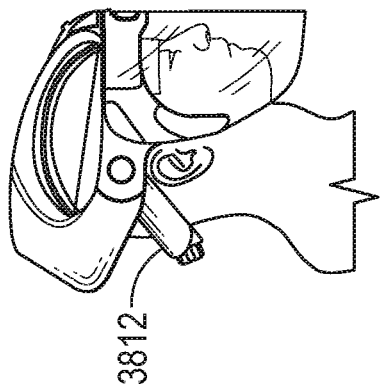
FIG. 54C
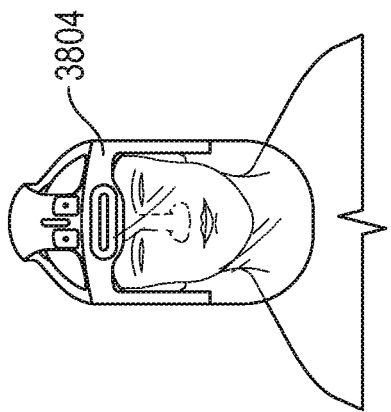
FIG. 54D
FIG. 54B

SURGICAL HELMET

RELATED APPLICATIONS

This application is a continuation of U.S. patent application Ser. No. 15/713,334, filed Sep. 22, 2017, which claims the benefit of priority to U.S. Provisional Application Ser. No. 62/399,051, filed Sep. 23, 2016, U.S. Provisional Application Ser. No. 62/399,067, filed Sep. 23, 2016, U.S. Provisional Application Ser. No. 62/399,071, filed Sep. 23, 2016, and to U.S. Provisional Application Ser. No. 62/410,131, filed Oct. 19, 2016 the content of each of which are incorporated hereby by reference in their entireties.

FIELD

The present disclosure relates to surgical helmet assemblies and associated methods.

BACKGROUND

This section provides background information related to the present disclosure, which is not necessarily prior art.

Surgical helmet assemblies can be used during surgical procedures to minimize contamination of surgical wounds and to protect staff from exposure to bodily fluids and pathogens. Surgical helmet assemblies typically encase at least the head and shoulders of a user, rendering ventilation controls important in order to ensure sufficient air supply, $CO_2$ discharge, temperature management, and humidity management. Surgical helmet assemblies can also incorporate light sources to enable enhanced visibility for the user. Such light sources can further raise the temperature within the surgical helmet assembly and cause discomfort to a user. Accordingly, it is desirable to provide surgical helmet assemblies with, for example, improved ventilation and visibility without compromising functionality.

SUMMARY

This section provides a general summary of the disclosure, and is not a comprehensive disclosure of its full scope or all of its features.

The present inventors have recognized, among other things, that a problem to be solved can include providing surgical helmet assemblies having improved ventilation and visibility without compromising functionality. The present subject matter can help provide a solution to this problem, such as by providing surgical helmet assemblies comprising a helmet enclosure shaped to encircle a head of a user, a fan that can be retained in the helmet enclosure, a transparent face shield, a headband coupled to the helmet enclosure, and a surgical garment coupleable to the helmet enclosure. The helmet enclosure can include a brow bar portion at a front of the helmet enclosure that can be shaped to extend along a brow or a forehead of the user and a stabilizer that can extend downward from the helmet enclosure in front of ears of the user. The brow bar portion can include a light. The face shield can be coupleable to at least the brow bar portion. The headband can be shaped to extend across an occiput region of the user's head. The surgical garment can cover at least the head and shoulders of a user in use. The brow bar portion can have vents disposed therein to direct airflow pushed through the helmet enclosure from the fan onto the user. The face shield can be coupleable to the helmet enclosure by one or more of a hook and loop fastener on the helmet enclosure or the stabilizer and a post protruding from the brow bar portion.

The present subject matter can also include surgical helmet assemblies comprising a helmet enclosure shaped to encircle a head of a user, a fan that can be retained in the helmet enclosure, a transparent face shield, a headband coupled to the helmet enclosure, and a surgical garment coupleable to the helmet enclosure. The helmet enclosure can define at least one conduit that can be in fluidic communication with the fan and vents disposed in the brow bar portion. The helmet enclosure can include a brow bar portion at a front of the helmet enclosure that can be shaped to extend along a brow or a forehead of the user and a stabilizer that can extend downward from the helmet enclosure in front of ears of the user. The brow bar portion can include a light. The face shield can be coupleable to at least the brow bar portion. The headband can be shaped to extend across an occiput region of the user's head. The surgical garment can cover at least the head and shoulders of a user in use. The brow bar portion can have vents disposed therein that can direct airflow pushed through the at least one conduit disposed in the helmet enclosure from the fan onto the user. The face shield can be coupleable to the helmet enclosure by one or more of a hook and loop fastener on the helmet enclosure or the stabilizer and a post protruding from the brow bar portion.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4A illustrates a side view of a surgical helmet assembly according to an exemplary embodiment of the present disclosure. FIG. 4B is a side view of the surgical helmet assembly of FIG. 4A without a surgical garment. FIG. 4C is a back view of the surgical helmet assembly of FIG. 4A without a surgical garment.

FIG. 21A illustrates a front view of a surgical helmet assembly according to another exemplary embodiment of the present disclosure. FIG. 21B is a front view of the surgical helmet assembly of FIG. 21A including a surgical garment. FIG. 21C is a side view of the surgical helmet assembly of FIG. 21A.

FIG. 31A is a rear perspective view of a surgical helmet assembly according to another exemplary embodiment of the present disclosure. FIG. 31B is a side view of the surgical helmet assembly of FIG. 31A having a face shield coupled thereto. FIG. 31C is a perspective front view of the surgical helmet assembly of FIG. 31A showing one exemplary implementation of controls for the surgical helmet assembly. FIG. 31D is a perspective front view of the surgical helmet assembly of FIG. 31A showing another exemplary implementation of controls for the surgical helmet assembly. FIG. 31E is a perspective front view of the surgical helmet assembly of FIG. 31A showing another exemplary implementation of controls for the surgical helmet assembly.

FIG. 33A is perspective view of the surgical helmet assembly of FIG. 32. FIG. 33B illustrates the airflow of the surgical helmet assembly of FIG. 32. FIG. 33C illustrates the shield attachment of the surgical helmet assembly of FIG. 32. FIG. 33D illustrates the surgical garment placement of the surgical helmet assembly of FIG. 32.

FIG. 37A is side view of the surgical helmet assembly of FIG. 35. FIG. 37B illustrates a back perspective view of the surgical helmet assembly of FIG. 35. FIG. 37C is a cross-sectional side view of the surgical helmet assembly of FIG. 35.

FIG. 43A is side view of the surgical helmet assembly of FIG. 41. FIG. 43B illustrates the airflow of the surgical helmet assembly of FIG. 41. FIG. 43C illustrates a rear perspective view of the surgical helmet assembly of FIG. 41.

FIGS. 47A-47D illustrate exemplary steps in the donning process of the surgical helmet assembly of FIG. 46.

FIG. 48 is a side view of the surgical helmet of FIG. 46 showing a first exemplary airflow pattern.

FIG. 49 is a side view of the surgical helmet of FIG. 46 showing a second exemplary airflow pattern.

FIG. 50 is a rear perspective view of the surgical helmet assembly according to FIG. 46.

FIG. 52A is a front perspective view of a battery holster according to one exemplary embodiment of the present disclosure. FIG. 52B is a rear perspective view of the battery holster of FIG. 52A.

FIG. 54A illustrates a perspective view of a surgical helmet assembly according to another exemplary embodiment of the present disclosure. FIG. 54B illustrates a perspective view of the surgical helmet assembly of FIG. 54A without a surgical garment. FIG. 54C illustrates a side view of the surgical helmet assembly of FIG. 54A and FIG. 54D illustrates a front view of the surgical helmet assembly of FIG. 54A.

DETAILED DESCRIPTION

Example embodiments will now be described more fully with reference to the accompanying drawings.

The present teachings provide for surgical helmet assemblies that improve ventilation and user comfort. The present teachings provide for surgical helmet assemblies that improve ventilation and user comfort. The present disclosure incorporates commonly-owned and assigned U.S. patent Ser. No. 14/038,855, filed on Sep. 27, 2013, and U.S. patent Ser. No. 15/332,389, filed on Oct. 24, 2016, by reference in their respective entireties except that examples and features discussed herein may supplement or substitute features disclosed therein. In one example, the present inventors have recognized that providing surgical helmet assemblies comprising a helmet enclosure shaped to encircle a head of a user, a fan that can be retained in the helmet enclosure, a transparent face shield, a headband coupled to the helmet enclosure, and a surgical garment coupleable to the helmet enclosure can provide, for example and without limitation, improved ventilation and visibility without compromising functionality. In such surgical helmet assemblies, the helmet enclosure can include a lighted brow bar portion at a front of the helmet enclosure that can be shaped to extend along a brow or a forehead of the user and a stabilizer that can extend downward from the helmet enclosure in front of ears of the user. The brow bar portion can have vents disposed therein to direct airflow pushed through the helmet enclosure from the fan onto the user. The headband can be shaped to extend across an occiput region of the user's head and the surgical garment can cover at least the head and shoulders of a user in use. The face shield can be coupleable to at least the brow bar portion and, additionally or alternatively, can be coupleable to the helmet enclosure by one or more of a hook and loop fastener on the helmet enclosure or the stabilizer and a post protruding from the brow bar portion. Many other examples of surgical helmet assemblies and features of surgical helmet assemblies are provided below that can provide, for example and without limitation, improved ventilation and visibility without compromising functionality. The following examples may focus on certain aspects of surgical helmet assemblies for clarity of description purposes; however, such examples can be combined and indeed are expected to be.

Figure 1A:
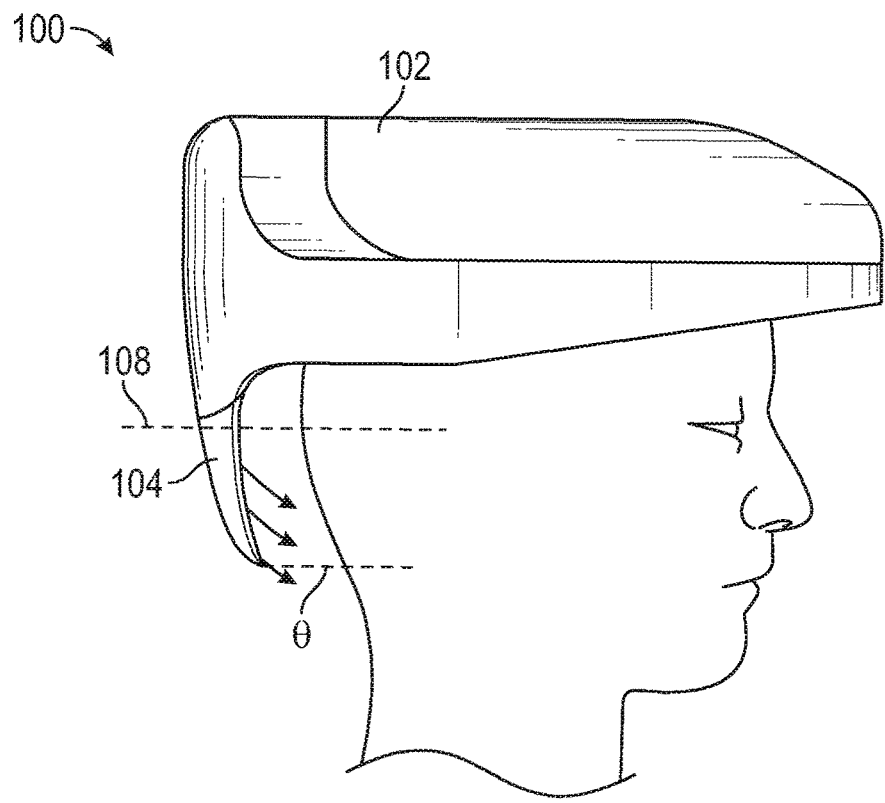
FIG. 1A illustrates a side view of a surgical helmet assembly according to an exemplary embodiment of the present disclosure.
Figure 1B:
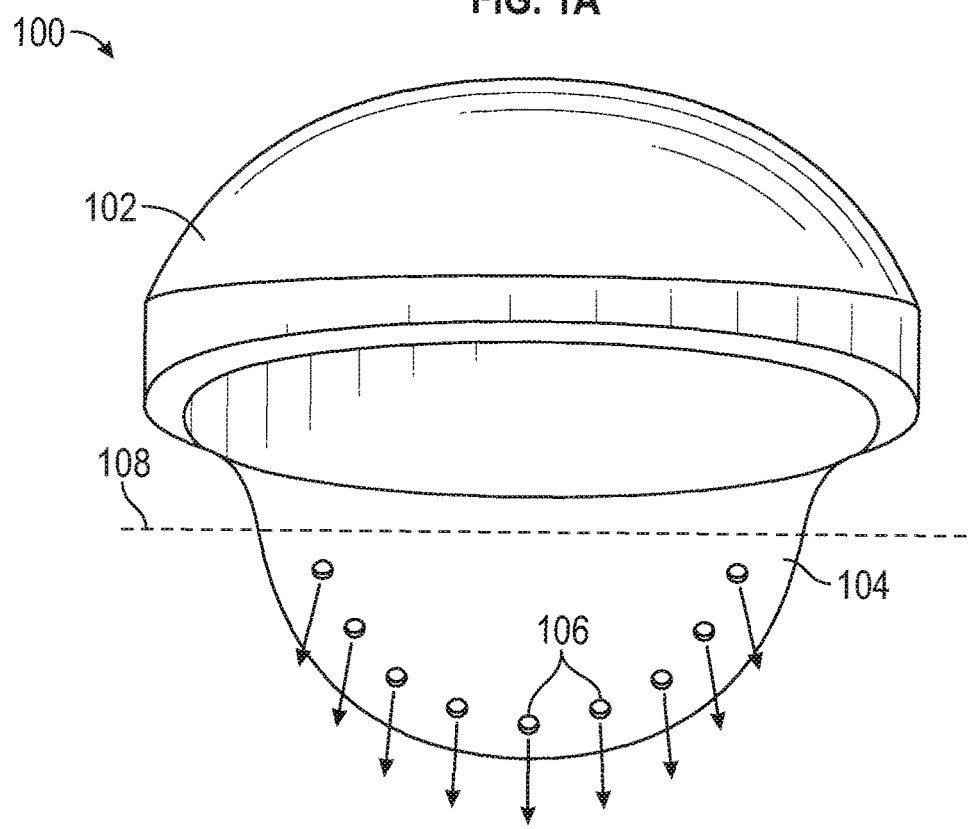
FIG. 1B is a front view of the surgical helmet assembly of FIG. 1A.

FIGS. 1A-1B illustrate one example of a surgical helmet assembly 100 comprising a fan enclosure 102 positionable on the head of a user so as to surround areas of the user's head adjacent to the lower part of the occiput. The fan enclosure 102 can include a downwardly extending portion 104 positioned behind and at a lower portion of the user's head. The downwardly extending portion 104 can include a plurality of ventilation openings 106 disposed therein below an occiput level 108 of the user's head to provide airflow to the wearer's neck. The ventilation openings 106 can be holes in the shell of the helmet and such holes can be provided in any variety of sizes, shapes, configurations, and the like. Holes of the ventilation openings can be angled such that air exiting from the ventilation openings 106 is directed directly toward the user's neck. Each ventilation opening can be angled (θ) with respect to the horizontal and the angle θ can vary from one ventilation opening to another. Each of the plurality of ventilation openings 106 can be below the occiput level 108 of the user's head to allow for more direct cooling of the user's neck. The ventilation openings can also be baffled, and may or may not include ducts or nozzles protruding from the downwardly extending portion 104 of the helmet. A face shield can be coupled to at least a front portion of the fan enclosure 102 as will be described subsequently.

Figure 2A:
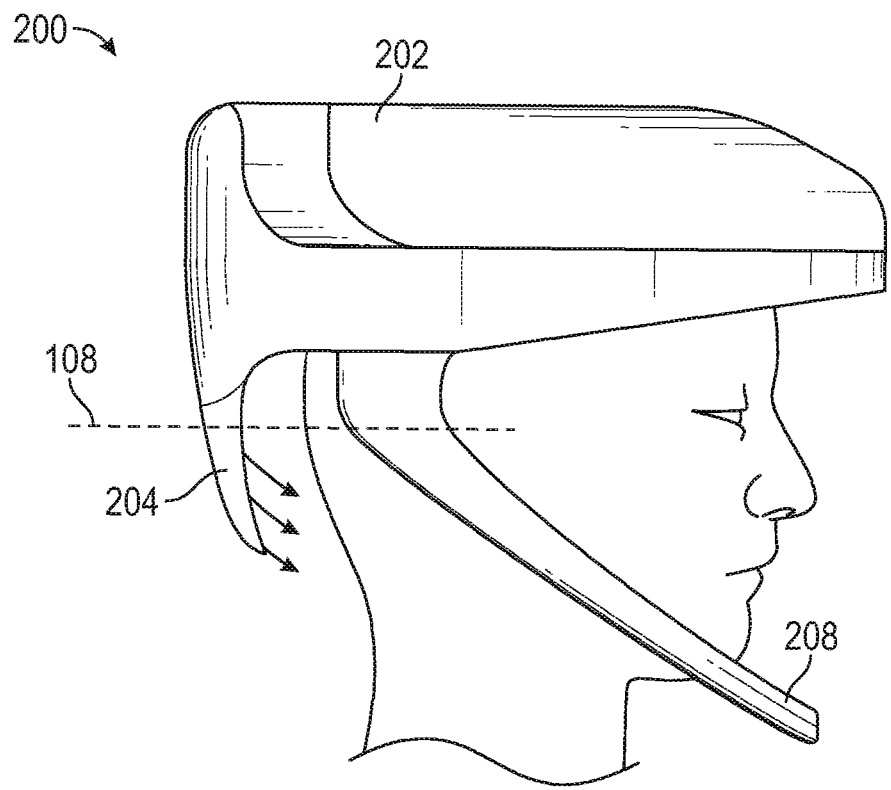
FIG. 2A illustrates a side view of a surgical helmet assembly according to an exemplary embodiment of the present disclosure.
Figure 2B:
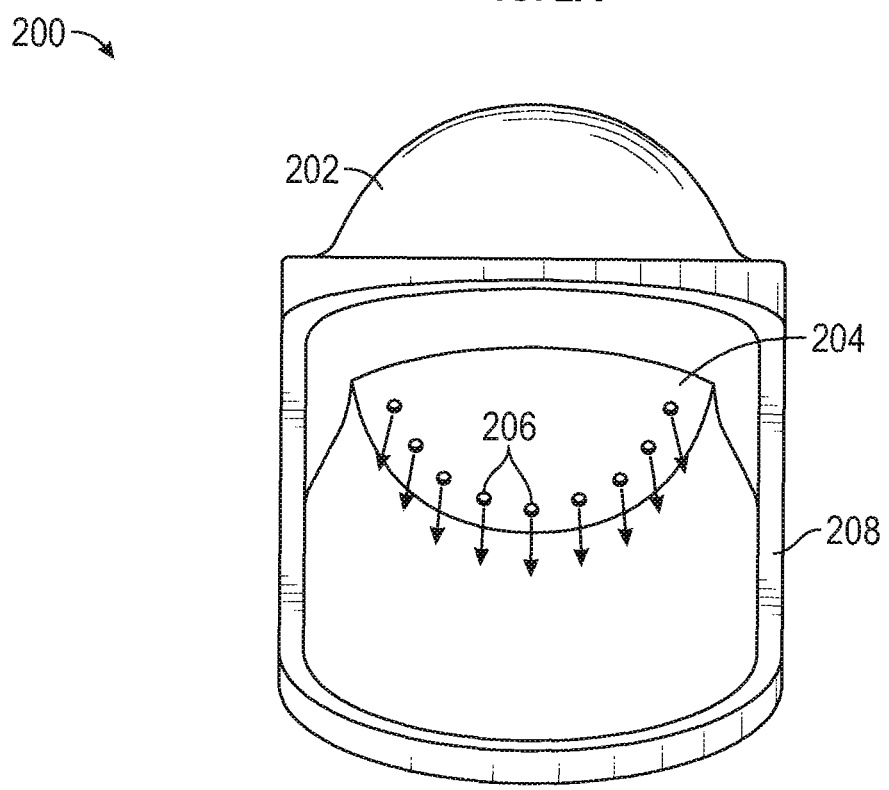
FIG. 2B is a front view of the surgical helmet assembly of FIG. 2A.

FIGS. 2A-2B illustrate another example of a surgical helmet assembly 200 similar to that of FIGS. 1A-1B but including a chin bar 208. The chin bar 208 can extend from a portion of the fan enclosure 202, either above or behind a user's ears. The chin bar 208 and a portion of the fan enclosure 202 can cooperate to define a viewable area for the user and, additionally or alternatively, can provide a surface to which a face shield can be coupled, as will be described subsequently.

Figure 3A:
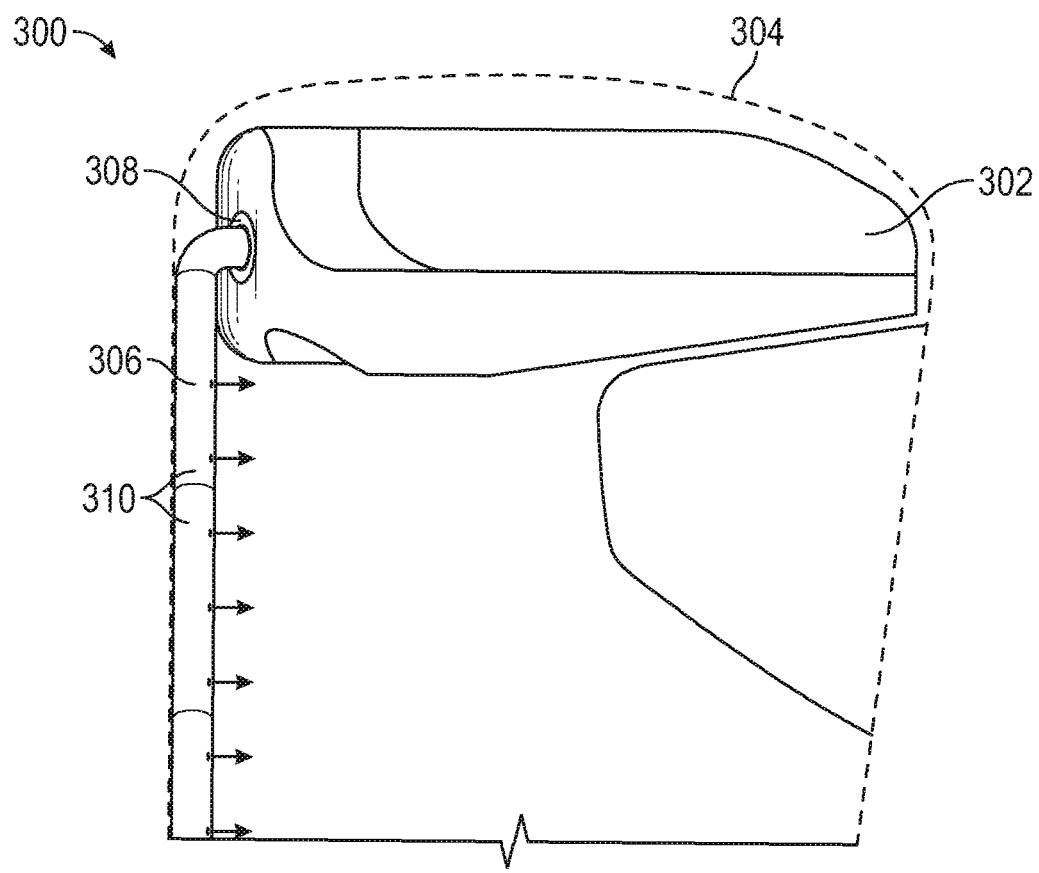
FIG. 3A illustrates a side view of a surgical helmet assembly according to an exemplary embodiment of the present disclosure.
Figure 3B:
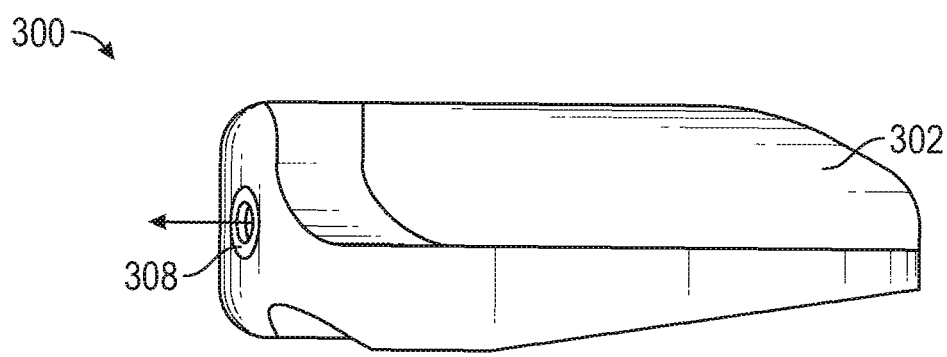
FIG. 3B is a side view of the surgical helmet assembly of FIG. 3A without a surgical garment.
Figure 3C:
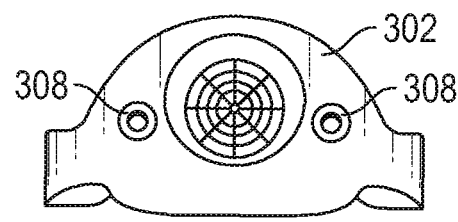
FIG. 3C is a back view of the surgical helmet assembly of FIG. 3A without a surgical garment.

FIGS. 3A-3C illustrates another example of a surgical helmet assembly 300 comprising a fan enclosure 302 positionable on the head of a user and a disposable garment 304. One or more channels or tubes 306 can extend from one or more ports 308 for distributing airflow to the user's neck via one or more ventilation openings 310 disposed in the one or more channels 306 within the disposable garment 304. The channels 306 can be removably coupleable to ports 308 disposed in the fan enclosure 302 via a fastener such as, for example and without limitation, a hook and loop fastener, a snap connection, a magnetic connection, a friction fit, or any other suitable connection. Channels 306 can be linear or can be curved to follow the contours of the user's neck. Channels 306 can extend to a level of the user's shoulders, to a level of the user's ears, or another length. Channels 306 can be integrated into the disposable garment 304 or be separate from the disposable garment 304. Channels 306 can also serve to keep the disposable garment 304 from contacting the user's neck. FIGS. 3C and 4C show an embodiment where the fan is located at the rear of the helmet or fan enclosure 302.

FIGS. 4A-4B illustrate another example of a surgical helmet assembly 400 similar to that of FIGS. 3A-3B but including a chin bar 412. The chin bar 412 can extend from a portion of the fan enclosure 402 above or behind a user's ears and positionable about a chin of the user. The chin bar 412 and a portion of the fan enclosure 402 can cooperate to define a viewable area for the user and, additionally or alternatively, can provide a surface to which a face shield can be coupled, as will be described subsequently.

Figure 5:
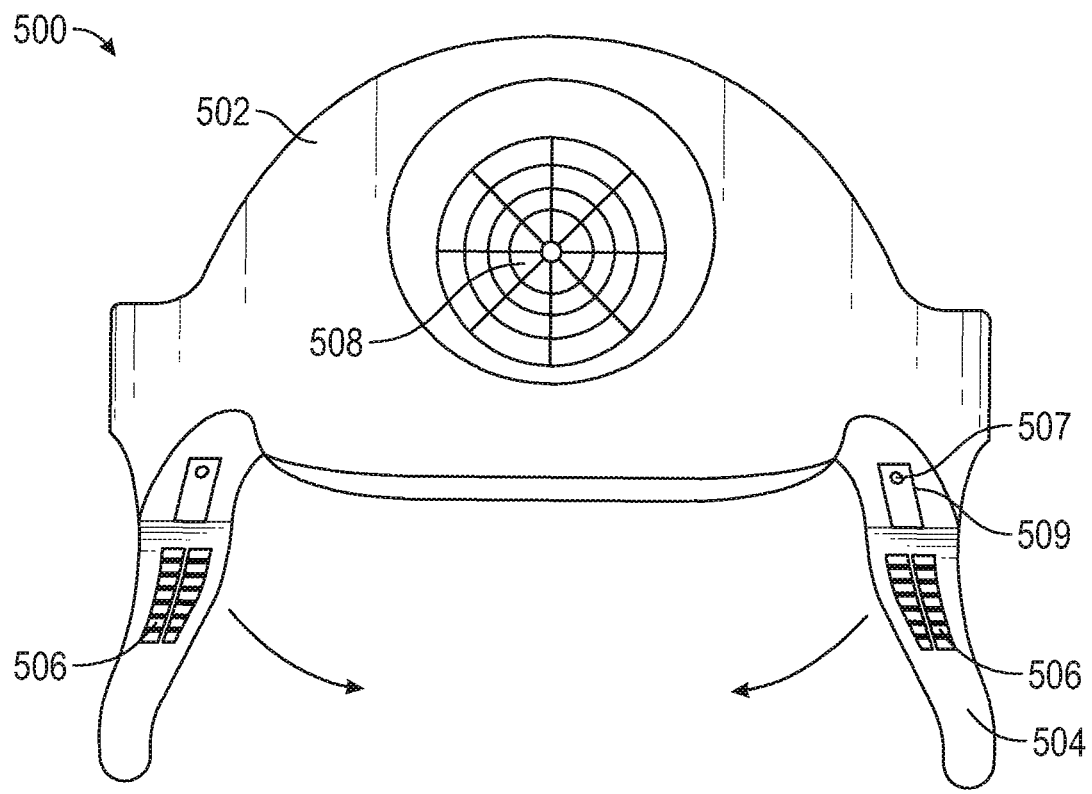
FIG. 5 illustrates a partial back view of a surgical helmet assembly according to another exemplary embodiment of the present disclosure.

FIG. 5 illustrates another example of a surgical helmet assembly 500 comprising a fan enclosure 502 positionable on the head of a user so as to surround areas of the user's head and a protrusion 504 extending from the fan enclosure 502 down toward cheeks of the user. The protrusion 504 can include one or more ventilation openings 506 disposed on the back or interior of the protrusion 504. The ventilation openings 506 are in fluid communication with the fan 508. The fan 508 can direct air from the fan enclosure 502, through each protrusion 504, and out through the ventilation openings 506 towards a user's head or neck. The ventilation openings 506 can be angled to direct air directly on the user's neck or directly on a back of the user's head near or below the user's occiput. Ventilation openings 506 can have baffles or nozzles to block or direct the flow of air therethrough. Alternatively or additionally, airflow through the ventilation openings can be controlled with a lever 507 that slides within a track 509. Sliding lever 507 to one side of the track 509 can fully close off the ventilation opening 506, and sliding lever 507 to the other side of the track 509 can fully open the ventilation opening. Intermediate positions of the lever 507 within track 509 can partially open or partially close the ventilation openings 506. Such an open/close mechanism allows the user to control the amount of airflow through ventilation openings 506. Protrusions 504 can terminate around the cheeks or mandible of the user or at a horizontal level of the user's ear lobes, or can extend across the user's face in the form of a chin bar such that both protrusions 504 are connected to each other. Protrusions 504 can provide a surface to which a face shield can be coupled, as will be described subsequently.

Figure 6:
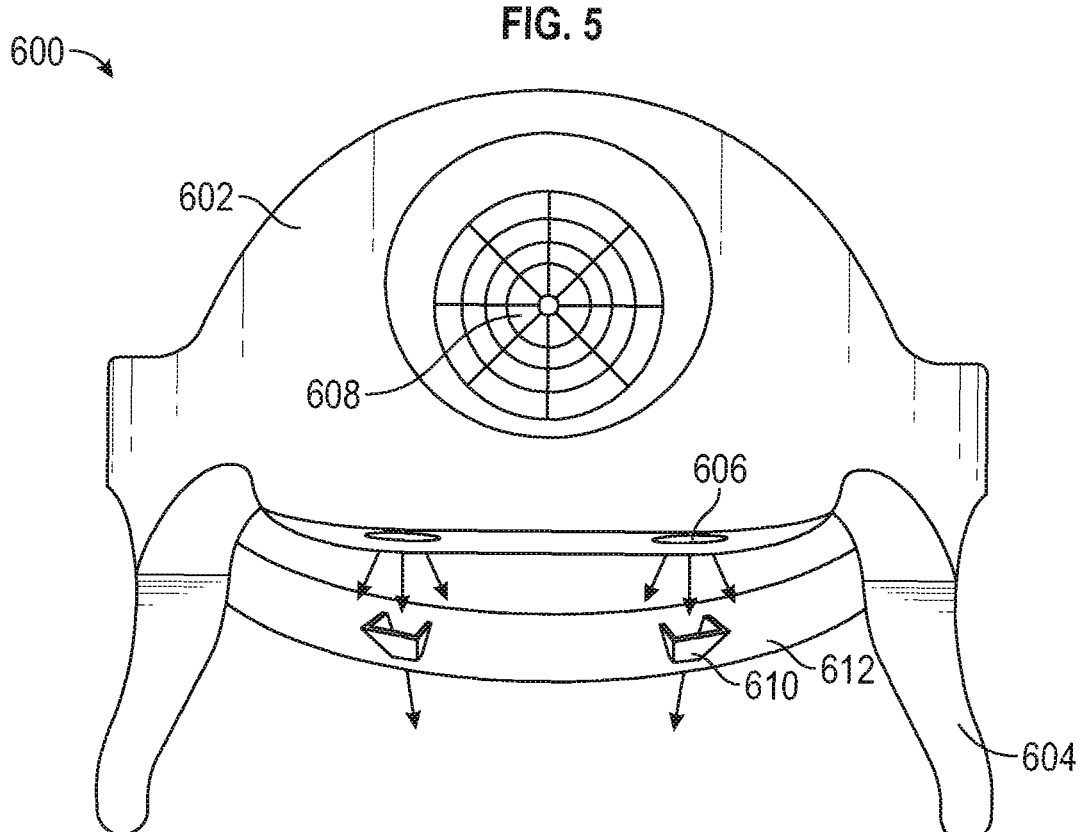
FIG. 6 illustrates a partial back view of a surgical helmet assembly according to another exemplary embodiment of the present disclosure.

FIG. 6 illustrates another example of a surgical helmet assembly 600 comprising a fan enclosure 602 positionable on the head of a user so as to surround areas of the user's head and, optionally, a protrusion 604 (which in some embodiments can be a full chin bar positionable about the chin of the user) extending from the fan enclosure 602. The fan enclosure 602 can have one or more apertures 606 disposed at the base of the fan enclosure 602 below the fan 608. A headband strap 612 can optionally have "scoops" or "flow directors" 610. If such scoops or flow directors are present, the one or more apertures 606 can direct the airflow generated by the fan 608 downwards towards flow directors 610. The flow directors 610 can be selectively adjustably redirected by the user as desired, for example to the rear of the head or neck. The flow directors 610 can be located on the headband strap 612 or on separate structure. The helmet assembly 600 may or may not include any nozzles or ducts connected to the fan enclosure 602 or apertures 606.

Figure 7:
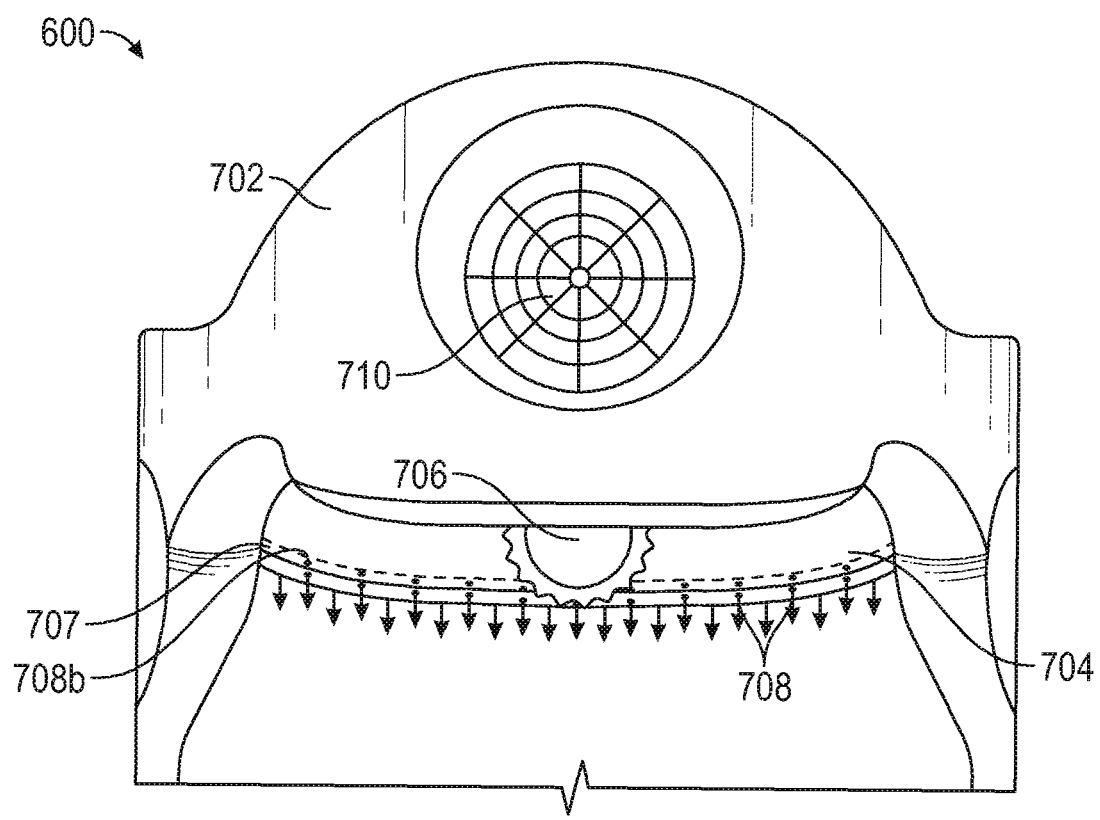
FIG. 7 illustrates a partial back view of a surgical helmet assembly according to another exemplary embodiment of the present disclosure.

FIG. 7 illustrates another example of a surgical helmet assembly 700 comprising a fan enclosure 702 positionable on the head of a user so as to surround areas of the user's head and a headband 704 defining a hollow channel in fluidic communication with the fan 710. The headband 704 can be fluidically coupled to the fan 710 via an internal conduit 707 and can have a plurality of apertures 708 disposed therein for distributing airflow downward from portions of the headband 704 through apertures 708. In one example, the apertures 708 can be distributed across a bottom and rear portion of the headband 604. In operation, air from the fan 710 can be transmitted to the hollow channel inside the headband 604 via an internal conduit 707, and subsequently directed through the plurality of apertures 608, to be distributed to the back of the user's neck or head. Internal conduit 707 can apertures 708b that line up with apertures 708. Movement of internal conduit 707 to the right or left can misalign apertures 708b and apertures 708 such that air flow does not flow through apertures 708. An optional knob 706 can be included to allow for moving the internal conduit 707 right or left, which serves to close off or open apertures 708 to air flow upon rotation of knob 706.

Figure 8A:
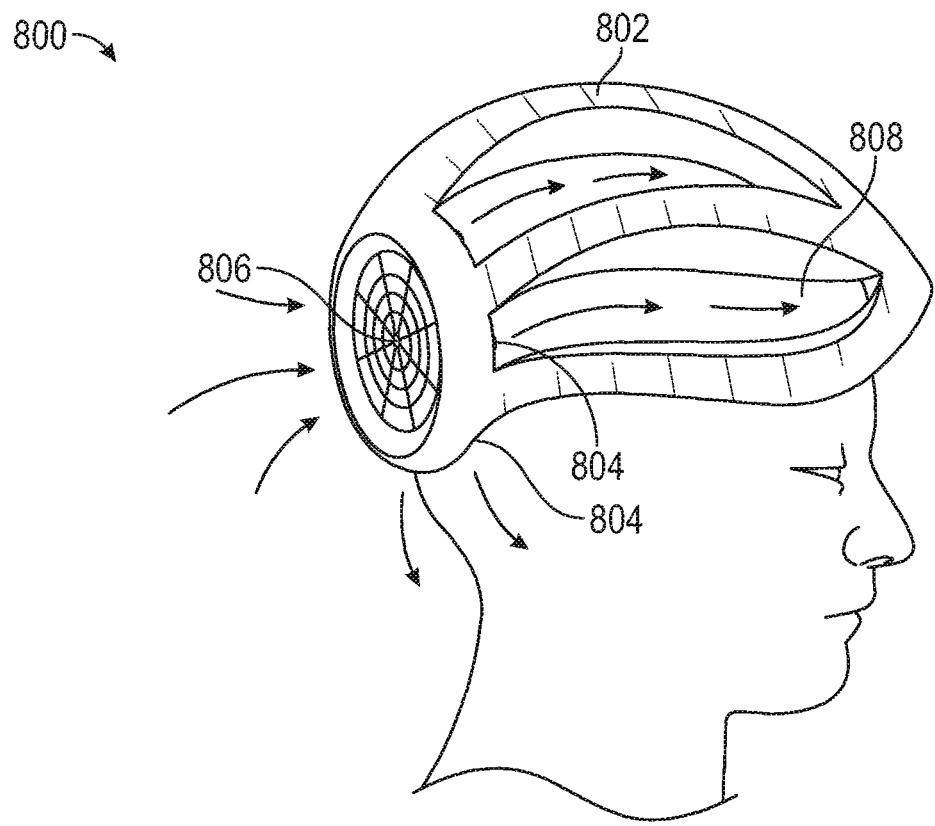
FIG. 8A illustrates a side view of a surgical helmet assembly according to another exemplary embodiment of the present disclosure.
Figure 8B:
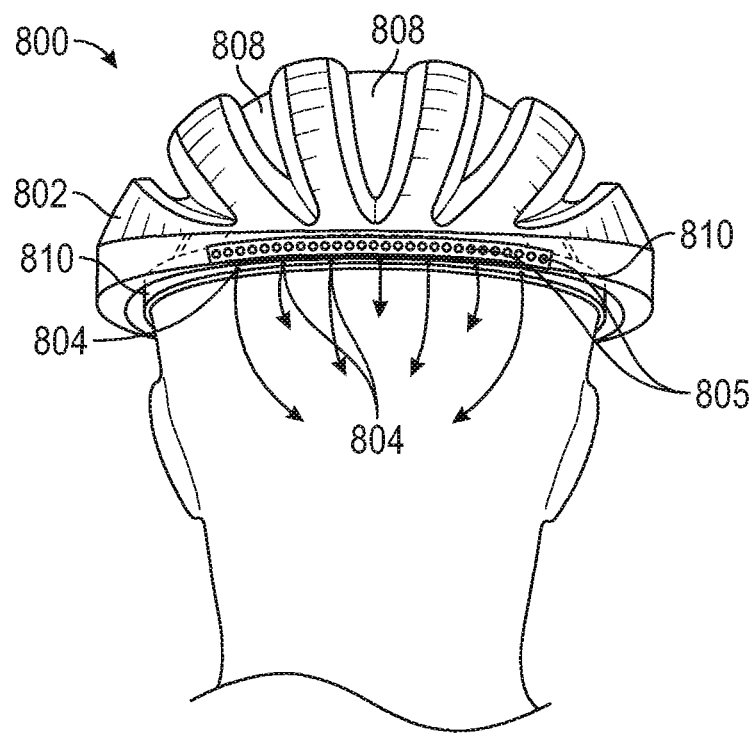
FIG. 8B is a back view of the surgical helmet assembly of FIG. 8A.

FIGS. 8A-8B illustrate another example of a surgical helmet assembly 800 comprising a fan 806 disposed in a fan enclosure 802 positionable on the head of a user. The fan enclosure 802 surrounds areas of the user's head and directly distributes air over the top, side, and rear of the head, as well as to the neck, via apertures 804 disposed in the fan enclosure 802 and/or helmet. Channels 808 defined in portions of the fan enclosure 802, coupled with apertures 804 disposed in the fan enclosure 802 and in fluidic communication with the channels 808, can distribute air to the wearer's face. This surgical helmet assembly 800 optionally includes a headband 810, in which case the headband 810 need not be located in any particular orientation relative to the fan enclosure 802, but may be below the fan enclosure 802 or may be within the fan enclosure 802 as shown in dashed lines in FIG. 8B. The headband 810 can be inflatable or adjustable in length such that its size is adjustable to allow the surgical helmet assembly 800 to fit different size heads. Alternatively, the surgical helmet assembly 800 may fit the user's head without using a headband at all. Helmet assembly 800 can also have lighting 805 comprising LEDs, for example. Lighting 805 can be positioned on a front of helmet assembly 800 above the face of the user and along a brow portion of the helmet assembly.

Figure 9A:
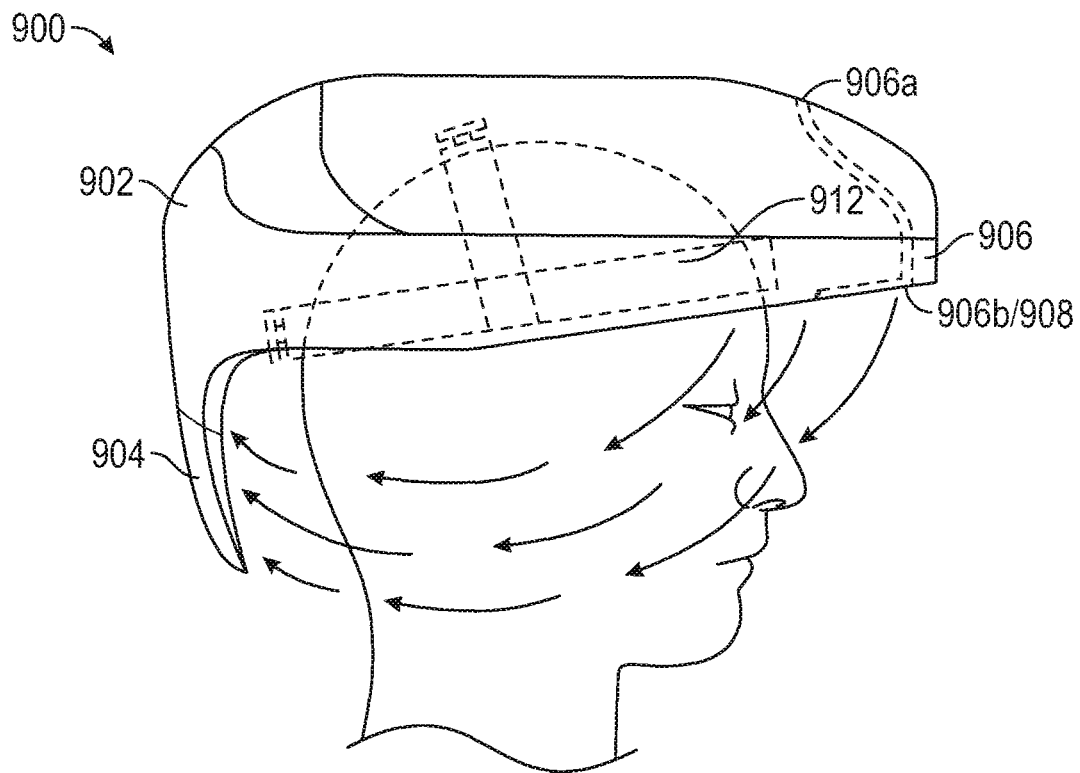
FIG. 9A illustrates a side view of a surgical helmet assembly according to another exemplary embodiment of the present disclosure.
Figure 9B:
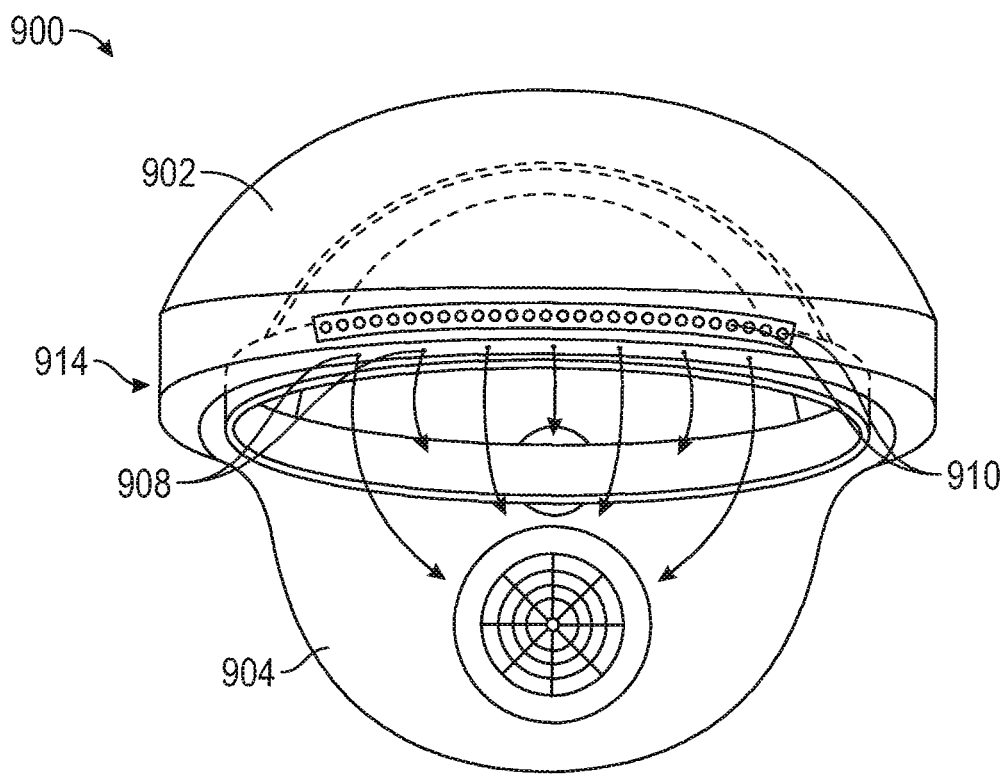
FIG. 9B is a front view of the surgical helmet assembly of FIG. 9A.

FIGS. 9A-9B illustrate another example of a surgical helmet assembly 900 comprising a fan enclosure 902 positionable on the head of a user so as to surround areas of the user's head. Fan enclosure 902 can include a downwardly extending fan intake 904 positioned behind the user's head. The fan intake 904 faces the rear of the user's head, pulling air from the front of the helmet towards the rear of the helmet. The rear of the wearer's neck and head can be cooled via air being pulled into the fan intake 904 adjacent to the neck, rather than, or in addition to, air blown out of a fan inside the helmet and onto the neck or head. The fan enclosure 902 can optionally include internal channels 906 defined therein that can direct air from air inlets 906a on the top of the helmet to outlets 906b (apertures 908) disposed on an underside of the helmet and preferably near the front of the fan enclosure 902 to be blown onto the user's face. An optional headband 912 is shown in dashed lines in FIG. 9A. FIG. 9B shows a front view of the helmet with air traveling from front air outlets 908 in a brow bar portion 914 of the fan enclosure 902 toward the back of the surgical helmet assembly 900 into the fan intake 904. FIG. 9B also shows lights 910, such as LED lights, disposed along the brow bar 914 of the fan enclosure 902.

Figure 10A:
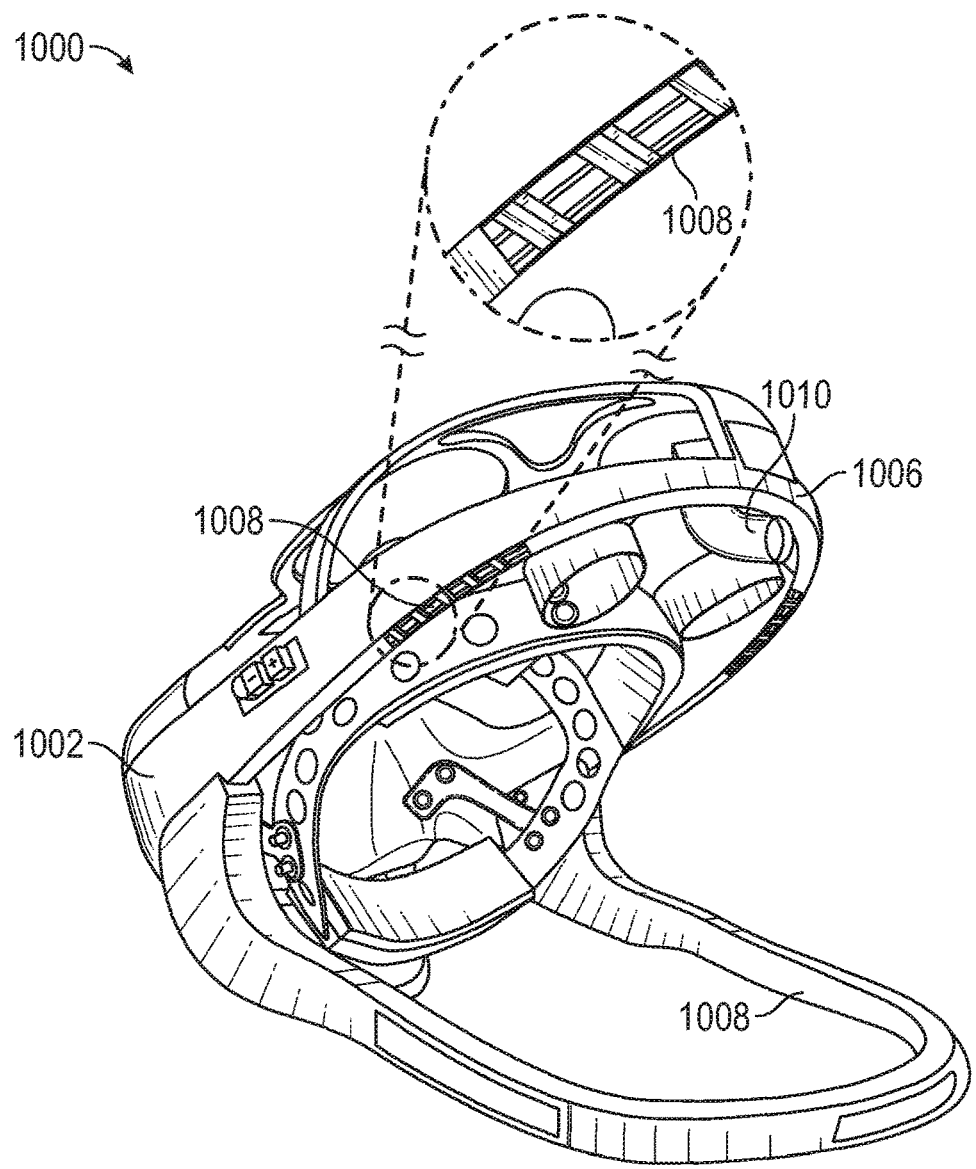
FIG. 10A illustrates a perspective view of a surgical helmet assembly according to another exemplary embodiment of the present disclosure.
Figure 10B:
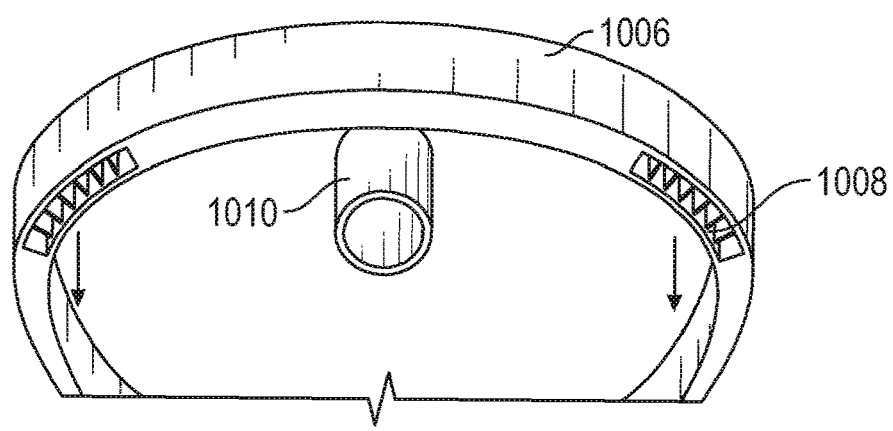
FIG. 10B is a partial perspective view of the brow bar of FIG. 10A.

FIGS. 10A-10B illustrate another example of a surgical helmet assembly 1000 comprising a helmet enclosure 1002 positionable on the head of a user so as to surround areas of the user's head. The helmet enclosure 1002 can include a brow bar portion 1006 positionable about the brow of a user and, optionally, a chin bar portion 1008 positionable about the chin of a user. The helmet enclosure 1002 can define airflow pathways to direct air through the helmet enclosure 1002 and out of baffles or apertures 1008 disposed in the helmet enclosure 1002 to direct airflow to the user. In one example, baffles 1008, such as ventilation baffles, are disposed in an underside of the brow bar portion 1006 of the helmet enclosure 1002 that can direct airflow towards the user's face. Additionally, the baffles 1008 can be located to the sides of the LED light 1010 such that the LED light 1010 is not located below any front nozzle opening so as to avoid distributing heat from lights 1010 directly onto the user's face.

Figure 11:
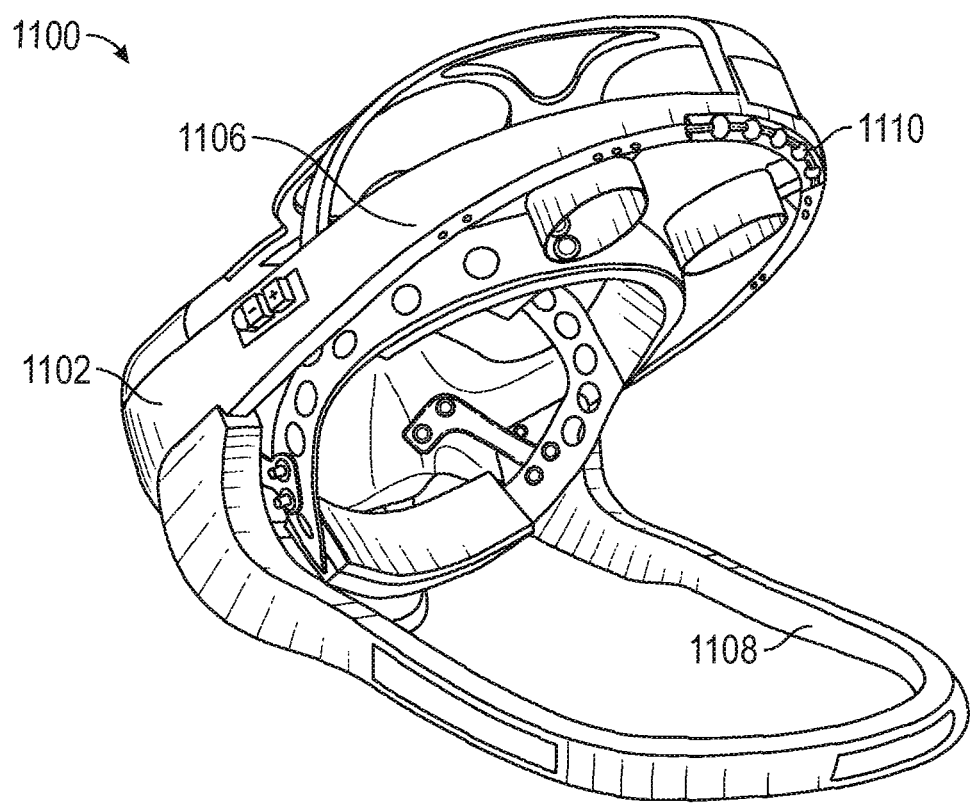
FIG. 11 illustrates a perspective view of a surgical helmet assembly according to another exemplary embodiment of the present disclosure.
Figure 12:
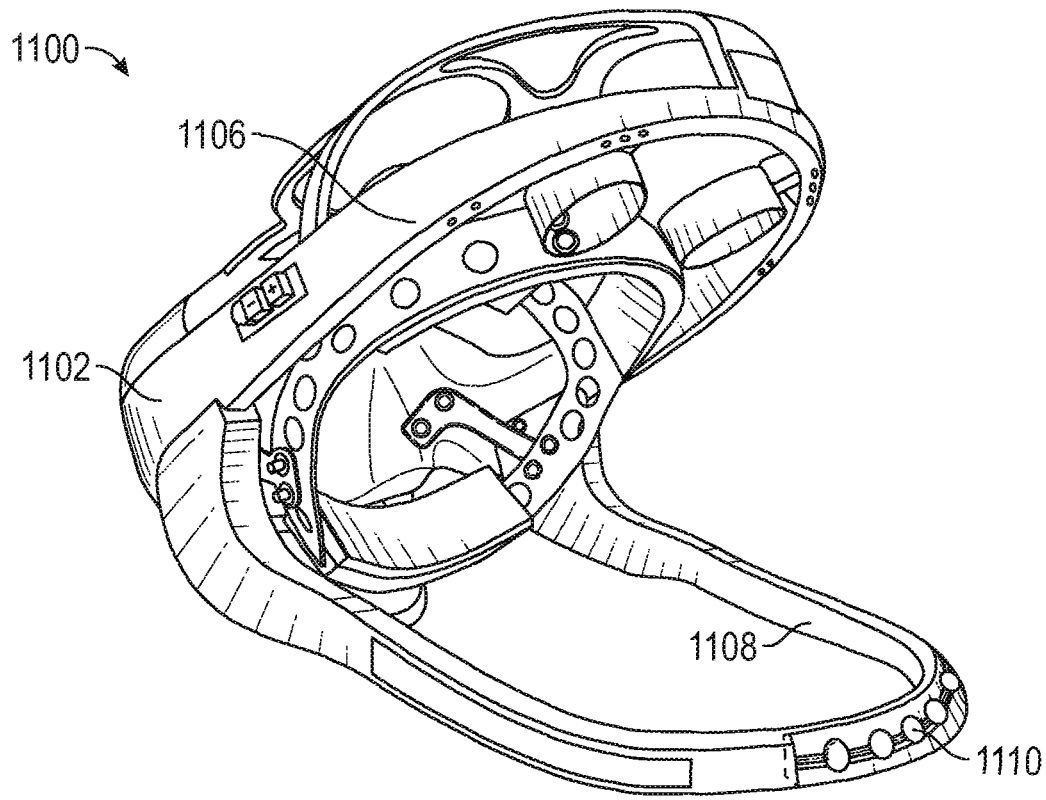
FIG. 12 illustrates a perspective view of a surgical helmet assembly according to another exemplary embodiment of the present disclosure.
Figure 13:
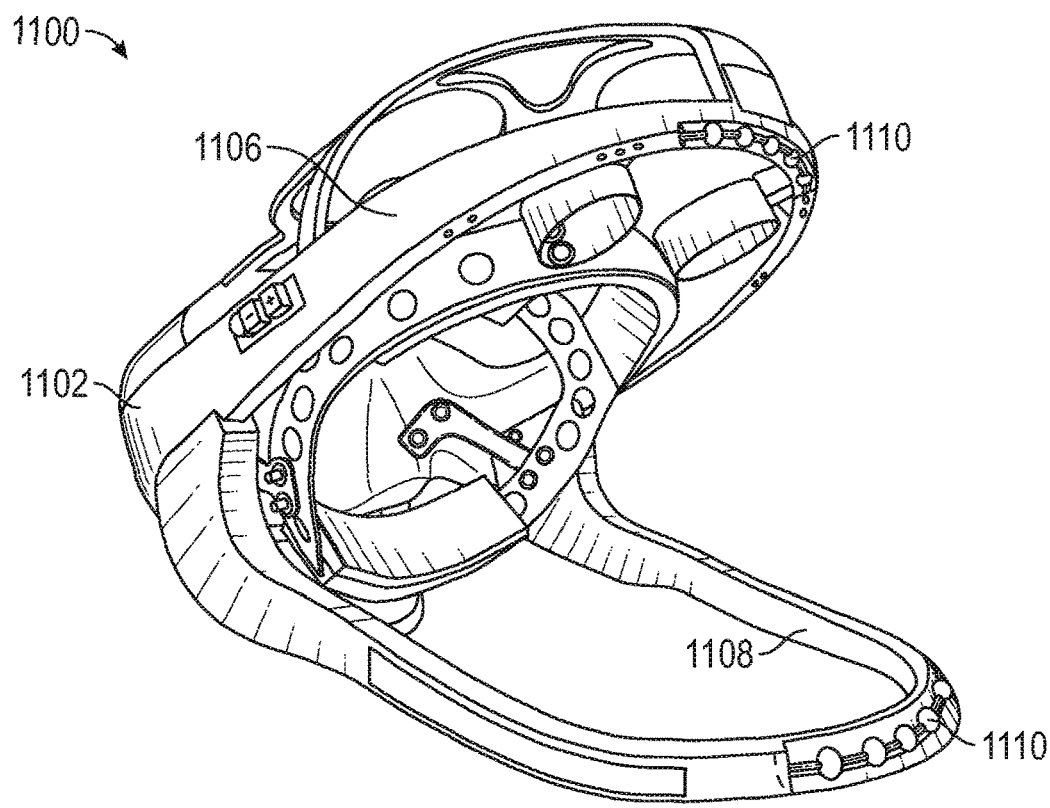
FIG. 13 illustrates a perspective view of a surgical helmet assembly according to another exemplary embodiment of the present disclosure.
Figure 14:
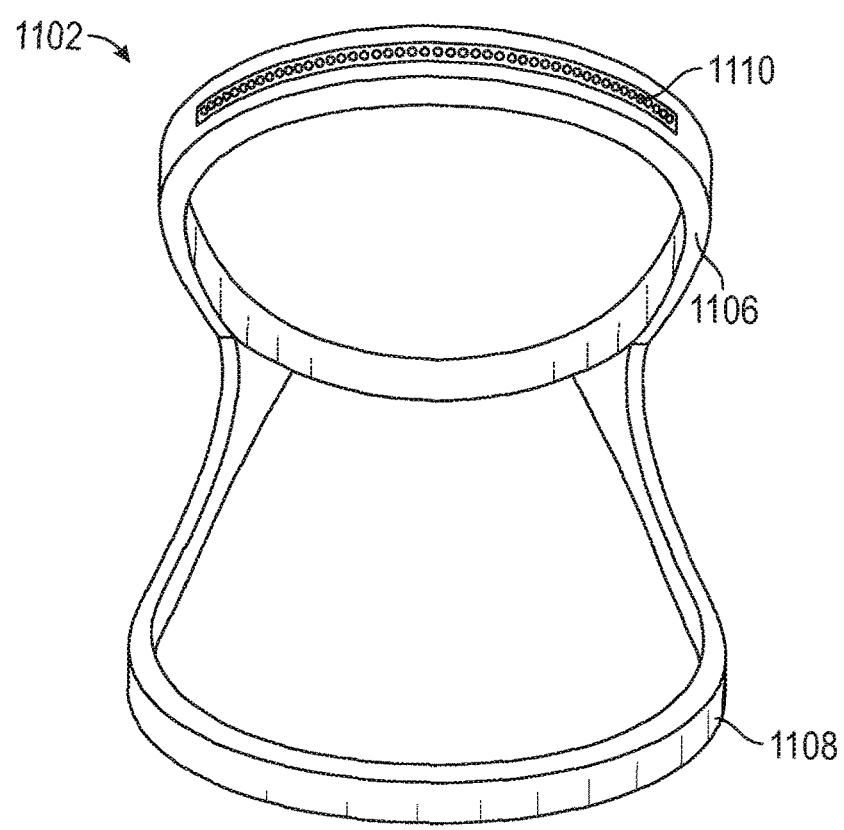
FIG. 14 illustrates a perspective view of a portion of a surgical helmet assembly according to another exemplary embodiment of the present disclosure.
Figure 15:
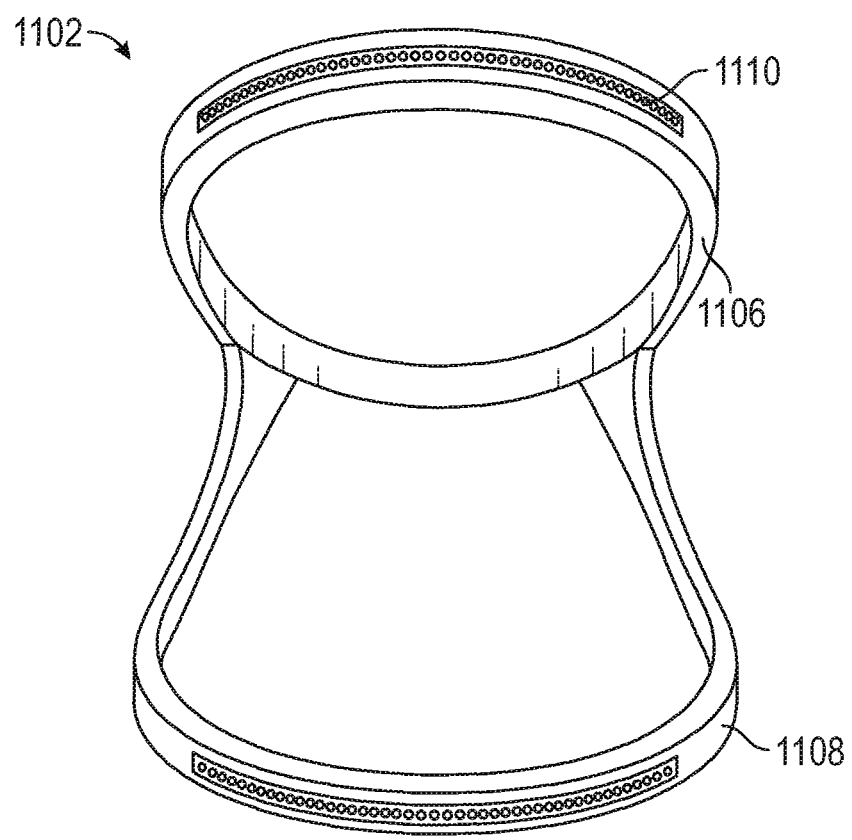
FIG. 15 illustrates a perspective view of a portion of a surgical helmet assembly according to another exemplary embodiment of the present disclosure.

FIGS. 11-15 illustrate other examples of a surgical helmet assembly 1100 comprising a helmet enclosure 1102 positionable on the head of a user so as to surround areas of the user's head. The helmet enclosure 1102 can include a brow bar portion 1106 positionable about the brow of a user and, optionally, a chin bar portion 1108 positionable about the chin of a user. The helmet enclosure 1102 can have lights 1110, such as light emitting diodes (LEDs), integrally formed in the brow bar portion 1106 or in the chin bar portion 1108 of the helmet enclosure 1102. The orientation of the lights 1110 can be adjustable by the user so as to project a beam of light directly in front of the user focused at a desired location. FIGS. 11 and 14 show examples of a surgical helmet assembly 1100 having lights integrated in to the brow bar portion 1106 of the helmet enclosure 1102. FIG. 12 shows an example of a surgical helmet assembly 1100 having lights integrated into the chin bar portion 1108 of the helmet enclosure. FIGS. 13 and 15 show examples of a surgical helmet assembly 1100 having lights integrated in to the brow bar portion 1106 and the chin bar portion 1108 of the helmet enclosure 1102.

Figure 16A:
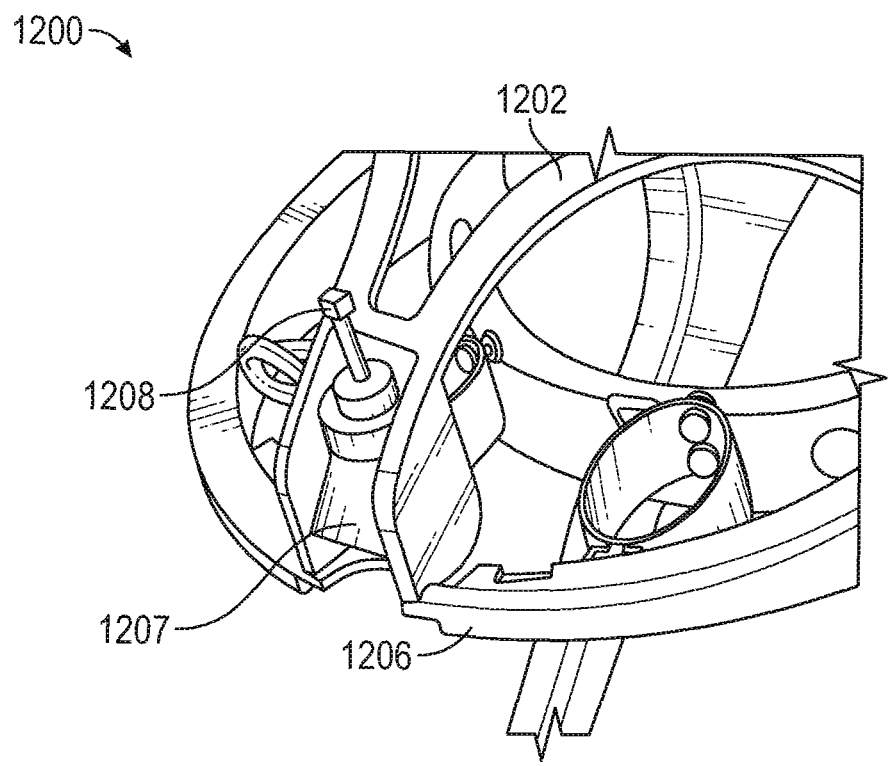
FIG. 16A illustrates a partial perspective view of a surgical helmet assembly according to another exemplary embodiment of the present disclosure.
Figure 16B:
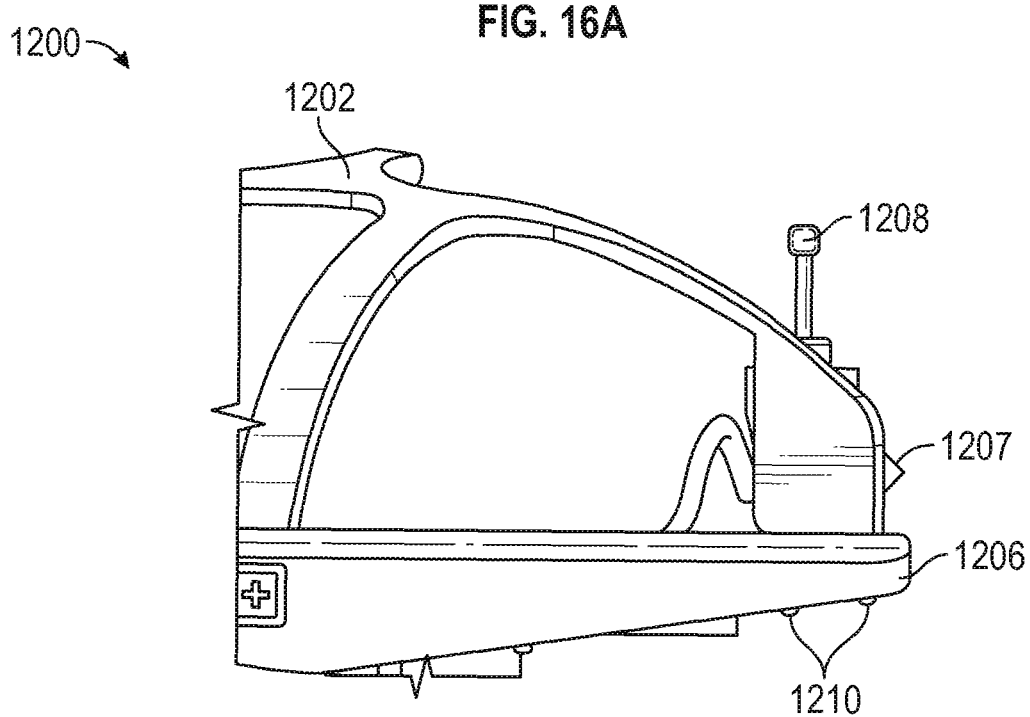
FIG. 16B is a partial side view of the surgical helmet assembly of FIG. 16A.

FIGS. 16A-16B illustrate another example of a surgical helmet assembly 1200 comprising a helmet enclosure 1202 positionable on the head of a user so as to surround areas of the user's head. The helmet enclosure 1202 can include a brow bar portion 1206 positionable about the brow of a user. The helmet enclosure 1202 can have a light 1207, such as an LED, coupled thereto that extends upward from or is positioned above the brow bar portion 1206 and above all front air outlets 1210 disposed in the brow bar portion 1206 of the helmet enclosure 1202. Light 1207 can have an adjustment knob 1208 to allow the user to adjust an angle of the light 1207. In an additional embodiment, knob 1208 may also be rotatable to control a focus or brightness of light emanating from light 1207.

Figure 17:
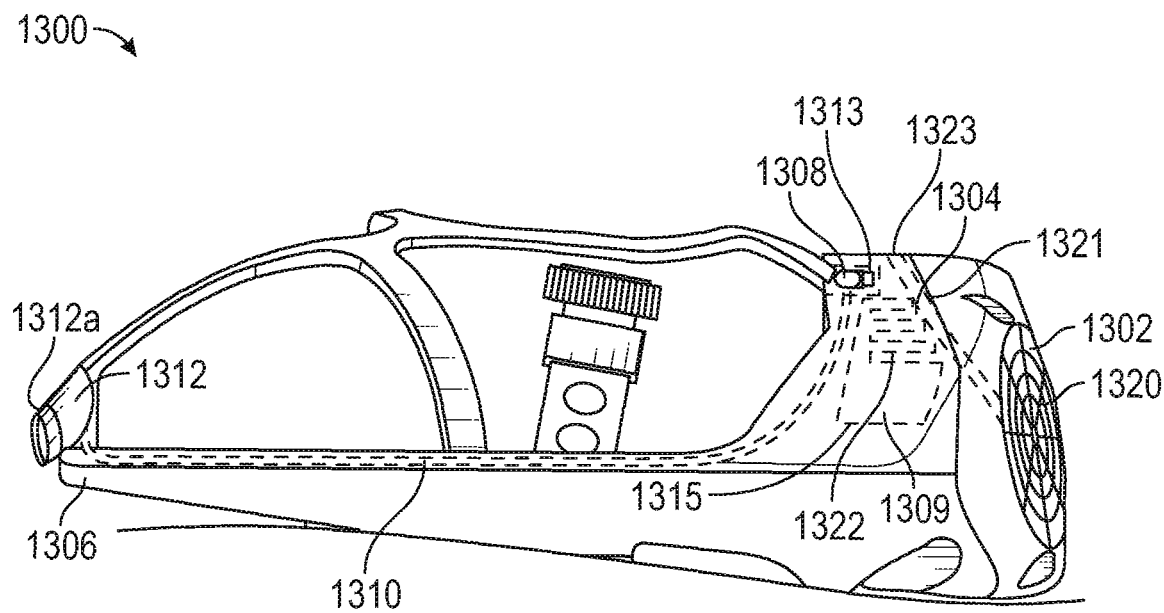
FIG. 17 illustrates a side view of a surgical helmet assembly according to another exemplary embodiment of the present disclosure.

FIG. 17 illustrates another example of a surgical helmet assembly 1300 comprising a helmet enclosure 1302 positionable on the head of a user so as to surround areas of the user's head. The helmet enclosure 1302 can include a brow bar portion 1306 positionable about the brow of a user. The helmet enclosure 1302 can have a light source 1308 located in an interior portion of the helmet enclosure 1302 and remote from the brow bar portion 1306 of the helmet enclosure 1302, such as at a rear and top portion of the helmet as shown in FIG. 17. The light source 1308 can be located, for example and without limitation, within a fan housing 1304 coupled thereto. The light source 1308 can transmit light to a light emitter 1312 disposed on or in the brow bar portion 1306 via a fiber optic cable or light pipe 1310. A plurality of fiber optic cables 1310 can be used to transmit light to a plurality of light emitters 1312. Light emitter 1312 can be angled to direct light in a desired direction. Light emitter 1312 can also comprise a rotatable focus ring 1312a to rotatably adjust the focus or intensity of light emanating from light emitter 1312. An on/off switch 1313 can be located at light source 1308 or can be positioned adjacent light emitter 1312 or elsewhere on the helmet, for example. Light source 1308 can comprise a driver, such as an LED driver 1309, and can also comprise an integrated heatsink 1322 and a power source 1315, such as a battery, or may be connectable to a power source that powers fan 1320. A cooling port 1321 may be in fluid communication with the heatsink 1322 and fan 1320. Air may be drawn in through fan 1320, through cooling port 1321, pass over and cool heatsink 1322, and exit out an outlet port 1323, such as at a top of the helmet 1300, where the hot air can rise away from the user wearing the helmet 1300.

Figure 18:
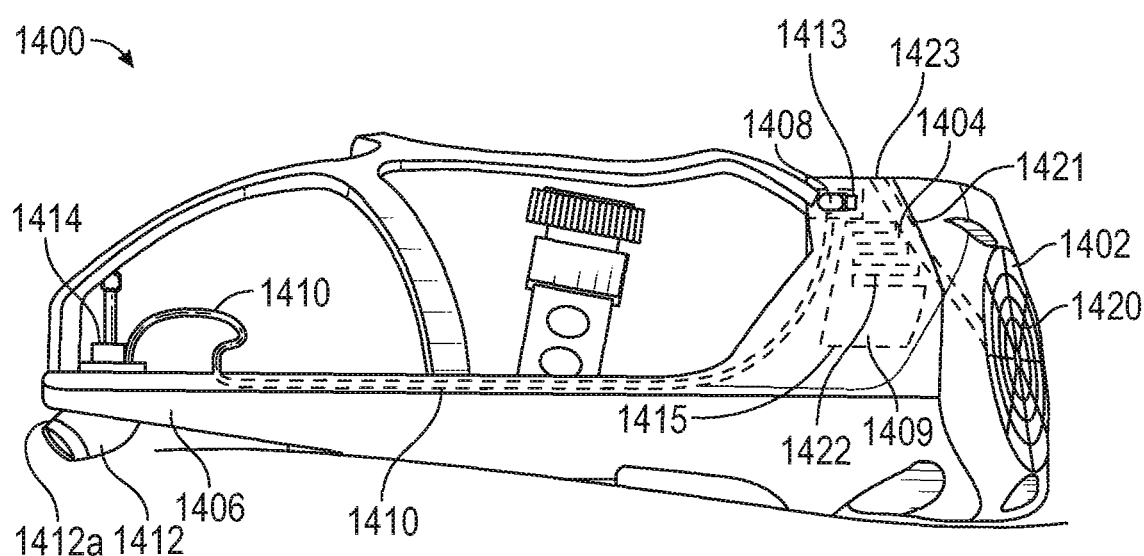
FIG. 18 illustrates a side view of a surgical helmet assembly according to another exemplary embodiment of the present disclosure.

FIG. 18 illustrates another example of a surgical helmet assembly 1400 similar to FIG. 17. The light pipe 1410 may include integral optical elements, such as one or more mirrors and/or lenses, and its direction may be adjustable. The distal end of the light pipe 1410 may also be connected to an adjustable mechanical housing 1414 that contains one or more mirrors and/or lenses to direct light as desired. Mechanical housing 1414 may comprise a rod to adjust the direction of light emanating from light emitter 1412. The light pipe 1410 or mechanical housing 1414 in this aspect may be located above, below, or lateral to any front air outlets. Other features explained above with reference to FIG. 13 (13##) also correspond to like features shown in FIG. 14 (14##).

Figure 19A:
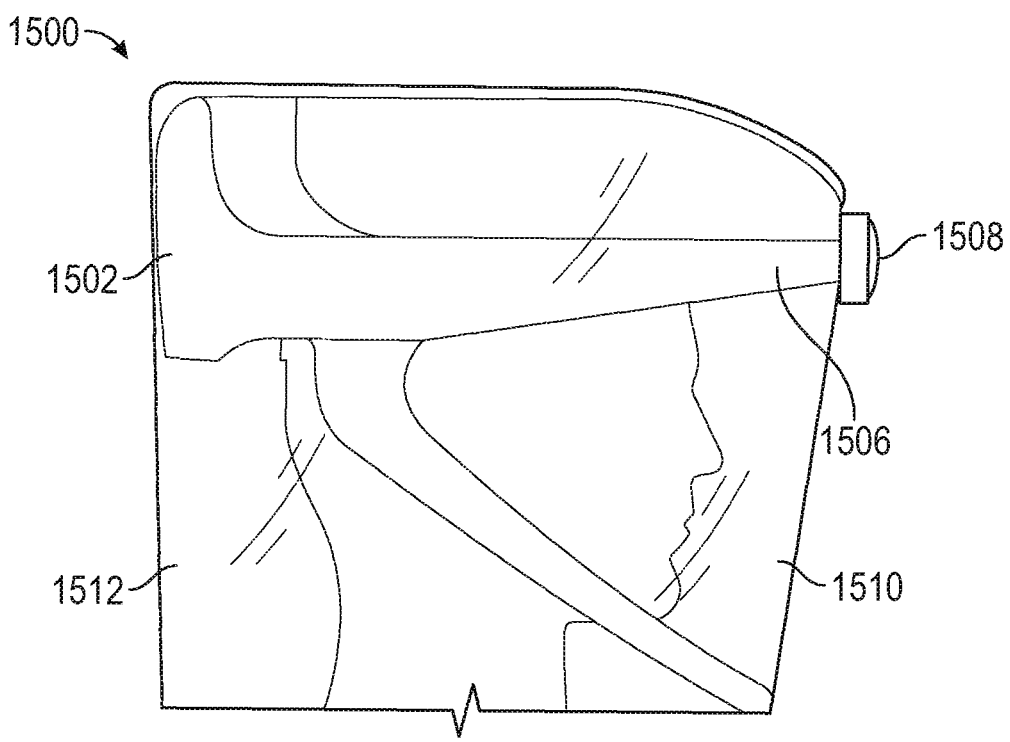
FIG. 19A illustrates a side view of a surgical helmet assembly according to another exemplary embodiment of the present disclosure.
Figure 19B:
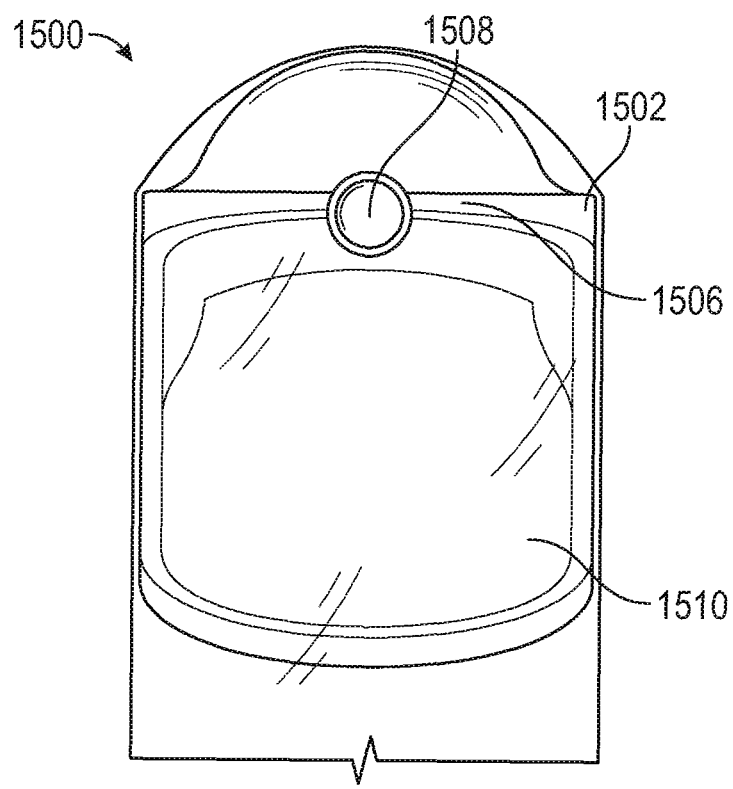
FIG. 19B is a front view of the surgical helmet assembly of FIG. 19A.

FIGS. 19A-19B illustrate another example of a surgical helmet assembly 1500 comprising a helmet enclosure 1502 positionable on the head of a user so as to surround areas of the user's head. The helmet enclosure 1502 can include a brow bar portion 1506 positionable about the brow of a user. The helmet enclosure 1502 can have a modular light 1508, such as a modular LED light, that is coupleable to the helmet enclosure 1502 or face shield 1510 from the exterior of the surgical garment 1512. The modular LED light 1508 could be a sterile, disposable, single-use light and, additionally or alternatively, can be coupled to the helmet enclosure 1502 or face shield 1510 by way of a snap-fit fastener, clip-on fastener, compression-fit fastener, clamping fastener, magnetic fastener, suction-cup fastener, adhesive fastener, hook-and-loop fastener, or any other fastener suitable for attaching the modular LED light 1508 to the helmet enclosure 1502 or face shield 1510 from the exterior of the surgical garment 1512. It could be located anywhere suitable for providing light to the surgical field as desired by the user.

Figure 20A:
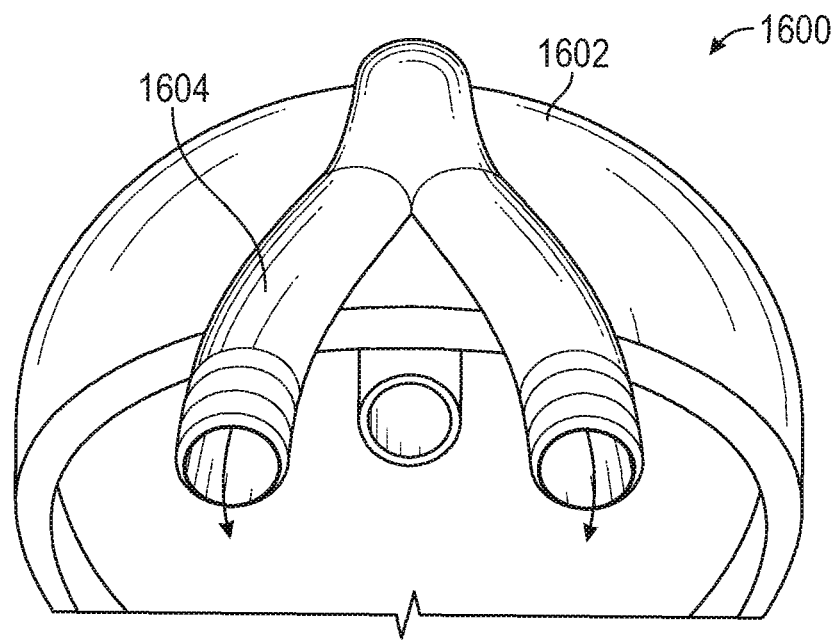
FIG. 20A illustrates a partial perspective front view of a surgical helmet assembly according to another exemplary embodiment of the present disclosure.
Figure 20B:
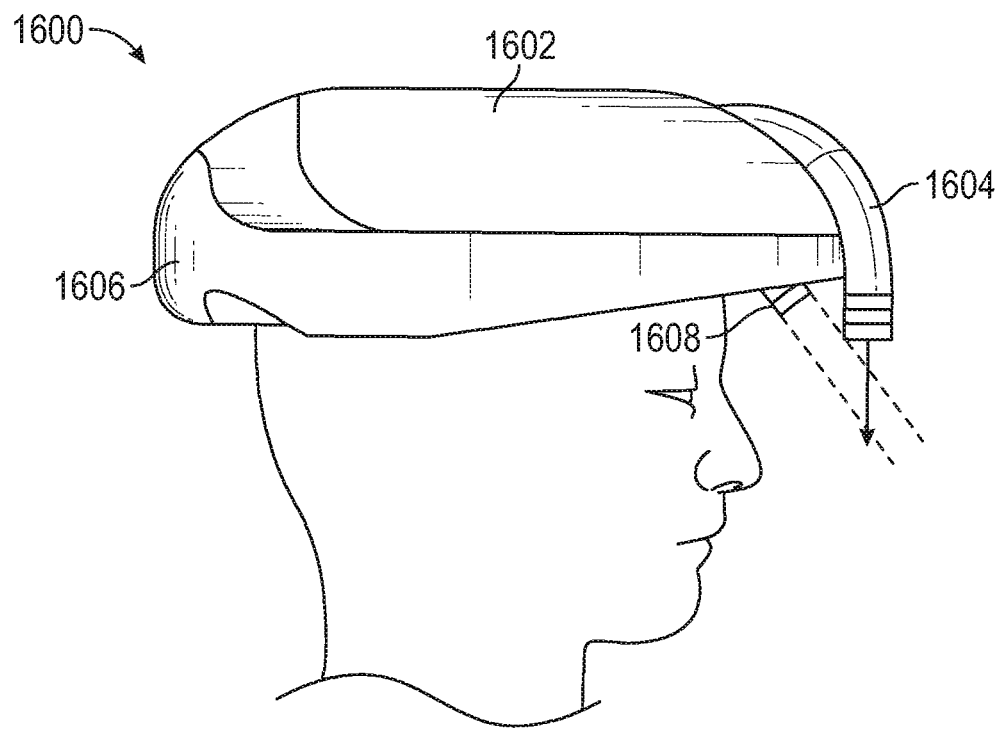
FIG. 20B is a side view of the surgical helmet assembly of FIG. 20A.

FIGS. 20A-20B illustrate another example of a surgical helmet assembly 1600 comprising a helmet enclosure 1602 positionable on the head of a user so as to surround areas of the user's head. The helmet enclosure 1602 has one or more adjustable, flexible tubes 1604 coupled thereto to communicate airflow from the fan enclosure 1606 towards the user's face. The tubes 1604 may be adjusted in several directions, including the left-right, front-back direction, and the up-down direction. Accordingly, the user can direct the tubes 1604 to allow cooling air to flow in a desired direction out of the outlets of the tubes 1604 near light 1608.

FIGS. 21A-21C illustrate another example of a surgical helmet assembly 1700 comprising a helmet enclosure 1702 positionable on the head of a user so as to surround areas of the user's head, a surgical garment 1704, and an adjustable light assembly 1706. The adjustable light assembly 1706 is attached to the surgical helmet assembly 1700 above all of the air outlets at the front of the helmet enclosure 1702. In this design, the transparent face shield 1708 may extend higher than the brow bar 1710 of the helmet enclosure 1702 to allow light to pass through to the operating field, as shown in FIG. 21C. Air outlets 1705 can direct cooling air down toward the user's face, as depicted by the downward arrows.

Figure 22A:
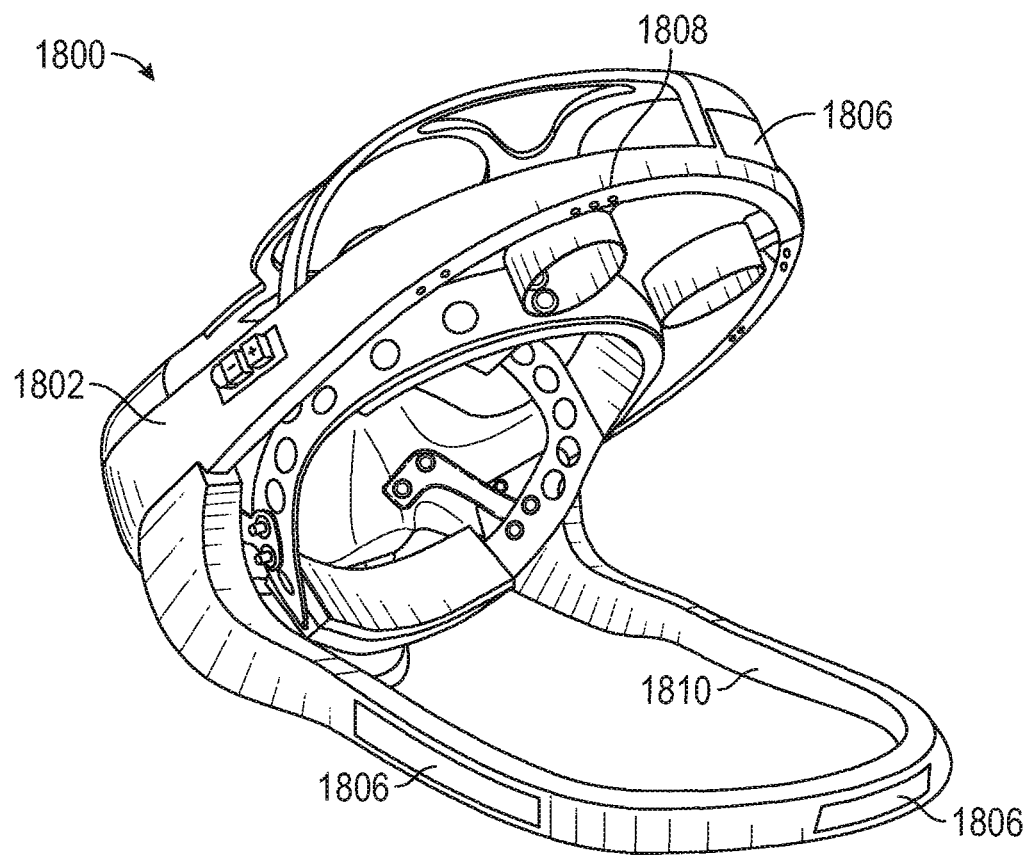
FIG. 22A illustrates a perspective view of a surgical helmet assembly without a shield according to another exemplary embodiment of the present disclosure.
Figure 22B:
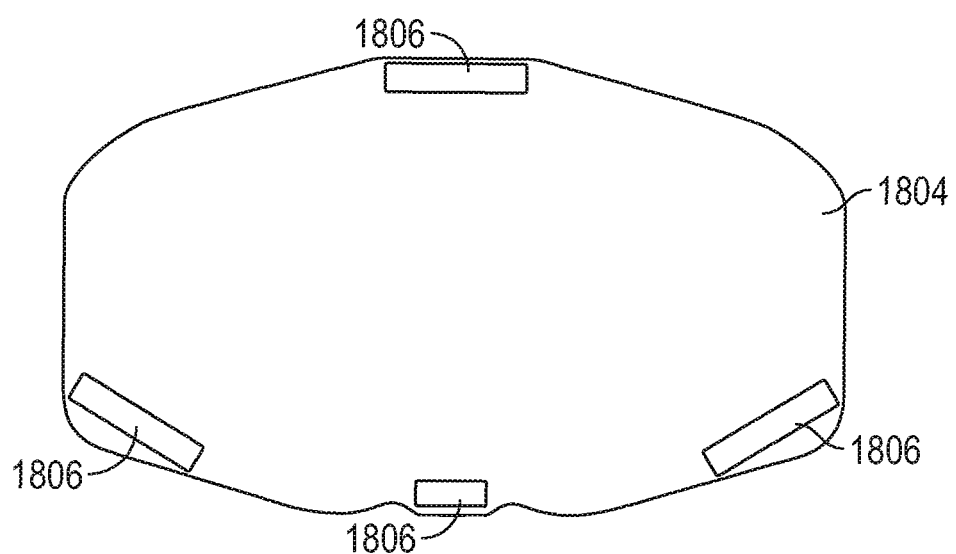
FIG. 22B illustrates the shield for coupling to the helmet enclosure of FIG. 22A.

FIGS. 22A-22B illustrate another example of a surgical helmet assembly 1800 comprising a helmet enclosure 1802 positionable on the head of a user so as to surround areas of the user's head and a face shield 1804 coupleable to the helmet enclosure 1802. The face shield 1804 can be coupled to the helmet enclosure 1802 by mating pairs of hook and loop type fasteners 1806 spaced along the chin bar 1810 and the brow bar 1808 when assembled. Corresponding mating pairs of hook and loop fasteners 1806 on the face shield 1804 are depicted in FIG. 22B.

Figure 23A:
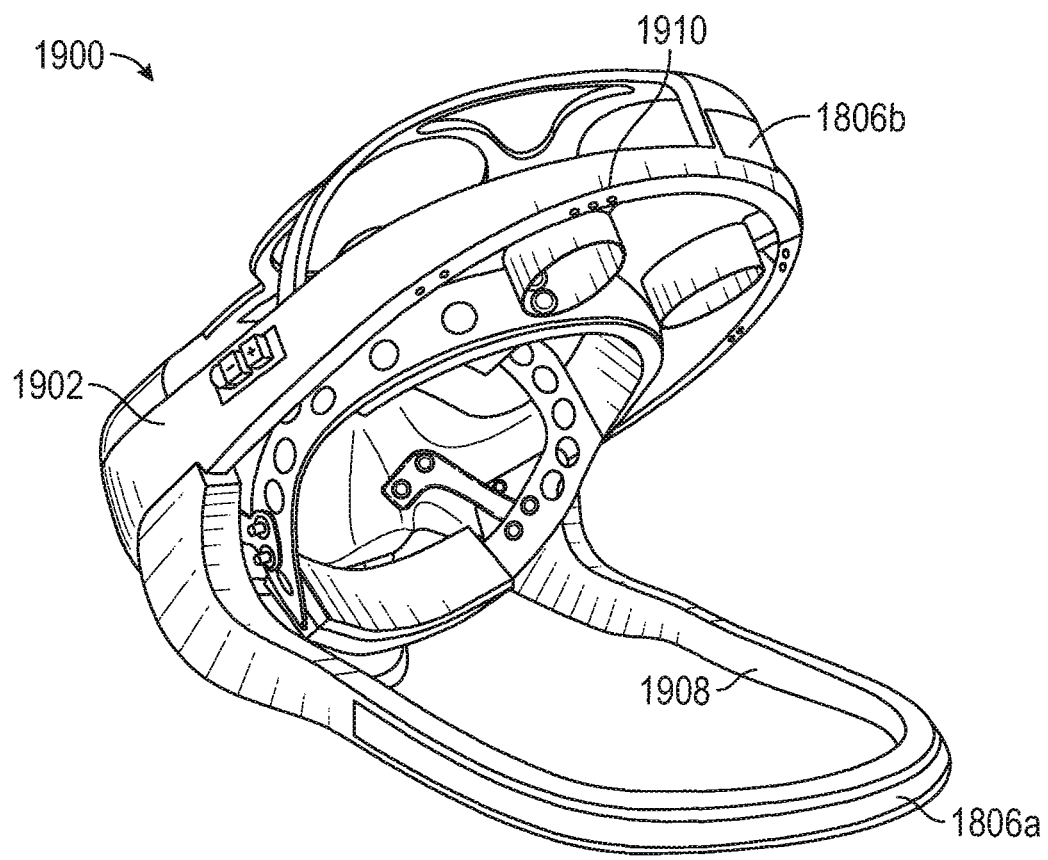
FIG. 23A illustrates a perspective view of a surgical helmet assembly without a shield according to another exemplary embodiment of the present disclosure.
Figure 23B:
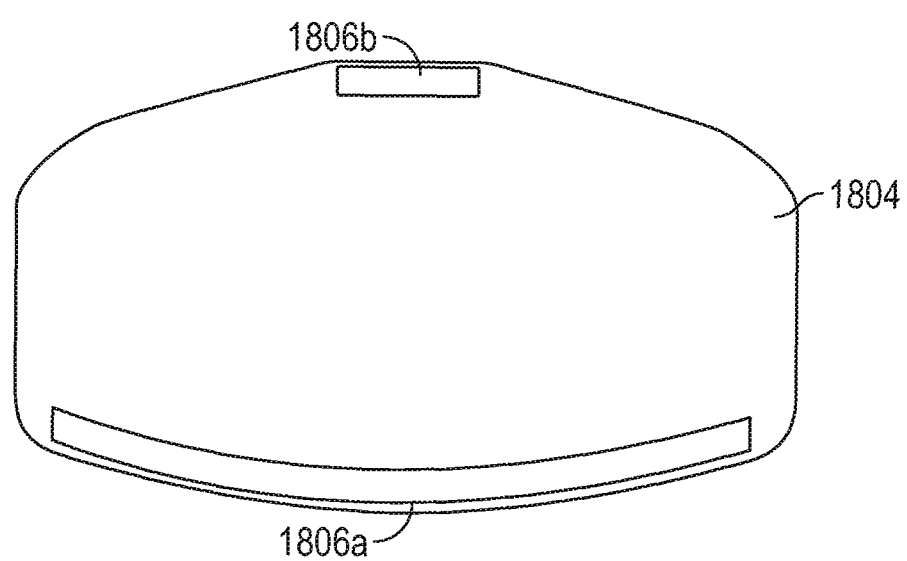
FIG. 23B illustrates the shield for coupling to the helmet enclosure of FIG. 23A.

FIGS. 23A-23B illustrate yet another example of a surgical helmet assembly 1900 similar to that of FIGS. 22A-22B. The surgical helmet assembly 1900 comprising a helmet enclosure 1902 positionable on the head of a user so as to surround areas of the user's head and a face shield 1904 coupleable to the helmet enclosure 1902. The face shield 1904 can be coupleable to the helmet enclosure 1902 by mating pairs of hook and loop type fasteners 1906, with a first pair of fasteners 1906a extending along a chin bar 1908 of the helmet enclosure 1902 when assembled and a second pair of fasteners 1906b positioned at the front of the brow bar 1910 when assembled.

Figure 24A:
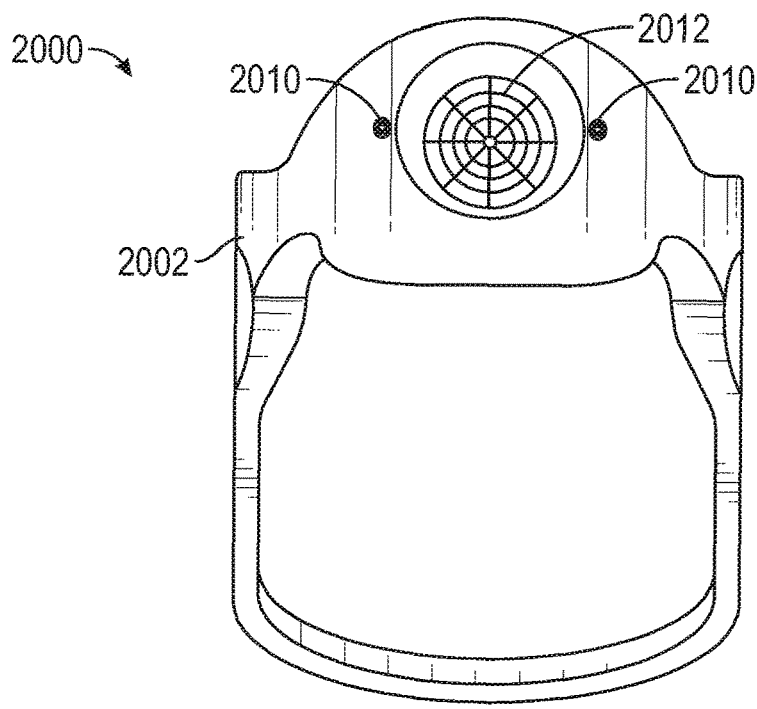
FIG. 24A illustrates a back view of a surgical helmet assembly according to another exemplary embodiment of the present disclosure.
Figure 24B:
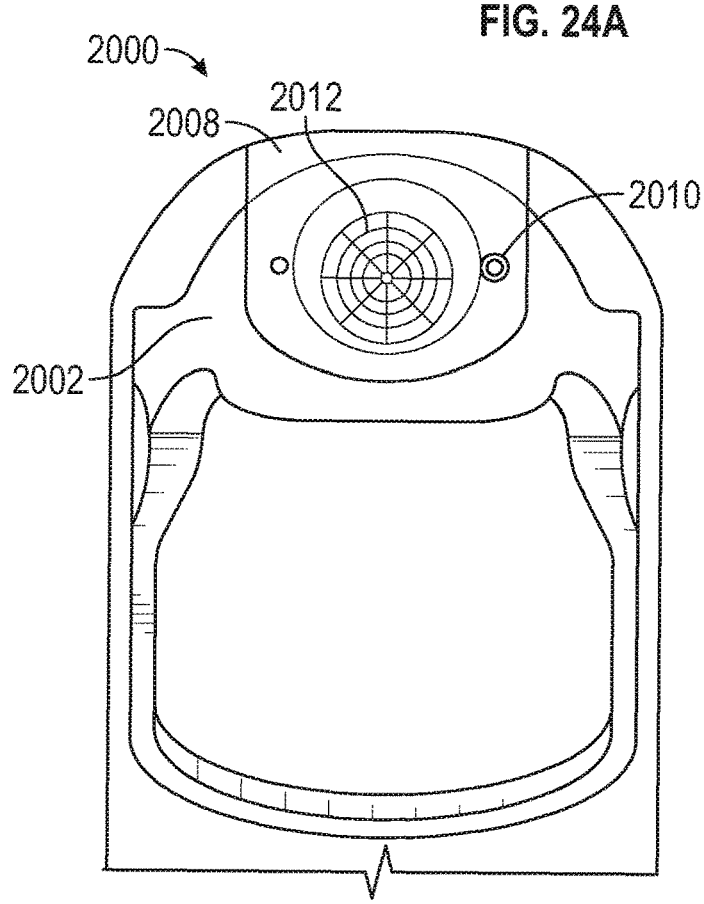
FIG. 24B is a back view of the surgical helmet assembly of FIG. 24A including a surgical garment.
Figure 24C:
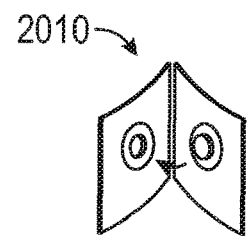
FIG. 24C is a close up view of one embodiment of an exemplary fastener that can be implemented in the surgical helmet assembly of FIG. 24A.
Figure 24D:
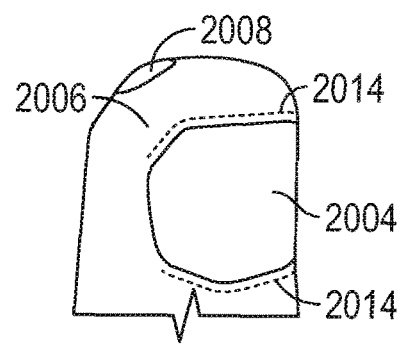
FIG. 24D is a side view of the surgical helmet assembly of FIG. 24A.

FIGS. 24A-24D illustrate another example of a surgical helmet assembly 2000 comprising a helmet enclosure 2002 positionable on the head of a user so as to surround areas of the user's head and a face shield 2004 coupleable to the helmet enclosure 2002 that can be sufficiently large that it need not be centered relative to the helmet enclosure 2002 to accommodate an unobstructed view for the user. The face shield 2004 can form part of a surgical garment 2006 that also includes a filter 2008 that is positioned over a fan intake 2012. FIGS. 24A and 24B show back views of helmet assembly 2000, and FIG. 24D shows a side view of helmet assembly 2000. The surgical garment 2006 can be coupled to the helmet enclosure 2002 via mating pairs of fasteners 2010 that ensure the filter 2008 is positioned over the fan intake 2012 of the helmet enclosure 2002. Such fasteners 2010 can include, for example and without limitation, button snaps, hook-and-loop fasteners, magnets, or the like. The border of the face shield 2004 may include a malleable wire 2014 along its perimeter to permit the user to mold the face shield 2004 to the helmet enclosure 2002.

Figure 25A:
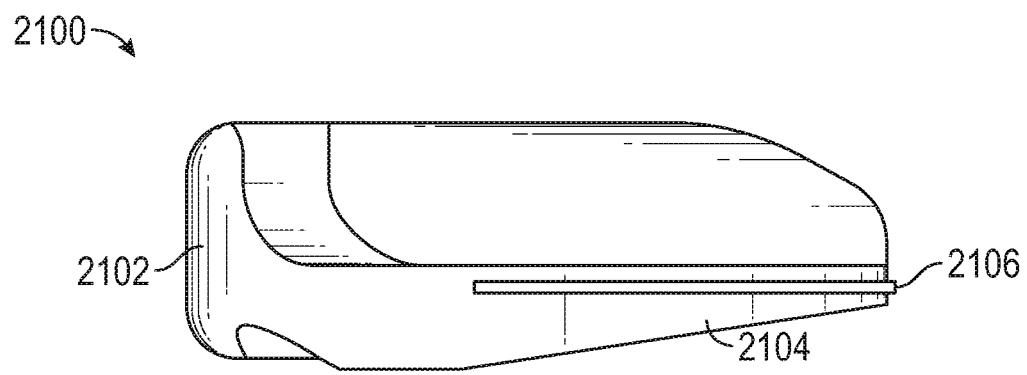
FIG. 25A illustrates a side view of a surgical helmet assembly according to another exemplary embodiment of the present disclosure.
Figure 25B:
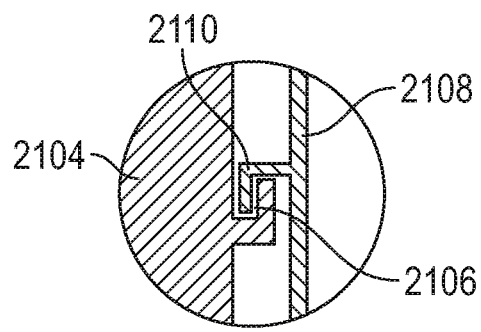
FIG. 25B is a side view of one exemplary attachment mechanism for the helmet and the face shield of the surgical helmet assembly of FIG. 25A.
Figure 25C:
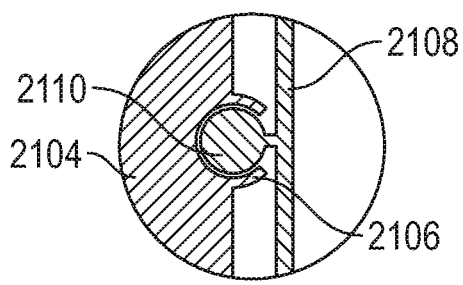
FIG. 25C is a side view of another exemplary attachment mechanism for the helmet and the face shield of the surgical helmet assembly of FIG. 25A.

FIG. 25A illustrates another example of a surgical helmet assembly 2100 comprising a helmet enclosure 2102 positionable on the head of a user so as to surround areas of the user's head. The helmet enclosure 2102 can include a brow bar portion 2104 positionable about the brow of a user. The brow bar portion 2104 can include a channel or lip 2106 extending along at least a portion thereof for receiving a face shield 2108 having a mating member 2110 receivable in the channel as illustrated in FIGS. 25B and 25C. The mating member 2110 for the channel or the clip can include, for example and without limitation, a compression fit member, a friction fit member, a snap fit member, an interlocking fit member, and the like.

Figure 26A:
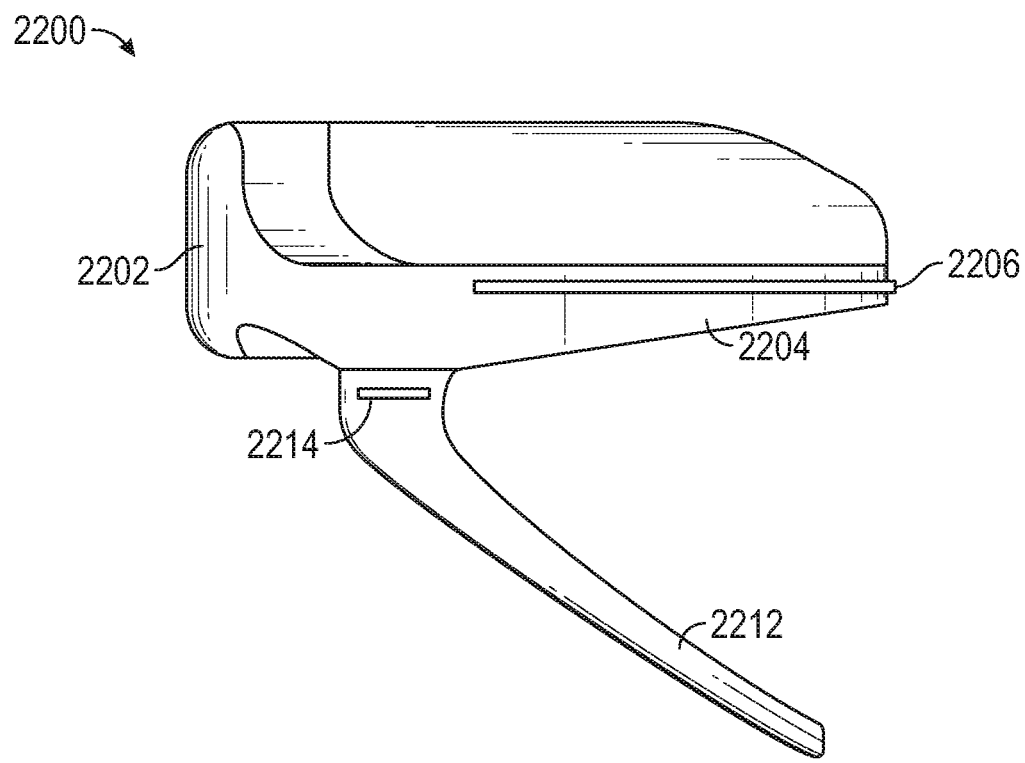
FIG. 26A illustrates a side view of a surgical helmet assembly according to another exemplary embodiment of the present disclosure.
Figure 26B:
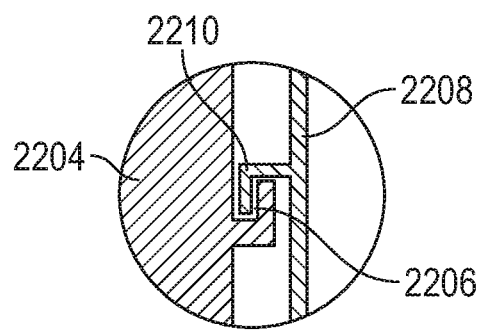
FIG. 26B is a side view of one exemplary attachment mechanism for the helmet and the face shield of the surgical helmet assembly of FIG. 26A.
Figure 26C:
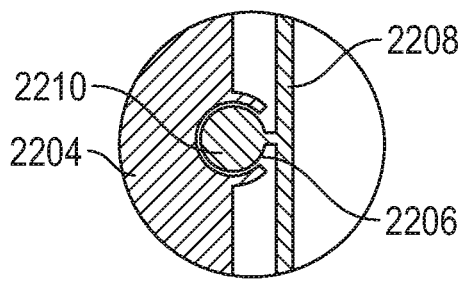
FIG. 26C is a side view of another exemplary attachment mechanism for the helmet and the face shield of the surgical helmet assembly of FIG. 26A.

FIG. 26A illustrates another example of a surgical helmet assembly 2200 comprising a helmet enclosure 2202 positionable on the head of a user so as to surround areas of the user's head. The helmet enclosure 2202 can include a brow bar portion 2204 positionable about the brow of a user and a chin bar portion 2212. The brow bar portion 2204 can include a channel or lip 2206 extending along at least a portion thereof for receiving a face shield 2208 having a mating member 2210 receivable in the channel as illustrated in FIGS. 26B and 26C. The mating member 2210 for the channel or the clip can include, for example and without limitation, a compression fit member, a friction fit member, a snap fit member, an interlocking fit member, and the like. Additionally or alternatively, a side of the face shield 2208 can be clipped into a channel 2214 disposed on the helmet enclosure 2202 near the upper portion of the chin bar 2212.

Figure 27A:
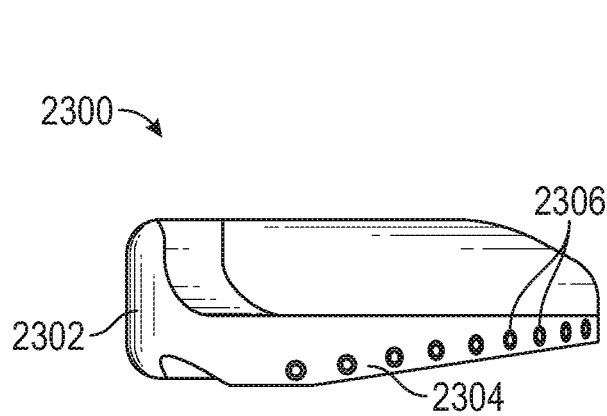
FIG. 27A illustrates a side view of a surgical helmet assembly according to another exemplary embodiment of the present disclosure.

FIG. 27A illustrates another example of a surgical helmet assembly 2300 comprising a helmet enclosure 2302 positionable on the head of a user so as to surround areas of the user's head. The helmet enclosure 2302 can include a brow bar portion 2304 positionable about the brow of a user. The brow bar portion 2304 can include one or more fasteners 2306 extending along at least a portion thereof for coupling to a face shield 2308. The one or more fasteners 2306 can include, for example and without limitation, snaps, push nuts, suction cups or the like disposed along the brow bar portion 2304. Alternatively, the fastener(s) 2306 can be disposed on the face shield 2308 and secured along the brow bar portion 2304 of the helmet enclosure 2302. Although not shown in FIG. 27A, the surgical helmet assembly 2300 may include a chin bar provided with one or more snaps, push nuts, suction cups or the like for further attaching the face shield.

Figure 27B:
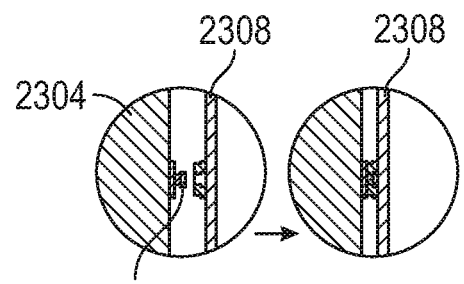
FIG. 27B is a side view of one exemplary attachment mechanism for the helmet and the face shield of the surgical helmet assembly of FIG. 27A.
Figure 27C:
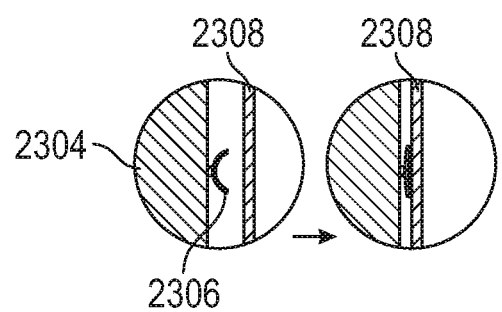
FIG. 27C is a side view of another exemplary attachment mechanism for the helmet and the face shield of the surgical helmet assembly of FIG. 27A.
Figure 28A:
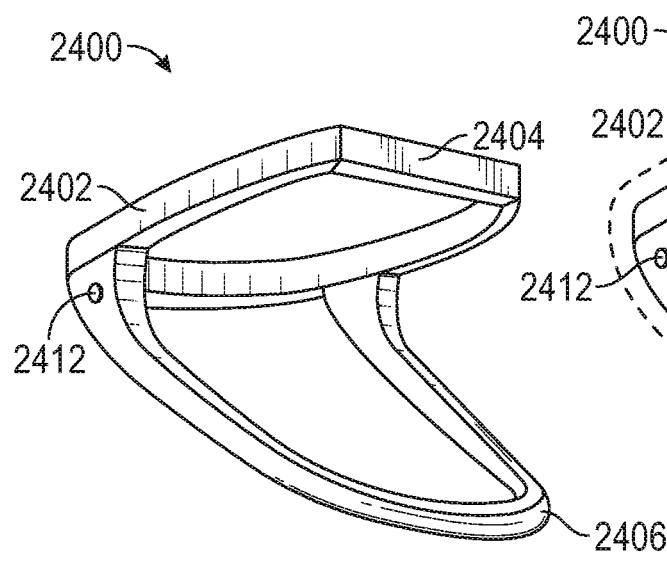
FIG. 28A illustrates a perspective view of a surgical helmet assembly according to another exemplary embodiment of the present disclosure.
Figure 28B:
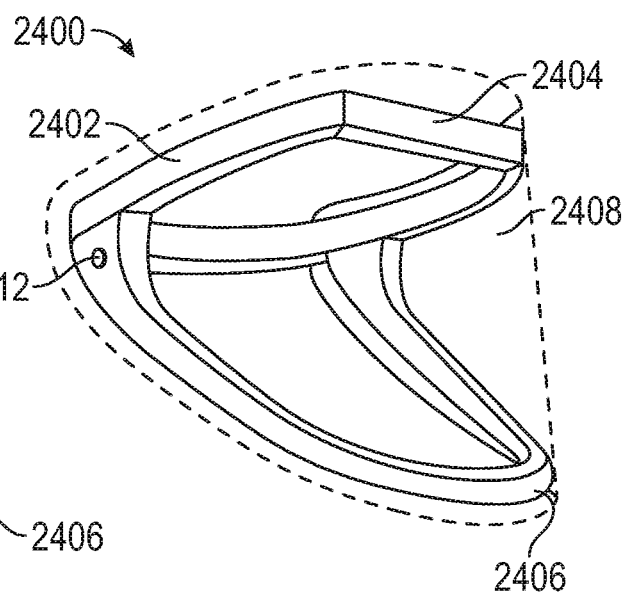
FIG. 28B illustrates a perspective view of the surgical helmet assembly of FIG. 28A with a face shield coupled thereto.

FIGS. 28A-28B illustrate another example of a surgical helmet assembly 2400 comprising a helmet enclosure 2402 positionable on the head of a user so as to surround areas of the user's head and a flexible shield 2408 coupleable to the helmet enclosure 2402. The helmet enclosure 2402 can include a brow bar portion 2404 positionable about the brow of a user and, optionally, a chin bar portion 2406 positionable about the chin of a user. The flexible shield 2408 can be coupleable to the helmet enclosure 2402, at least in part, by fasteners 2412 such as, for example and without limitation, a mechanical fastener, an adhesive fastener, a magnetic fastener, and the like. Such fasteners 2412 can be positioned at one or more of the temple regions of the user, the brow bar portion 2404, and the chin bar portion 2406 of the helmet enclosure 2402. Additional attachment points may be provided by hook-and-loop fasteners, suction cups, snaps, push nuts, and the like as shown in FIGS. 27B-27C, for example. In one example, the fasteners 2412 located at the temple regions of the user can be coupleable to the shield 2408, for example and without limitation, shield by using corresponding hook-and-loop fasteners, snaps, push nuts, suction cups, adhesives, magnets, or the like, on the shield 2408. Additionally or alternatively, the temple regions of the face shield 2408 may include apertures to facilitate mechanical attachment of the face shield 2408 by using separate hardware to engage with the helmet enclosure 2402. For example, the helmet enclosure 2402 may include male protrusions for extending outwardly through the apertures disposed in the face shield 2408 that receive R-clips, threaded nuts, snap-fit nuts, or the like. Additionally or alternatively, the helmet enclosure 2402 may include female receptacles for receiving threaded bolts or snap-fit bolts extending inwardly through the apertures disposed in the face shield 2408.

Figure 29A:
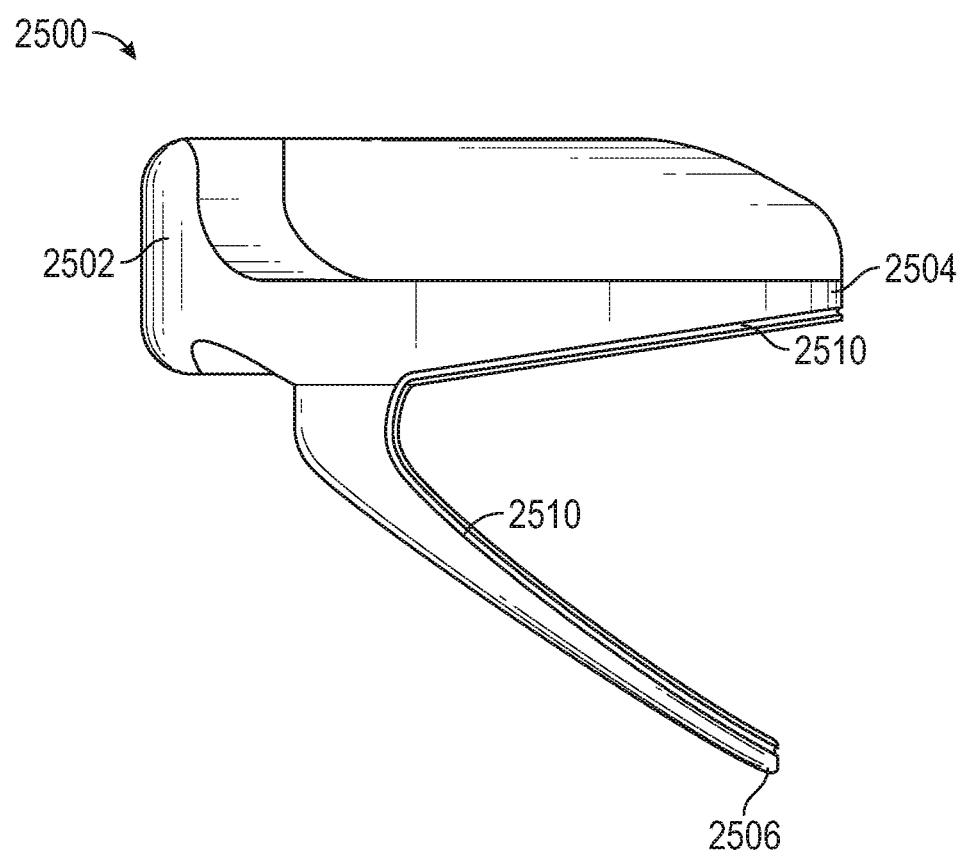
FIG. 29A illustrates a side view of a surgical helmet assembly according to another exemplary embodiment of the present disclosure.
Figure 29B:
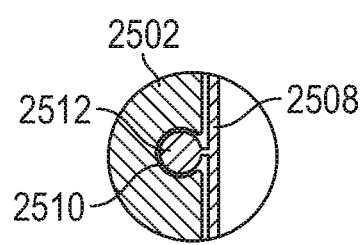
FIG. 29B is a side view of one exemplary attachment mechanism for the helmet and the face shield of the surgical helmet assembly of FIG. 27A.

FIGS. 29A-29B illustrate another example of a surgical helmet assembly 2500 comprising a helmet enclosure 2502 positionable on the head of a user so as to surround areas of the user's head and a face shield 2508 coupleable to the helmet enclosure 2502. The helmet enclosure 2502 can include a brow bar portion 2504 positionable about the brow of a user and, optionally, a chin bar portion 2506 positionable about the chin of a user. A recessed channel 2510 can circumscribe all or a portion of either or both of the brow bar portion 2504 and the chin bar portion 2506. A bead 2512 disposed on a protective garment 2508 can be inserted or press fit into the recessed channel 2510 to secure the protective garment 2508 to the helmet enclosure 2502. The bead 2512 can be a plurality of beads or can be an extruded bead. The bead 2512 can be attached directly to or can be integral with the face shield 2508, which in turn may be integral with or attached to a protective garment, or the bead 2512 can be attached directly to the fabric of the protective garment that surrounds the face shield 2508. The channel 2510 may be large enough such that the bead 2512 and face shield 2508 can be adjusted when the bead 2512 is within the channel 2510.

Figure 30C:
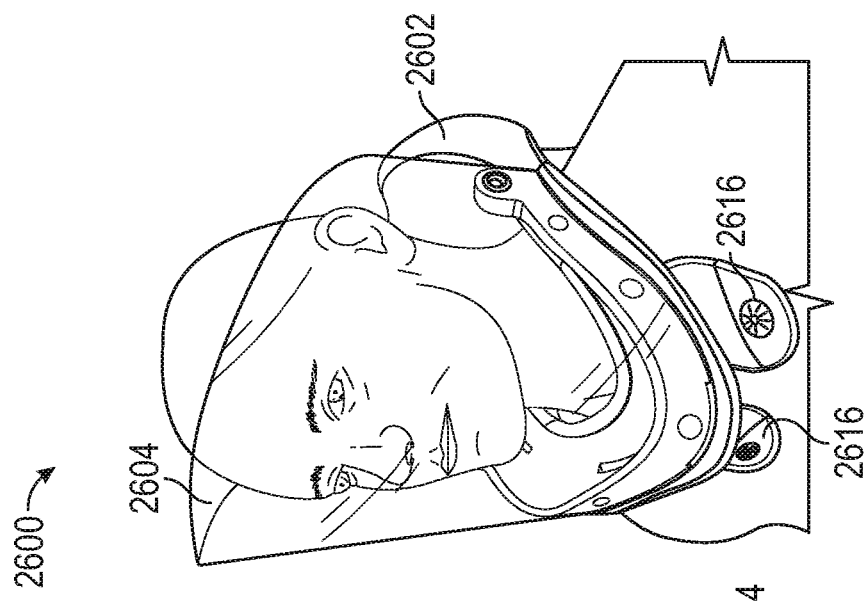
FIG. 30C is a perspective front view of the surgical helmet assembly of FIG. 30A.
Figure 30B:
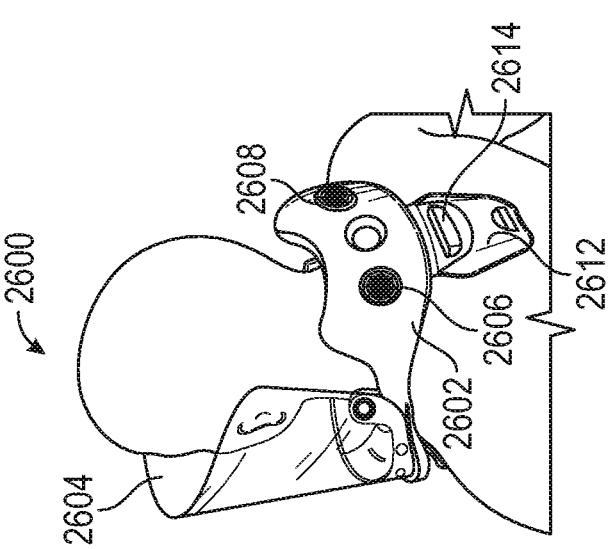
FIG. 30B is a perspective rear view of the surgical helmet assembly of FIG. 30A.
Figure 30A:
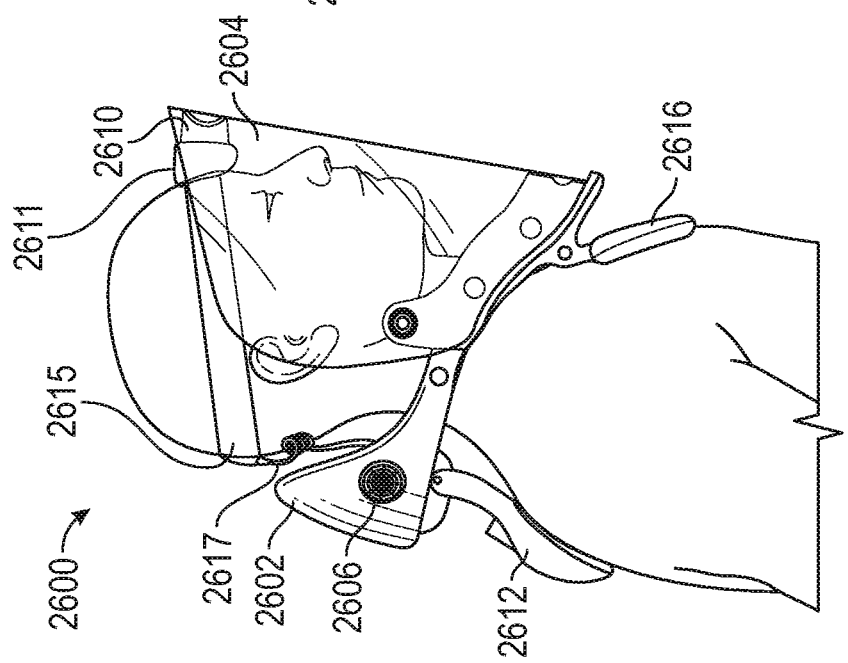
FIG. 30A is a side view of a surgical helmet assembly according to another exemplary embodiment of the present disclosure.
Figure 32:
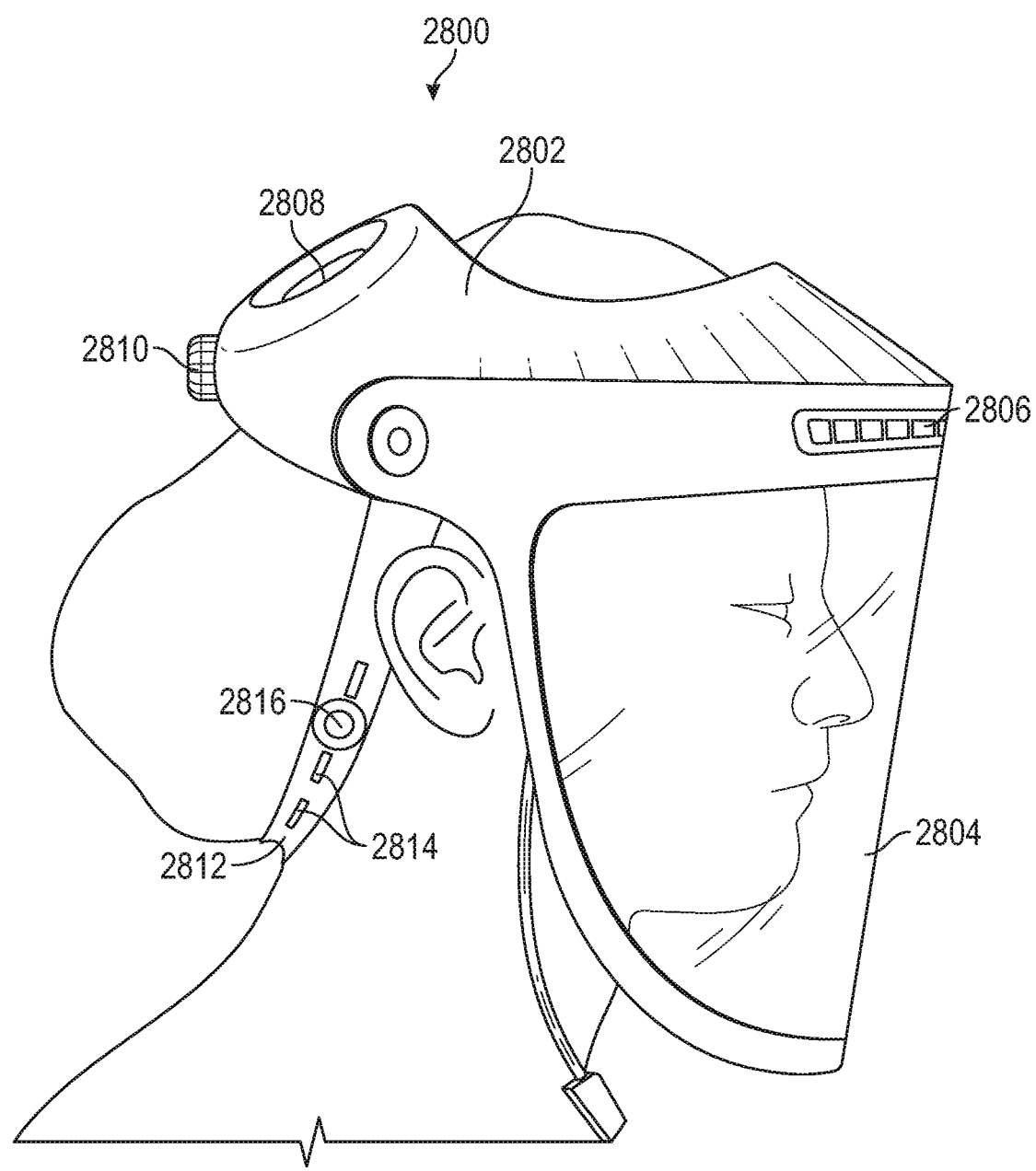
FIG. 32 illustrates a side view of a surgical helmet assembly according to another exemplary embodiment of the present disclosure.

FIGS. 30A-30C illustrate another example of a surgical helmet assembly 2600 comprising a shoulder harness 2602 positionable on the shoulders of a user and a face shield 2604 coupleable to the shoulder harness 2602. The shoulder harness 2602 can include an intake fan 2606 and an outtake fan 2608 and, additionally or alternatively, a lighting source 2610, such as an LED headlamp. One or more air outlets can be disposed in the shoulder harness 2602 and in communication with conduits extending through the shoulder harness 2602 in order to direct airflow to the face and back of the user. Lighting source 2610 can be electronically connected to the shoulder harness 2602 and power source 2612 via a flexible wire 2617. Alternatively, lighting source 2611 can be connected to shoulder harness 2602 via a wire that extends along a periphery of shield 2604, such as along a top and side of shield 2604, so as to keep the user's head unrestrained to the shoulder harness 2602. Lighting source 2610 can be connected to a headband 2615 that encircles the user's head. Alternatively, lighting source 2610 can be connected to shield 2604 and supported by shield 2604. Lighting source 2610 may comprise a head rest 2611 that is configured to rest on the user's forehead when the lighting source 2610 is worn. The headrest may be supported by the headband or the shield 2604, similar to the lighting source 2610. The shield 2604 can be coupleable to the shoulder harness 2602 and can extend upward to shield the face of a user. The shield 2604 can be coupled to a protective garment to cover at least the head and shoulders of the user in use. A power source enclosure 2612 can extend from the back of the shoulder harness 2602 and receive a power source 2614. One or more control extensions 2616 can extend from the front of the shoulder enclosure 2602 so that the controls can be located in the sterile field under the surgical helmet assembly 2600. As one skilled in the art will appreciate in light of the present disclosure, such a shoulder-mounted system can increase user comfort by offloading the weight of the surgical helmet assembly 2600 to the shoulders from the head.

FIGS. 31A-31D illustrate another example of a surgical helmet assembly 2700 comprising a helmet enclosure 2702 positionable on the head of a user so as to surround areas of the user's head and a face shield 2704 coupleable to the helmet enclosure 2702. The helmet enclosure 2702 can include a brow bar portion 2706 positionable about the brow of a user and, optionally, a chin bar portion 2708 extendable towards, or positionable about, the chin of a user. Chin bar portions 2708 can comprise vents 2709 in fluid communication with fan 2710. Electronically translatable vent closures can be electronically connected to controls 2716 to open or close vents 2709. The helmet enclosure 2702 can include a fan 2710 and, additionally or alternatively, a lighting source 2712, such as an LED headlamp. The shield 2706 can be coupleable to the helmet enclosure 2702 at both temple regions using connectors 2714 or along a portion of the brow bar portion 2706 and can extend downward to shield the face of a user. Connectors 2714 can be magnets or other connection mechanisms disclosed in reference to FIGS. 28A-B, numeral 2412. The shield 2704 can be coupled to a protective garment to cover at least the head and shoulders of the user in use. An enclosure 2714 can extend the airflow to the user's back to add comfort while in use with a surgical gown. One or more control 2716 can extend from the helmet enclosure 2702 towards the front of the user so that the controls can be located in the sterile field under the surgical helmet assembly 2700. The control 2716 can be integrated into a power cord or can be incorporated into a pendant and maintained in the sterile field of the surgical helmet assembly 2700 during use. Controls 2716 can control a brightness and/or focus of lighting source 2712. Controls 2716 can also control an amount of airflow through vents 2709 by opening or closing off vents 2709.

Figure 34B:
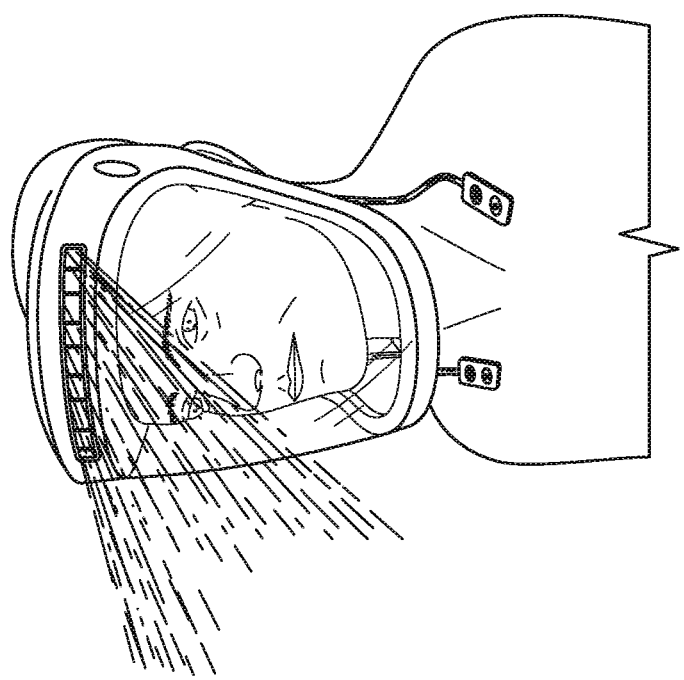
FIG. 34B illustrates another operational configuration of the surgical helmet assembly of FIG. 32.
Figure 34A:
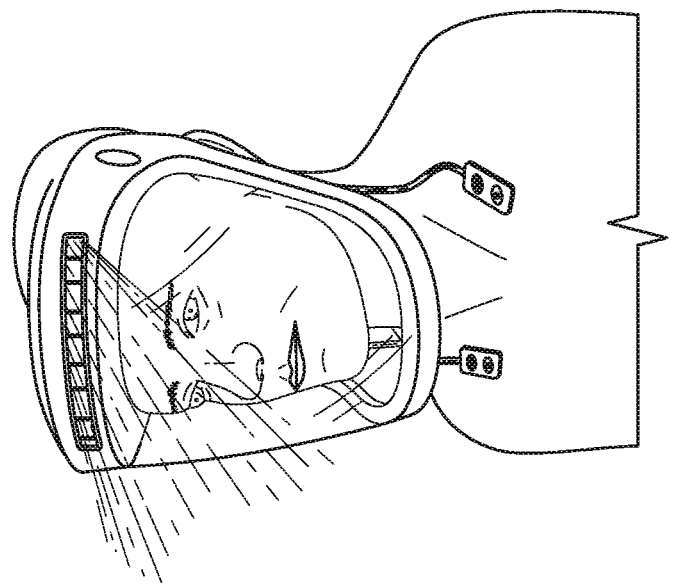
FIG. 34A illustrates one operational configuration of the surgical helmet assembly of FIG. 32.
Figure 35:
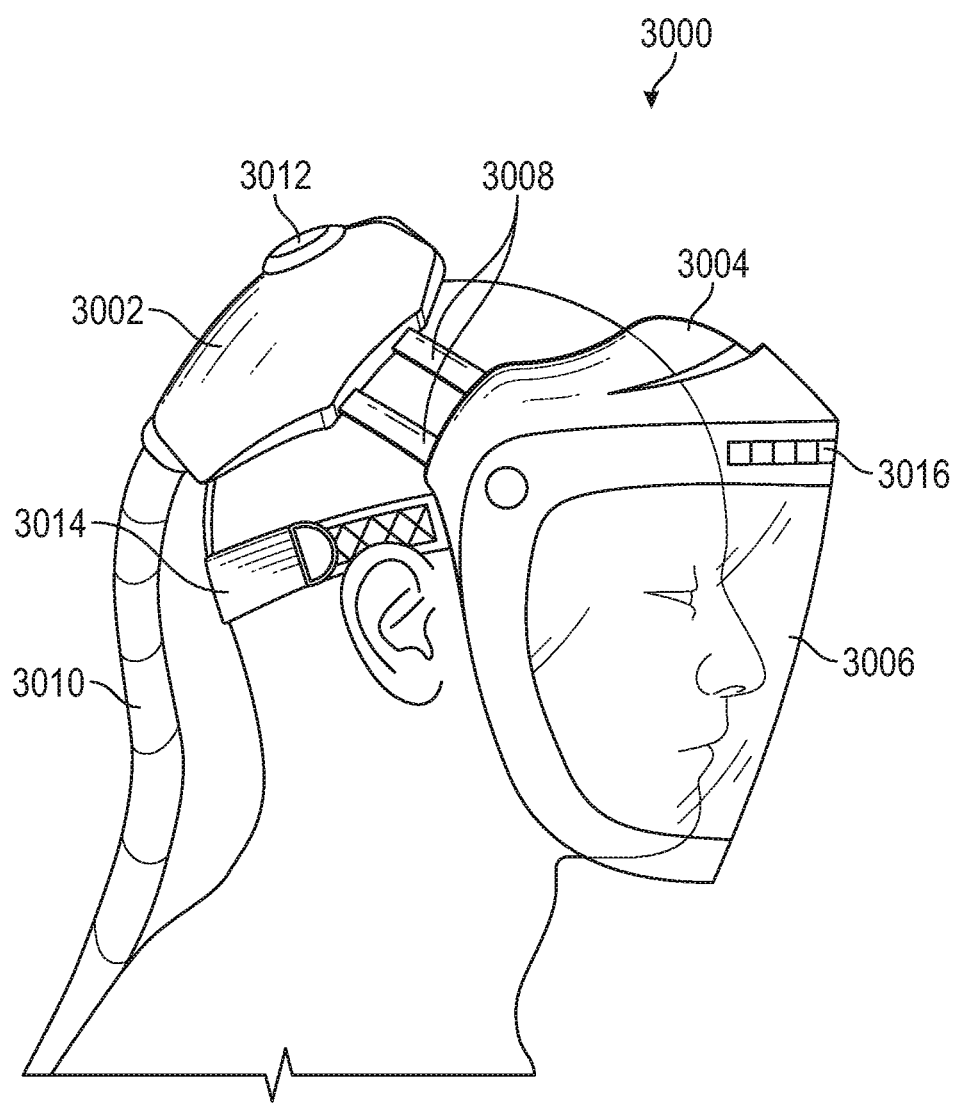
FIG. 35 illustrates a side view of a surgical helmet assembly according to another exemplary embodiment of the present disclosure.

FIGS. 32, 33A-33D, and 34A-34B illustrate another example of a surgical helmet assembly 2800 comprising a fan enclosure 2802 positionable on the head of a user so as to surround areas of the user's head and a face shield 2804 coupleable to the fan enclosure 2802. The fan enclosure 2802 includes a rigid body to support a surgical garment and the face shield 2804, a lighting source 2806, and a fan 2808. The fan enclosure 2802 can either be at least partially hollow or have channels disposed therein for flow of air or a location for electronic components. The fan enclosure 2802 can also include a cut out portion at the top of the head to, for example and without limitation, reduce the total weight or profile of the system and allow for more heat dissipation from the user's head. In any case, the fan enclosure 2802 can also include apertures disposed therein that direct airflow generated by the fan 2808 to a user. The fan 2808 can comprise a conformal fan having curved blades to minimize the profile of the fan enclosure 2802. The fan 2808 can also have blades including features to reduce fan noise such as, for example and without limitation, ridges and the like. The surgical helmet assembly 2800 can also comprise an adjustable system 2810 for conforming to the head of a user that can include a knob operable to selectively adjust and release the adjustable system 2810. Additionally or alternatively, the surgical helmet assembly 2800 can include a flexible elastic strap 2812 for securement to the head of a user that can be easily maneuvered around the hair of a user. The flexible elastic strap 2812 can include a plurality of holes 2814 disposed therein for selectively receiving a fastener 2816 to accommodate the head of the user. The fan enclosure 2802 can comprise a brow bar portion 2812 that can have the light source 2806 disposed on or integrated therein. The light source 2806 can comprise an LED bar. The face shield 2804 can be coupleable to the fan enclosure 2802 via, for example and without limitation, quick connect fasteners and the like. The face shield 2804 can be coupleable to the fan enclosure 2802 from left to right or right to left. FIG. 33A illustrates a perspective front view of the surgical helmet assembly 2800 without a surgical garment and FIG. 33B includes shaded regions on the body of the user to indicate airflow. FIG. 33C illustrates the face shield 2804 can be coupleable to the fan enclosure 2802 from left to right or right to left. FIG. 33D illustrates the surgical helmet assembly including a surgical garment 2814. One or more control pendants 2818 can extend from the fan enclosure 2802 towards the front of the user so that the controls can be located in the sterile field under the surgical helmet assembly 2800. FIGS. 34A and 34B illustrate pendants 2818 having an on/off control 2820 and an intensity control 2822. The intensity control can be, for example, activated once to turn on (FIG. 34A) and a second time to increase the intensity of the light source 2806 (FIG. 34B).

Figure 36C:
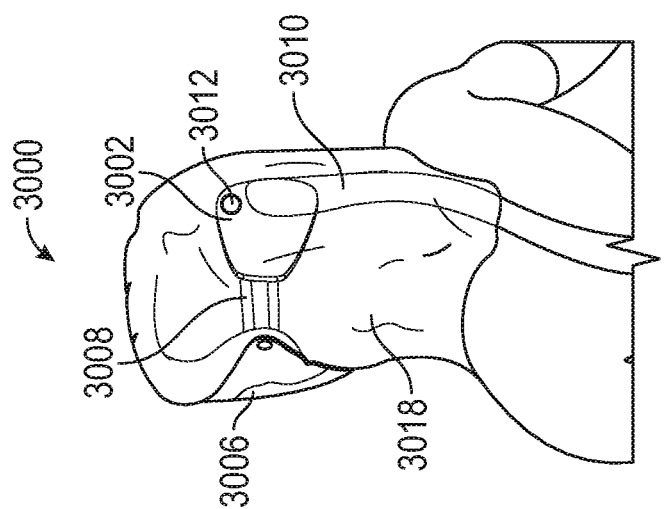
FIGS. 36A-36C illustrate exemplary steps in the donning process of the surgical helmet assembly of FIG. 35.
Figure 36B:
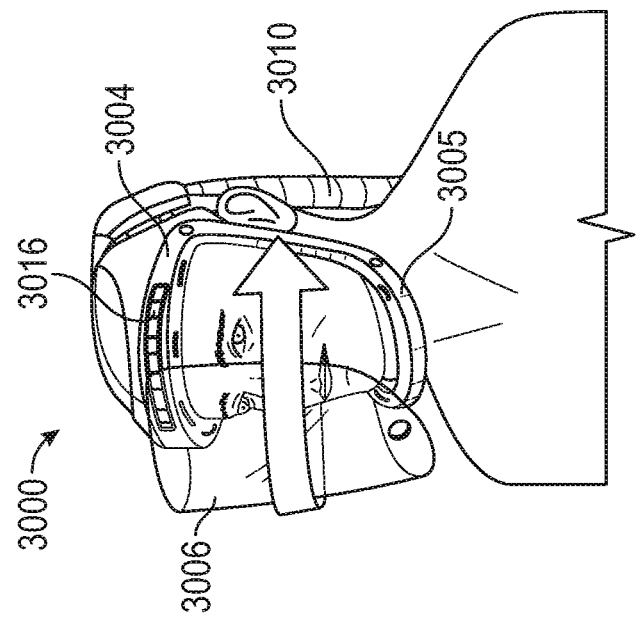
Figure 36A:
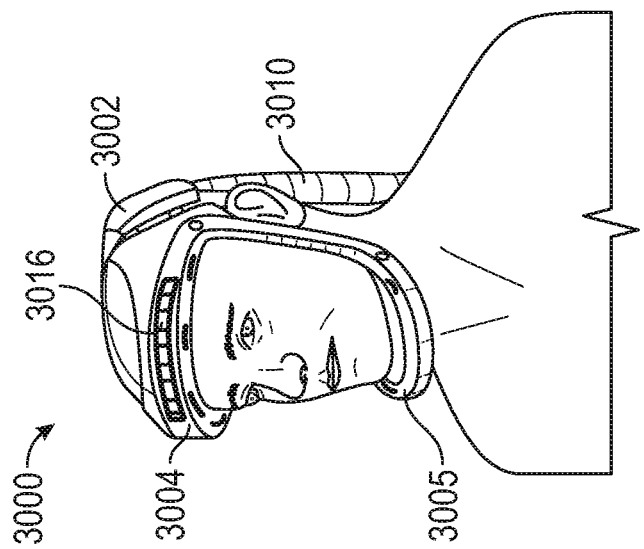
Figure 38:
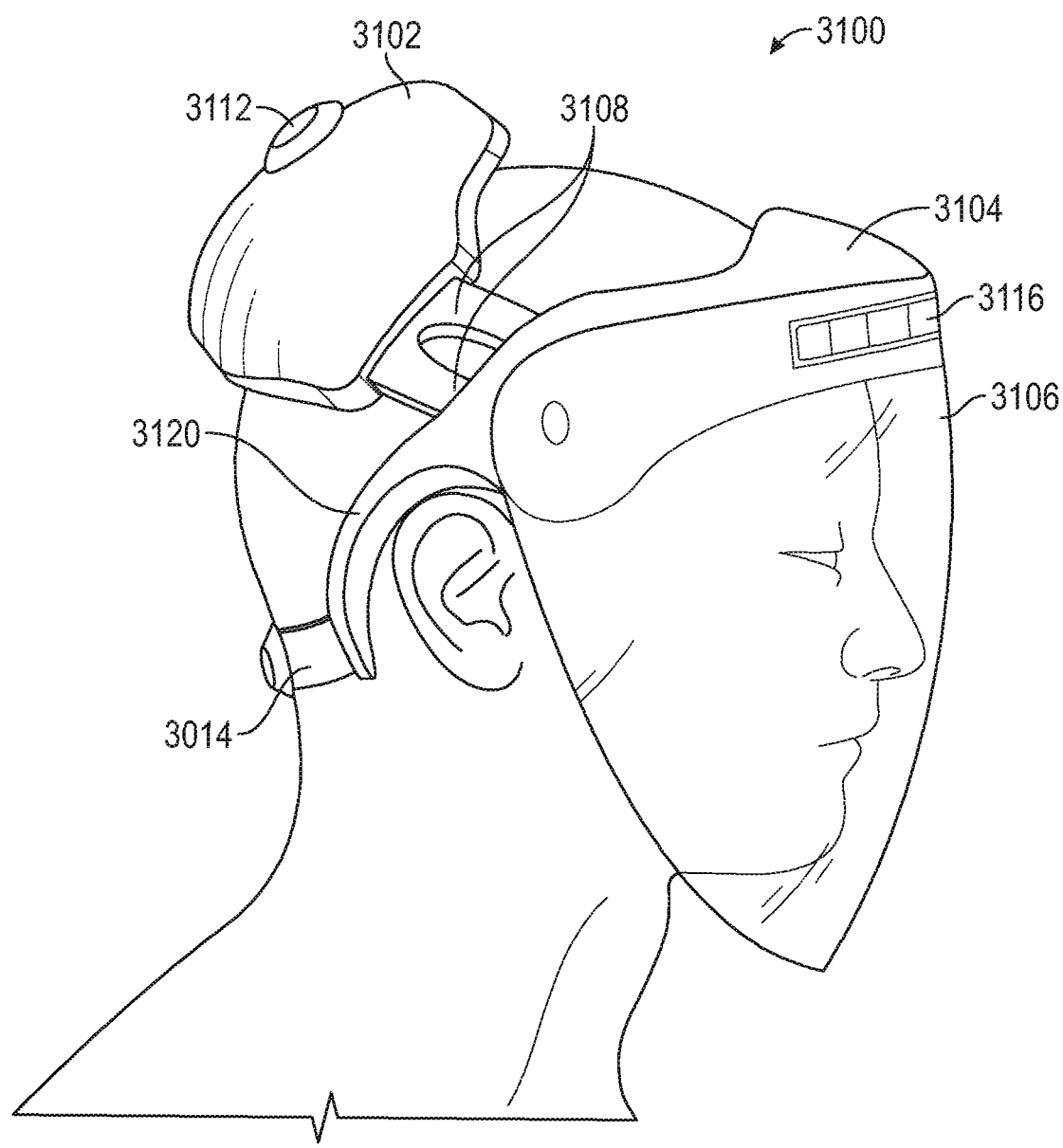
FIG. 38 illustrates a side view of a surgical helmet assembly according to another exemplary embodiment of the present disclosure.

FIGS. 35, 36A-36C, and 37A-37C illustrate another example of a surgical helmet assembly 3000 comprising a fan enclosure 3002 positionable on the head of a user, a brow bar portion 3004 positionable around a brow or forehead of a user, a chin bar portion 3005 extending from and continuous with the brow bar portion 3004 that is positionable around a chin of a user, a face shield 3006 coupleable to at least the brow bar portion 3004, and a surgical garment 3018 for covering at least the head and shoulders of a user. The fan enclosure 3002 includes a rigid housing containing a fan and air tubes 3008 physically and fluidically coupling the fan enclosure 3002 to the brow bar portion 3004. The fan enclosure 3002, the brow bar portion 3004, or the chin bar portion 3005 can also include foam that can reduce the noise generated by the fan. The brow bar portion 3004 can have apertures or vents disposed therein to direct airflow from the fan onto the user. The fan enclosure 3002 can also have a cooling tube 3010 coupled thereto and extending down the back of the user to cool the back of the user. The surgical helmet assembly 3000 can also comprise an adjustable system 3012 for conforming to the head of a user that can include a knob operable to selectively adjust and release the adjustable system 3000. The surgical helmet assembly 3000 can include a flexible elastic strap 3014 for secondary securement to the head of a user. The brow bar portion 3004 that can have a light source 3016 disposed on or integrated therein. The light source 3016 can comprise an LED bar. The face shield 3006 can be coupleable to the brow bar portion 3004 via, for example and without limitation, quick connect fasteners and the like. The face shield 3006 can be coupleable to the brow bar portion 3004 from left to right or right to left. The face shield 3006 can also have a fluid repelling coating applied thereto. FIG. 37A illustrates one exemplary air flow pattern for the surgical helmet assembly 3000 from the fan enclosure towards the brow bar portion 3004 and the chin bar portion 3005 and FIG. 37B illustrates one exemplary air flow pattern for the cooling tube 3010 to the back of the user. The underside of either the fan enclosure 3002 or the brow bar portion 3004 can be lined in a fabric 2020 such as, for example and without limitation, a moisture wicking fabric or a microbial fabric (e.g., a silver-impregnated antimicrobial fabric). FIGS. 36A-36C illustrate exemplary steps in the donning process of the surgical helmet assembly 3000.

Figure 39C:
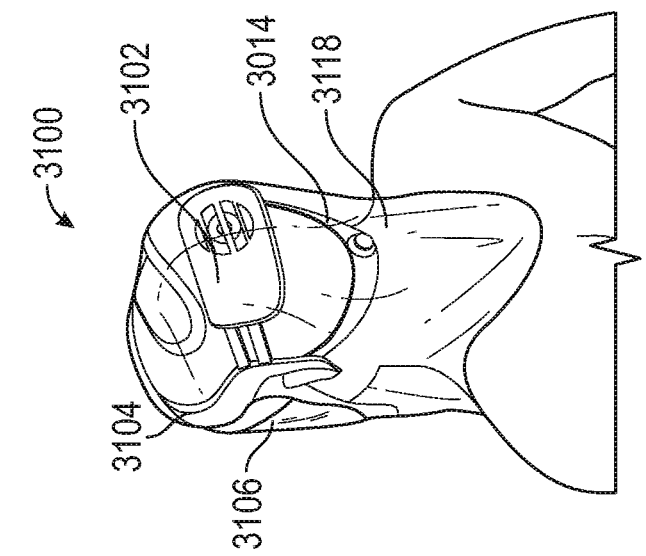
FIGS. 39A-39C illustrate exemplary steps in the donning process of the surgical helmet assembly of FIG. 38.
Figure 39B:
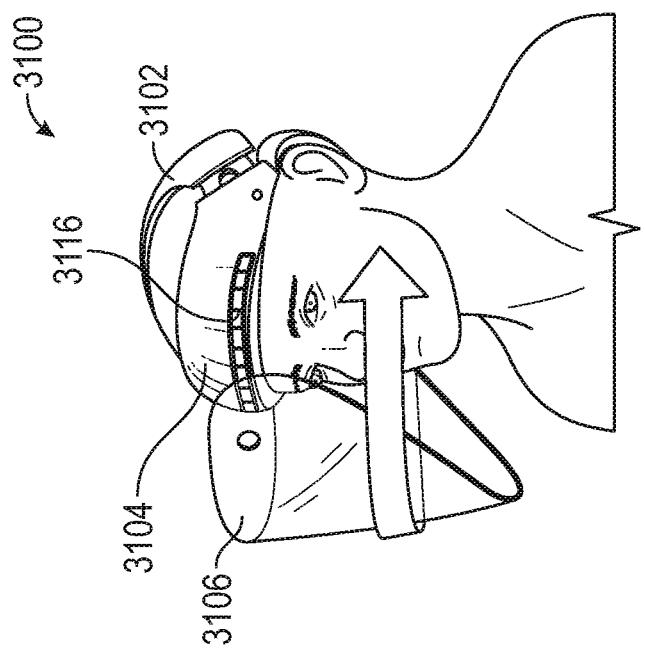
Figure 39A:
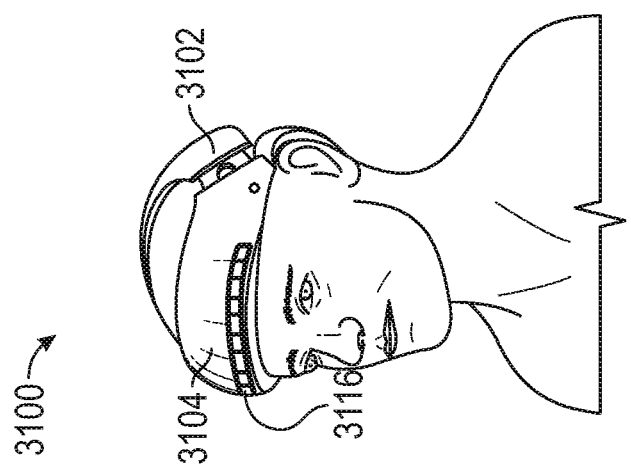
Figure 40B:
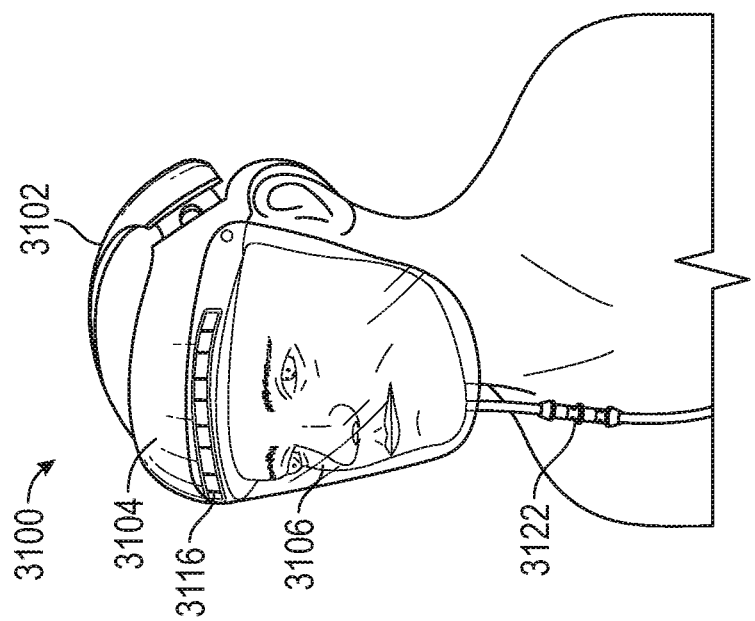
FIG. 40B illustrates a front perspective view of the surgical helmet assembly of FIG. 38.
Figure 40A:
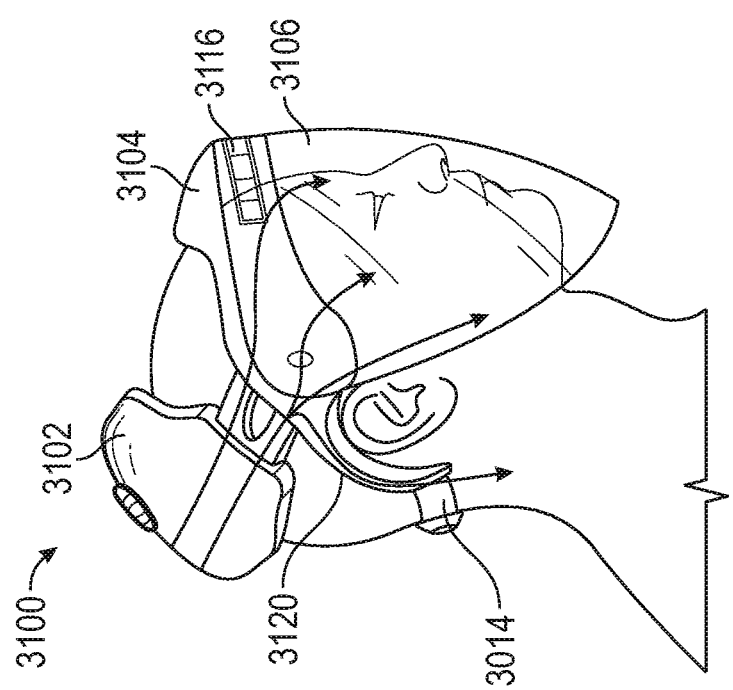
FIG. 40A is side view of the surgical helmet assembly of FIG. 38 showing airflow therein.
Figure 41:
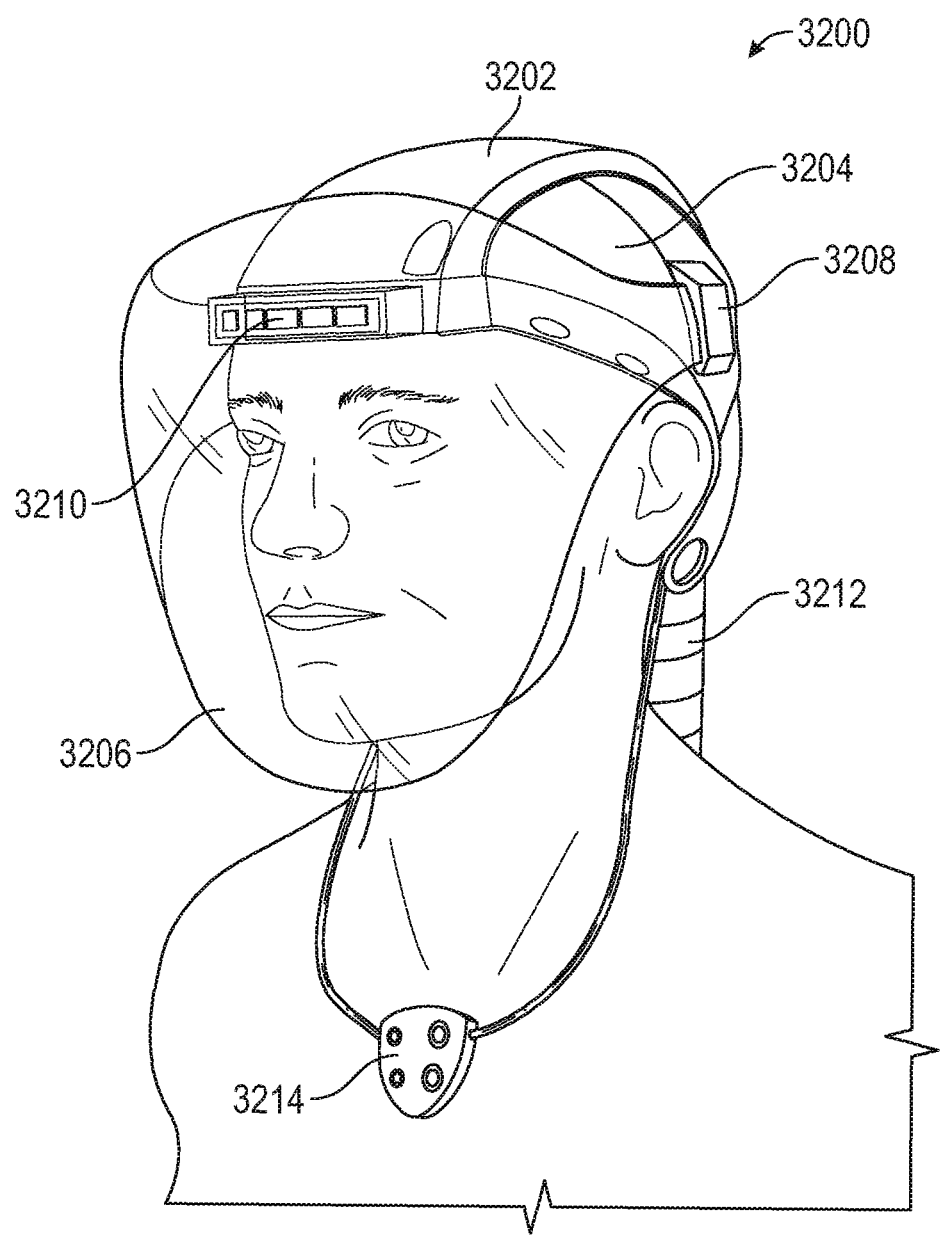
FIG. 41 illustrates a side view of a surgical helmet assembly according to another exemplary embodiment of the present disclosure.

FIGS. 38, 39A-39C, and 40A-40B illustrate another example of a surgical helmet assembly 3100 comprising a fan enclosure 3102 positionable on the head of a user, a brow bar portion 3104 positionable around a brow or forehead of a user, a face shield 3106 coupleable to the brow bar portion 3104, and a surgical garment 3118 for covering at least the head and shoulders of a user. The fan enclosure 3102 includes a rigid housing containing a fan and air tubes 3108 physically and fluidically coupling the fan enclosure 3102 to the brow bar portion 3104. The fan enclosure 3102 or the brow bar portion 3104 can also include foam that can reduce the noise generated by the fan. The brow bar portion 3104 can have apertures or vents disposed therein to direct airflow from the fan onto the user. The brow bar portion 3104 can have a relatively large area for face shield 3106 contact and securement to enable the face shield 3106 to maintain a proper contour without needing securement to a chin bar. The brow bar portion 3104 can also have ear guards 3122 extending away from the opposite ends thereof that can be contoured to wrap around the back side of a user's ears. The ear guards 3120 can help redirect sound away from the user's ears, thereby reducing fan noise. The surgical helmet assembly 3100 can also comprise an adjustable system 3112 for conforming to the head of a user that can include a knob operable to selectively adjust and release the adjustable system 3100. The surgical helmet assembly 3100 can include a flexible elastic strap 3114 for secondary securement to the head of a user. The brow bar portion 3104 that can have a light source 3116 disposed on or integrated therein. The light source 3116 can comprise an LED bar. The face shield 3106 can be coupleable to the brow bar portion 3104 via, for example and without limitation, quick connect fasteners and the like. The face shield 3106 can be coupleable to the brow bar portion 3104 from left to right or right to left. The face shield 3106 can also have a fluid repelling coating applied thereto. FIG. 40A illustrates one exemplary air flow pattern for the surgical helmet assembly 3100 from the fan enclosure towards the brow bar portion 3104. The underside of either the fan enclosure 3102 or the brow bar portion 3104 can be lined in a fabric such as, for example and without limitation, a moisture wicking fabric or a microbial fabric (e.g., a silver-impregnated antimicrobial fabric). One or more control pendants 3122 can extend from the helmet enclosure 3104 towards the front of the user so that the controls can be located in the sterile field under the surgical helmet assembly 3100. FIGS. 39A-39C illustrate exemplary steps in a donning process for the surgical helmet assembly 3100.

Figure 42C:
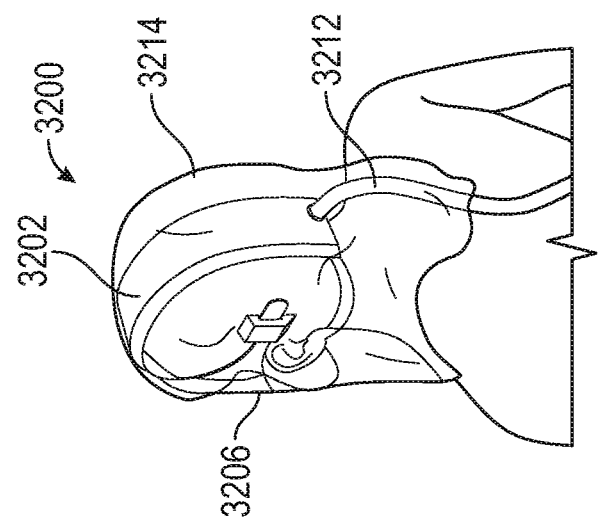
FIGS. 42A-42C illustrate exemplary steps in the donning process of the surgical helmet assembly of FIG. 41.
Figure 42B:
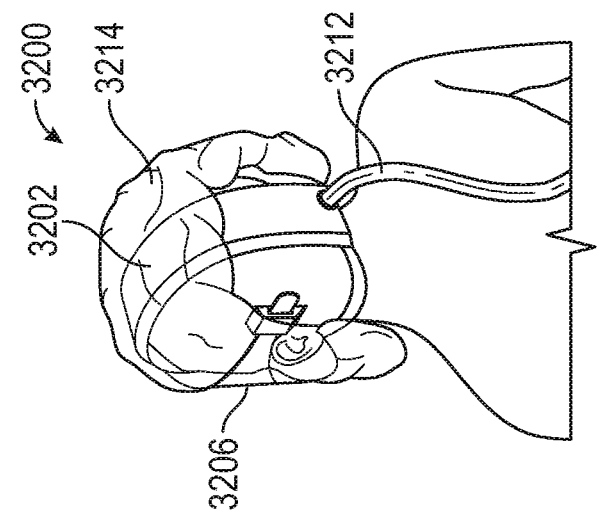
Figure 42A:
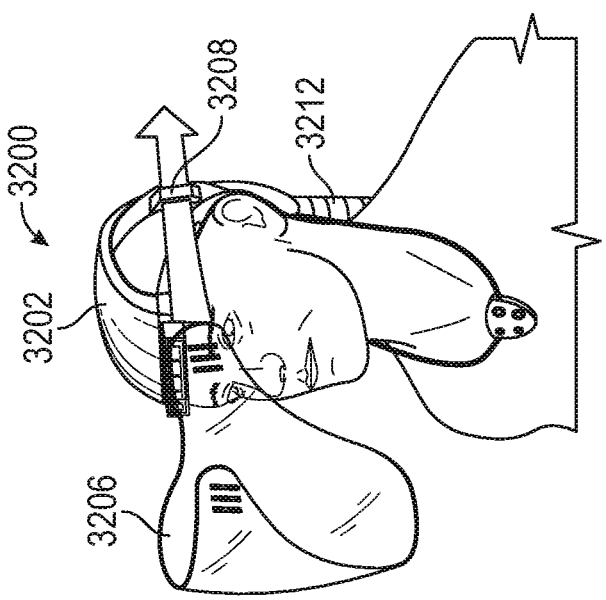
Figure 44:
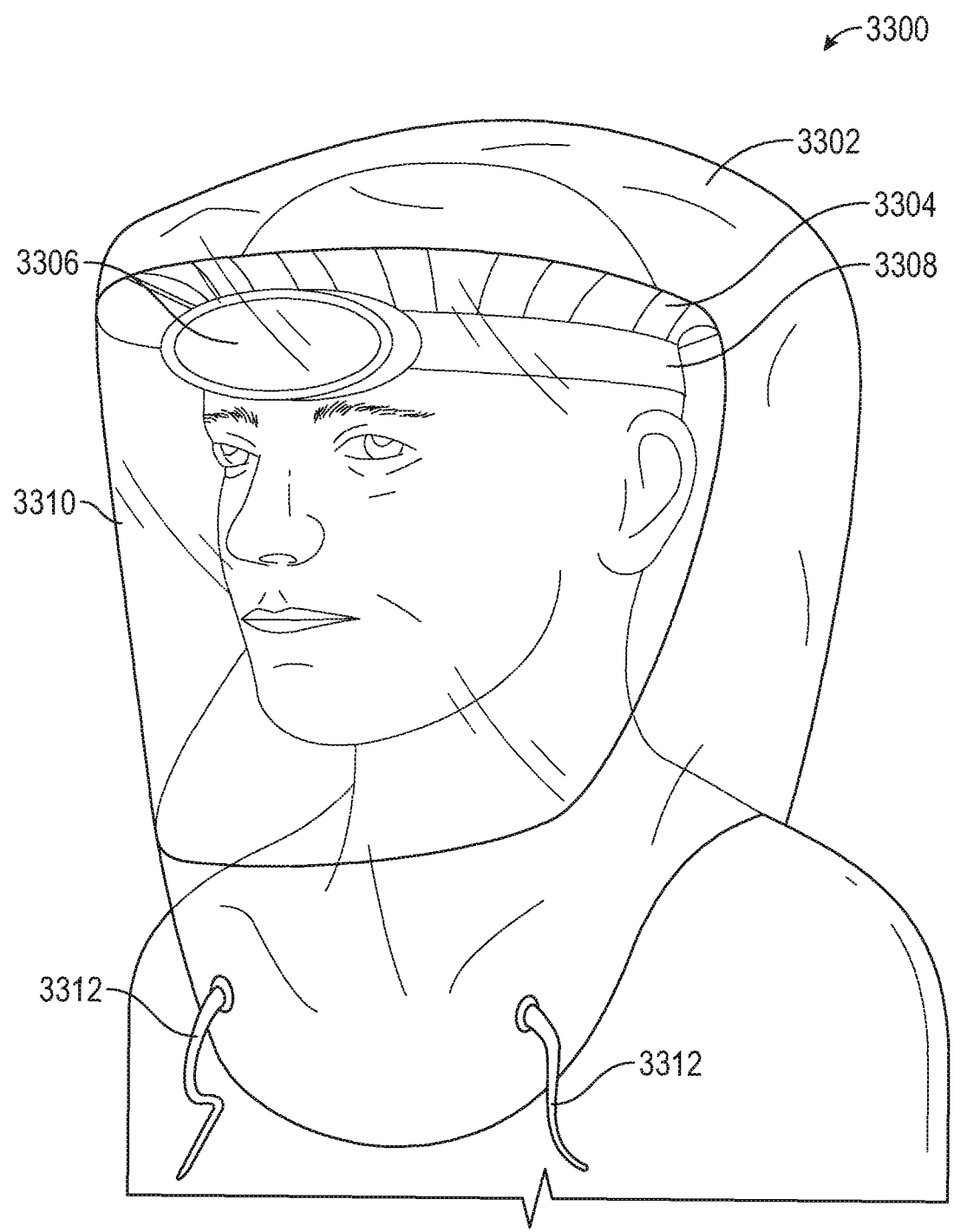
FIG. 44 illustrates a side view of a surgical helmet assembly according to another exemplary embodiment of the present disclosure.

FIGS. 41, 42A-42C, and 43A-43C illustrate another example of a surgical helmet assembly 3200 comprising a head enclosure 3202 positionable on the head of a user, a lighting source 3210 positionable proximate a brow or forehead of a user, a face shield 3206 coupleable to the head enclosure 3202, and a surgical garment 3214 for covering at least the head and shoulders of a user. The head enclosure 3202 contains conduits and apertures to facilitate airflow distribution to the user from an airflow source. The head enclosure 3202 can be coupled to a cap 3204, such as a flexible, moisture wicking, conformable fabric cap and can extend around the head of a user from the user's forehead towards the base of the user's skull. The face shield 3206 can be coupleable to the head enclosure 3202 via shield attachment features 3208 provided on either side of the head enclosure 3202. The shield attachment features 3208 can be positionable above or behind the user's ears when the user when the head enclosure 3208 is positioned on the user's head. The shield attachment features 3208 can comprise, for example and without limitation, quick connect fasteners and the like. The face shield 3106 can also have a fluid repelling coating applied thereto. The light source 3116 can comprise an LED bar. One or more control pendants 3214 can extend from the head enclosure 3202 towards the front of the user so that the controls can be located in the sterile field under the surgical helmet assembly 3200. Furthermore, a fan enclosure 3216 can be coupled to the head enclosure 3202 via tubing 3212 and, as illustrated in FIG. 43C, worn on a belt positioned around the waist of the user. In this way, the weight of the fan can be offloaded to a user's waist, allowing for reductions in the size and cost of the head enclosure 3202 over such designs incorporating a fan into the head enclosure. FIGS. 42A-42C illustrate exemplary steps in a donning process for the surgical helmet assembly 3200, while FIG. 43B illustrates exemplary airflow for the surgical helmet assembly 3200.

Figure 45:
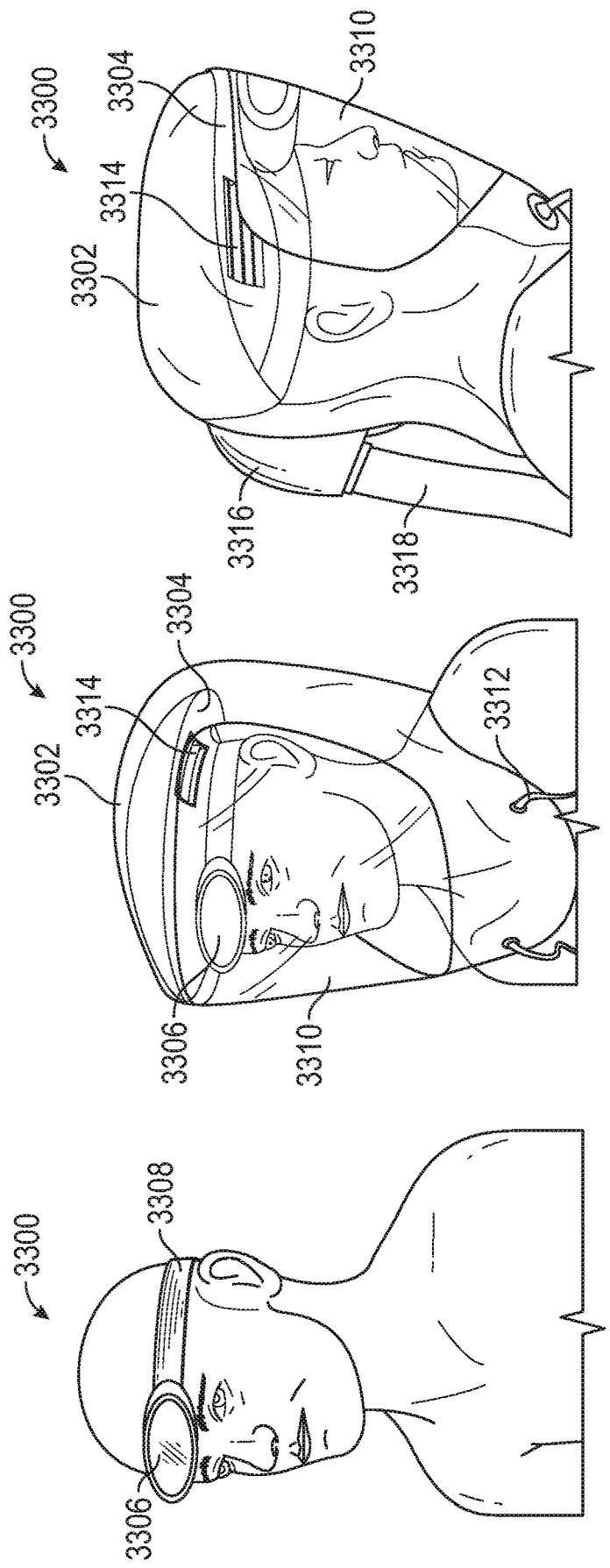
FIGS. 45A-45C illustrate exemplary steps in the donning process of the surgical helmet assembly of FIG. 44.
Figure 46:
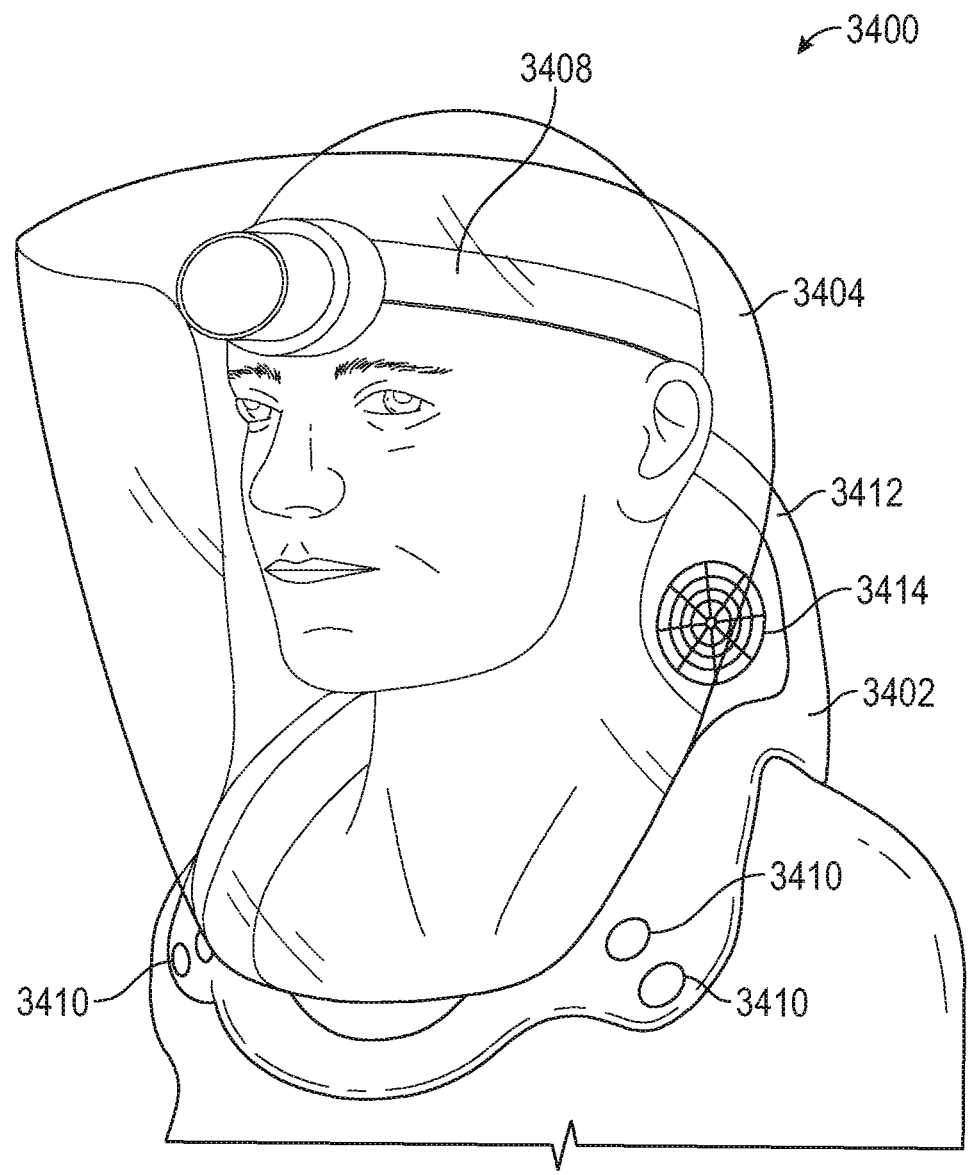
FIG. 46 illustrates a side view of a surgical helmet assembly according to another exemplary embodiment of the present disclosure.

FIGS. 44, and 45A-45C illustrate another example of a surgical helmet assembly 3300 comprising an integrated disposable or single-use helmet structure 3304 and an integrated face shield 3310, a lighting source 3306 positionable proximate a brow or forehead of a user. The hood structure 3302 can include a surgical garment 3302 for covering at least the head and shoulders of a user. The surgical garment 3302 can have ties 3312 for tightening the surgical garment around the neck of a user. The surgical helmet assembly 3300 can have a port 3316 or aperture disposed therein for coupling a tube 3316 thereto. The tube 3316 can be coupled to an air supply on an opposite end, such as the fan enclosure depicted above in FIG. 43C. The surgical helmet assembly 3300 can provide a seamless, disposable system to increase cleanliness. The lighting source 3306 can comprise a separate component securable about the user's head via a headband 3308 and can be an LED headlamp. The lighting source 3306 can be positionable under the integrated helmet structure 3304, integrated face shield 3310, and surgical garment 3302. The integrated helmet structure 3304 can include apertures or vents 3314 disposed therein for directing airflow onto a user. FIGS. 45A-45C illustrate exemplary steps in a donning process for the surgical helmet assembly 3300.

FIGS. 46, 47A-47D, 48, 49, and 50 illustrate another example of a surgical helmet assembly 3400 comprising a shoulder enclosure 3402 positionable on the shoulders of a user and a face shield 3404 coupleable to the shoulder enclosure 3402. The shoulder enclosure 3402 can include an intake fan 3414 and an outtake fan 3415 positioned on an upwardly extending fan housing 3412 at a rear portion of the shoulder enclosure 3402. The surgical helmet assembly 3400 can include a lighting source 3406, such as an LED headlamp. The lighting source 3406 can be separately securable about the head of the user via a band 3408. The shield 3404 can be coupleable to the shoulder enclosure 3402 and can extend upward to shield the face of a user. The shield 3404 can be coupled to a protective garment to cover at least the head and shoulders of the user in use as illustrated in FIG. 47D. A power cord 3420 can extend from the back of the shoulder harness and receive a power source at an opposite end thereof. One or more control extensions 3410 can extend from the front of the shoulder enclosure 3402 so that the controls can be located in the sterile field under the surgical helmet assembly 3400. As one skilled in the art will appreciate in light of the present disclosure, such a shoulder mounted system can increase user comfort by offloading the weight of the surgical helmet assembly 3400 to the shoulders from the head. FIGS. 47A-47D illustrate an exemplary donning process for the surgical helmet assembly 3400, FIGS. 48 and 49 illustrate exemplary air flow patterns for the surgical helmet assembly 3400, and FIG. 50 illustrates exemplary placement of the intake fan 3414 and the outtake fan 3415.

Figure 51B:
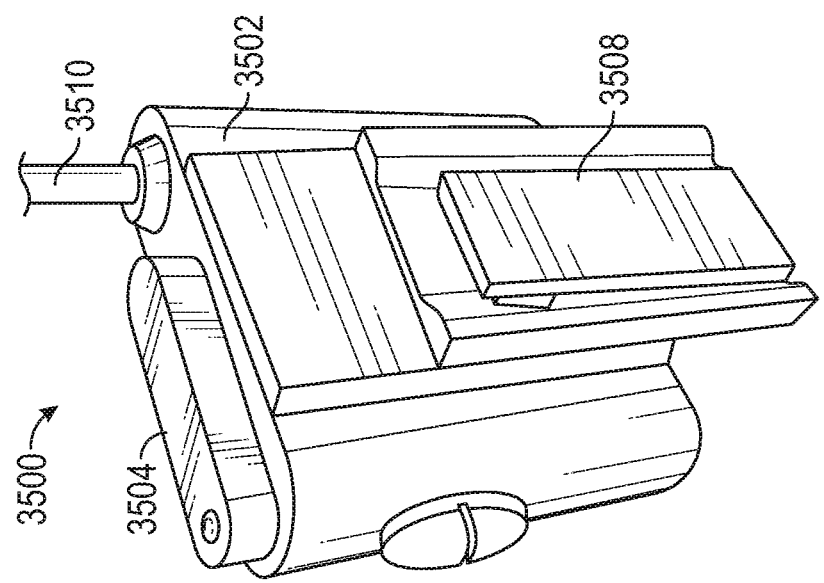
FIG. 51B is a rear perspective view of the battery holster of FIG. 51A.
Figure 51A:
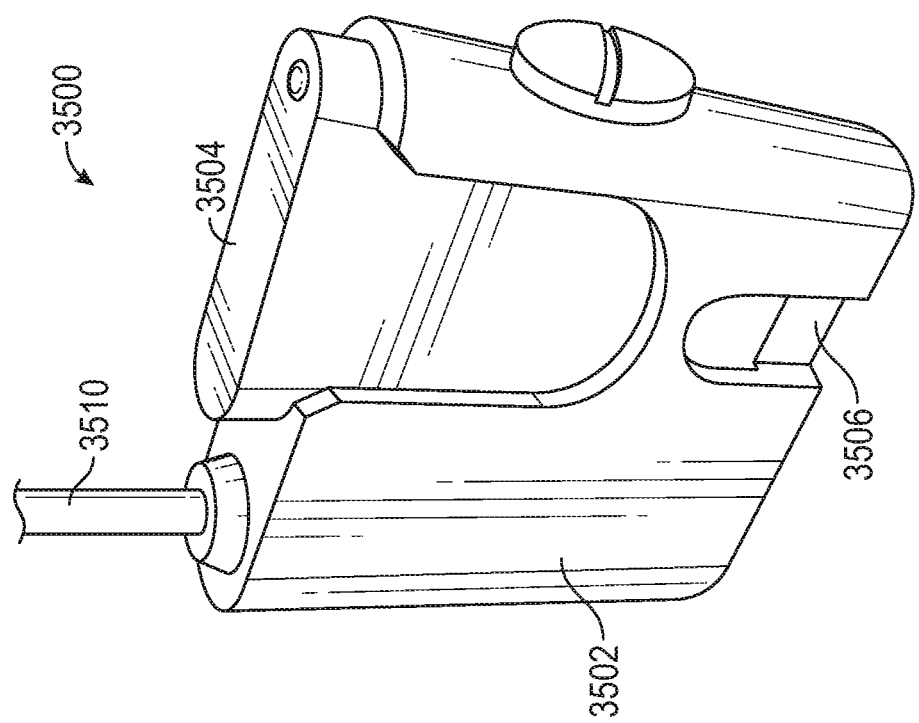
FIG. 51A is a front perspective view of a battery holster according to one exemplary embodiment of the present disclosure.

FIGS. 51A-51B illustrate one exemplary battery holster 3500. The battery holster 3500 can include a housing 3502 for receiving a battery 3504 and can include a finger slot 3506 in the housing 3502 for facilitating removal of the battery. A rear surface of the housing 3502 can include a holster clip 3508 for securing the battery 3504 to a holster worn by the user or integrated into the surgical helmet assembly. A power cable 3510 can extend from the top of the housing 3502 in an upward direction and can be coupleable to the surgical helmet assembly to supply power thereto.

FIGS. 52A-52B illustrate another exemplary battery holster 3600. The battery holster 3600 can include a housing 3602 for receiving a battery 3604 and can include a finger slot 3606 in the housing 3602 for facilitating removal of the battery. A rear surface of the housing 3602 can include a holster clip 3608 for securing the battery 3604 to a holster worn by the user or integrated into the surgical helmet assembly. A power cable 3610 can extend from the side of the housing 3602 in a lateral direction and can be coupleable to the surgical helmet assembly to supply power thereto.

Figure 53B:
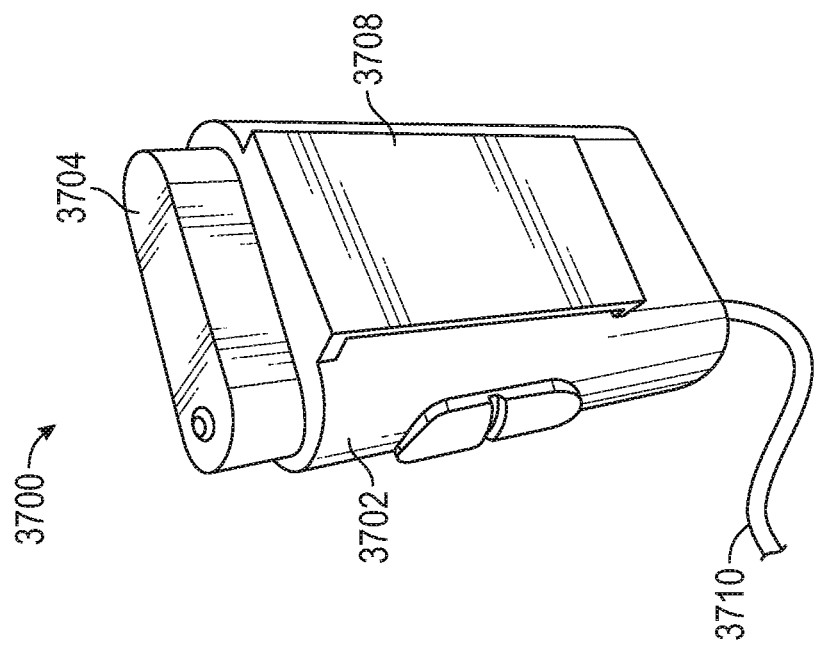
FIG. 53B is a rear perspective view of the battery holster of FIG. 53A.
Figure 53A:
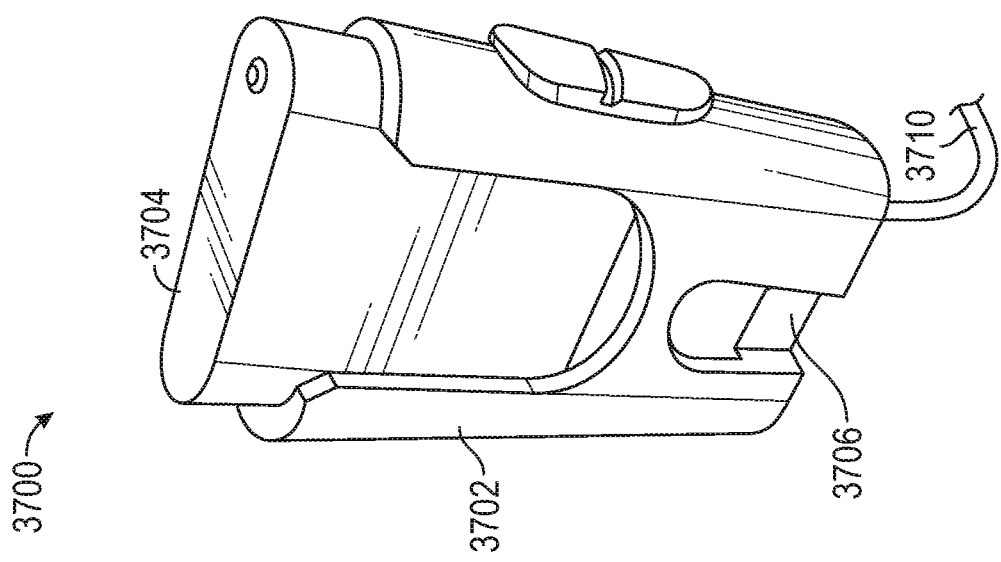
FIG. 53A is a front perspective view of a battery holster according to one exemplary embodiment of the present disclosure.

FIGS. 53A-53B illustrate another exemplary battery holster 3700. The battery holster 3700 can include a housing 3702 for receiving a battery 3704 and can include a finger slot 3706 in the housing 3702 for facilitating removal of the battery. A rear surface of the housing 3702 can include a holster clip 3708 for securing the battery 3704 to a holster worn by the user or integrated into the surgical helmet assembly. A power cable 3710 can extend from the bottom of the housing 3702 in a downward direction and can be coupleable to the surgical helmet assembly to supply power thereto.

FIGS. 54A-54D illustrate another example of a surgical helmet assembly 3800 comprising a helmet enclosure 3802 positionable on the head of a user, a brow bar portion 3804 positionable around a brow or forehead of a user, a face shield 3806 coupleable to at least the brow bar portion 3804, and a surgical garment 3808 for covering at least the head and shoulders of a user in use. The brow bar portion 3804 can have apertures or vents disposed therein to direct airflow pushed through the helmet enclosure 3802 from the fan onto the user. The brow bar portion 3804 can have a relatively large area for face shield 3806 contact and securement to enable the face shield 3806 to maintain a proper contour without needing securement to a chin bar. The brow bar portion 3804 can also have stabilizers or ear guards 3822 extending away from the opposite ends thereof to extend downward in front of the user's ears. The ear guards 3822 can help redirect sound away from the user's ears, thereby reducing fan noise. The surgical helmet assembly 3800 can also comprise an adjustable system 3812 for conforming to the head of a user that can include a knob operable to selectively adjust and release the adjustable system 3800. The brow bar portion 3804 that can have a light source 3816 disposed on or integrated therein. The light source 3816 can comprise an LED bar. The face shield 3806 can be coupleable to the brow bar portion 3804 via, for example and without limitation, quick connect fasteners, hook and loop fasteners, a post protruding from the brow bar portion 3804, and the like. The face shield 3806 can be coupleable to the brow bar portion 3804 from left to right or right to left. The face shield 3806 can also have a fluid repelling coating applied thereto.

Figure 55A:
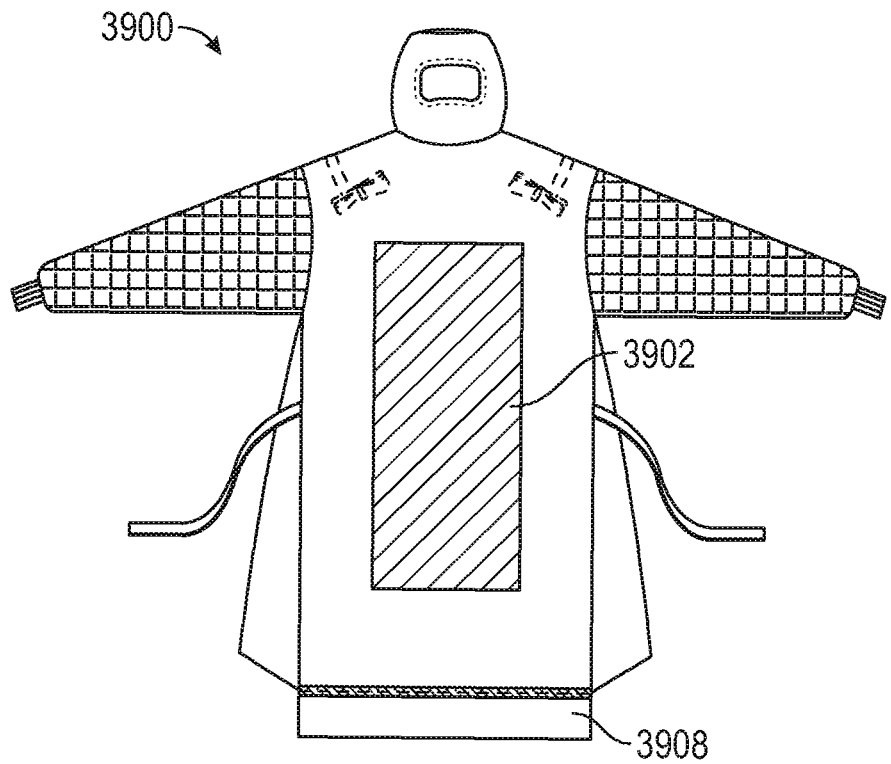
FIG. 55A illustrates a front view of a surgical garment according to one exemplary embodiment of the present disclosure.
Figure 55B:
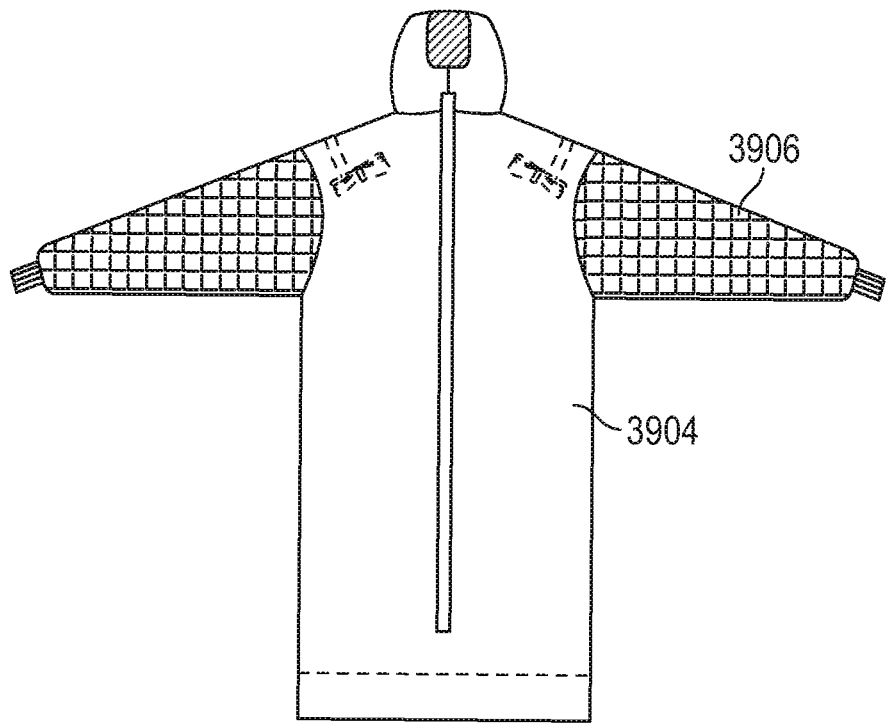
FIG. 55B illustrates the back view of the surgical garment of FIG. 55A.

As illustrated in FIGS. 55A and 55B, another embodiment of the present disclosure includes a toga or surgical garment 3900. The surgical garment 3900 can include impermeable Association for the Advancement of Medical Instrumentation (AAMI) level 4 poly-reinforced fabric 3902 in the critical areas (potentially high contact with medical waste), breathable AAMI level 2 fabric 3904 in the non-critical areas where contact with medical waste is less likely, and breathable sleeves having a non-slip film 3906 applied thereto. A perforated section 3908 at the bottom of the surgical garment 3900 to allow users to vary the length of the surgical garment to ensure proper fit. The surgical garment 3900 can include a zipper to facilitate donning. The zipper can include a protruded geometry that can allow users to avoid contaminating the back of the surgical garment during the donning process and, additionally or alternatively, in use.

Each of the fans in the above-described embodiments can be a conventional blade fan, or alternatively can be a "bladeless" fan or air multiplier. An air multiplier contains hidden blades (hidden from the exterior) driven by a brushless motor. Air travels through an intake, and then through a hollow channel, and then along an interior curved wall that leads to a ring-shaped angular slit. The curved path the air follows as it passes over the interior curved wall creates an area of negative pressure, which draws more air into the flow, thereby multiplying the airflow from the original air intake. This induced airflow is laminar or smooth as opposed to turbulent airflow in a conventional blade fan. A laminar airflow through a surgical helmet is highly advantageous because it cuts down on the noise caused by the fan, which noise can sometimes distract the person wearing the helmet, such as in an operating room. Moreover, because air multipliers are more efficient, less power is consumed during operation, leading to a longer battery life.

It should be understood that the features described with respect to one embodiment can be used in other embodiments, as would be appreciated by one of ordinary skill in the art. For example, a particular figure and corresponding explanation may focus on the location of air vents while another figure and corresponding explanation may focus on how the face shield is attached to the helmet or where the lighting components are located. Such features can be combined and indeed are preferred to be to form a holistic helmet, but the concepts and features are divided out in the drawings for clarity of description purposes. A list of examples is provided below to emphasize that A list of numbered examples of the present subject matter follow:

Example 1 is a surgical helmet assembly, comprising: a helmet enclosure shaped to encircle a head of a user including a brow bar portion at a front of the helmet enclosure that is shaped to extend along a brow or a forehead of the user and a stabilizer shaped to extend downward from the helmet enclosure in front of ears of the user; a fan retained in the helmet enclosure; a face shield that is transparent and coupleable to at least the brow bar portion by one or more of a hook and loop fastener and a post protruding from the brow bar portion; a headband shaped to extend across an occiput region of the user's head coupled to the helmet enclosure; and a surgical garment coupleable to the helmet enclosure for covering at least the head and shoulders of a user in use, wherein the brow bar portion has vents disposed therein to direct airflow pushed through the helmet enclosure from the fan onto the user.

In Example 2, the subject matter of Example 1 optionally includes a light coupled to the brow bar portion.

In Example 3, the subject matter of any one or more of Examples 1-2 optionally includes a light integrated into the brow bar portion.

In Example 4, the subject matter of any one or more of Examples 1-3 optionally includes a light that is a light-emitting diode.

In Example 5, the subject matter of any one or more of Examples 1-4 optionally includes an adjustable headband.

In Example 6, the subject matter of Example 5 optionally includes the headband having a knob operable to selectively adjust the headband.

In Example 7, the subject matter of any one or more of Examples 1-6 optionally includes a face shield comprising a fluid-repelling coating applied thereto.

In Example 8, the subject matter of any one or more of Examples 1-7 optionally includes a stabilizer comprising vents disposed therein to direct airflow pushed through the helmet enclosure from the fan onto the user.

In Example 9, the subject matter of any one or more of Examples 1-8 optionally includes a fan that is a blade fan.

In Example 10, the subject matter of any one or more of Examples 1-8 optionally includes a fan that is an air multiplier.

In Example 11, the subject matter of Example 10 optionally includes an air multiplier having blades driven by a brushless motor.

In Example 12, the subject matter of any one or more of Examples 1-11 optionally includes an AAMI (Association for the Advancement of Medical Instrumentation) level 4 poly-reinforced fabric in critical areas.

In Example 13, the subject matter of any one or more of Examples 1-12 optionally includes a breathable AAMI level 2 fabric in non-critical areas.

In Example 14, the subject matter of any one or more of Examples 1-13 optionally includes a surgical garment having a pair of sleeves comprising a breathable fabric having a non-slip film applied thereto.

In Example 15, the subject matter of any one or more of Examples 1-14 optionally includes a surgical garment having a perforated section at the bottom to enable customization of a length of the surgical garment.

Example 16 is a surgical helmet assembly, comprising: a helmet enclosure shaped to encircle a head of a user comprising a brow bar portion at a front of the helmet enclosure that is shaped to extend along a brow or a forehead of the user, a stabilizer shaped to extend downward from the helmet enclosure in front of ears of the user, and a fan retained in the helmet enclosure, the brow bar portion including a light, and the helmet enclosure defining at least one conduit in fluidic communication with the fan and vents disposed in the brow bar portion; a face shield that is transparent and coupleable to at least the brow bar portion by one or more of a hook and loop fastener and a post protruding from the brow bar portion; a headband shaped to extend across an occiput region of the user's head, the headband coupleable to the helmet enclosure, and a surgical garment coupleable to the helmet enclosure for covering at least the head and shoulders of a user in use, wherein the vents disposed in the brow bar portion direct airflow pushed through the at least one conduit in helmet enclosure from the fan onto the user.

In Example 17, the subject matter of Example 16 optionally includes a stabilizer having vents disposed therein to direct airflow pushed through the at least one conduit in the helmet enclosure from the fan onto the user.

In Example 18, the subject matter of any one or more of Examples 16-17 optionally includes a fan that is an air multiplier.

In Example 19, the subject matter of Example 18 optionally includes the air multiplier having blades driven by a brushless motor.

In Example 20, the subject matter of any one or more of Examples 16-19 optionally includes an AAMI (Association for the Advancement of Medical Instrumentation) level 4 poly-reinforced fabric in critical areas and breathable AAMI level 2 fabric in non-critical areas.

Each of these non-limiting examples and embodiments can stand on its own, or can be combined in various permutations or combinations with one or more of the other examples or embodiments. Furthermore, features from one embodiment can be used in other embodiments. For example, an embodiment may focus on the location of air vents while another embodiment may focus on how the face shield is attached to the helmet. Such embodiments can be combined and indeed are expected to be, but the concepts were divided out in the specification and drawings for clarity of description purposes.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A surgical helmet assembly, comprising:
   a helmet enclosure shaped to engage a head of a user including a brow bar portion at a front of the helmet enclosure that is shaped to extend along a brow or a forehead of the user and a stabilizer shaped to extend downward from the helmet enclosure in front of ears of the user;
   a fan attached to in the helmet enclosure;
   a face shield that is transparent and coupleable to at least a portion of the helmet enclosure;
   a headband shaped to extend across an occiput region of the user's head coupled to the helmet enclosure;
   a light emitter extending through the brow bar; and
   a surgical garment coupleable to the helmet enclosure for covering at least the head and shoulders of a user in use;
   wherein the brow bar portion has vents disposed therein to direct airflow pushed through the helmet enclosure from the fan onto the user.

2. The surgical helmet assembly of claim 1, further comprising a light emitter connected to a light source via a light pipe, wherein the light source comprises a light-emitting diode located within an interior of the helmet enclosure remote from the light emitter.

3. The surgical helmet assembly of claim 1, wherein the face shield is configured to be at least partially supported by the shoulders of the user.

4. The surgical helmet assembly of claim 1, wherein the stabilizer comprises a first stabilizer and a second stabilizer, each of the first and second stabilizers comprising a protrusion that terminates along a side of the head of the user.

5. The surgical helmet assembly of claim 1, wherein the helmet enclosure comprises a fan enclosure forming a circular opening configured to be located at a parietal bone of the user.

6. The surgical helmet assembly of claim 5, wherein the fan comprises an air multiplier comprising blades driven by a brushless motor, wherein the blades are hidden from an exterior of the surgical helmet assembly from any vantage-point.

7. The surgical helmet assembly of claim 6, wherein the circular opening comprises a ring-shaped annular slit configured to discharge air from the air multiplier.

8. The surgical helmet assembly of claim 1, wherein the surgical garment comprises:
- Association for the Advancement of Medical Instrumentation (AAMI) level 4 poly-reinforced fabric in critical areas;
- breathable AAMI level 2 fabric in non-critical areas;
- a pair of sleeves comprising a breathable fabric having a non-slip film applied thereto; and
- a perforated section at the bottom to enable customization of a length of the surgical garment.

9. A surgical helmet assembly, comprising:
- a helmet enclosure shaped to encircle a head or a neck of a user comprising an annular air duct portion, and a fan retained in the helmet enclosure, and the annular air duct defining at least one conduit in fluidic communication with the fan and vents disposed in the helmet enclosure;
- a face shield that is transparent and coupleable to the surgical helmet assembly;
- a headband shaped to extend across an occiput region of the user's head;
- a light source connected to the surgical helmet assembly and configured to emit light through the face shield, the light source including a heat sink that is external to the light housing and within the helmet; and
- a surgical garment coupleable to the helmet enclosure for covering at least the head and shoulders of a user in use.

10. The surgical helmet assembly of claim 9, wherein the helmet enclosure comprises a first stabilizer and a second stabilizer, each of the first and second stabilizers configured to extend downward from the annular air duct in front of ears of the user, and each of the first and second stabilizers comprises a protrusion extending from the annular air duct that terminates along a side of the head of the user and a vent disposed therein to direct airflow pushed through the at least one conduit in the helmet enclosure from the fan onto the user.

11. The surgical helmet assembly of claim 9, wherein the fan comprises an air multiplier comprising:
- blades hidden from an exterior of the surgical helmet assembly by the helmet enclosure; and
- a ring-shaped annular slit in the annular air duct to discharge air from the fan onto the user.

12. The surgical helmet assembly of claim 9, further comprising a light emitter connected to a light source via a light pipe.

13. The surgical helmet assembly of claim 9, wherein the helmet enclosure comprises a shoulder harness incorporating the annular air duct, the shoulder harness being configured to be positioned on the shoulders of the user, wherein the shoulder harness comprises one or more air outlets disposed in the annular air duct and in communication with the fan in order to direct airflow to the face or back of the user.

14. The surgical helmet assembly of claim 9, further comprising a control extension, the control extension being either located in the helmet enclosure or suspended from the helmet enclosure.

15. The surgical helmet assembly of claim 9, wherein:
the light source is connected to the headband; and
the surgical helmet assembly further comprises a flexible connection extending between the light source and the helmet enclosure.

16. A surgical helmet assembly comprising:
- a helmet enclosure comprising a brow bar having an air conduit;
- a fan coupled to the helmet enclosure;
- a face shield extending from the helmet enclosure; and
- a light assembly comprising:
    - a light emitter connected to the helmet enclosure;
    - a light source comprising a light-emitting diode located with an interior of the helmet enclosure; and
    - a light pipe connecting the light emitter and the light source, wherein the light pipe extends through an internal passage within the brow bar.

17. The surgical helmet assembly of claim 15, wherein:
the helmet enclosure comprises an annular conduit including a ring-shaped annular slit configured to discharge air from the annular conduit; and
the fan comprises an air multiplier including blades hidden from an exterior of the surgical helmet assembly and configured to drive air out the annular conduit.

18. The surgical helmet assembly of claim 1, wherein the brow bar includes an interior for receiving cooling air and an exterior that forms a tunnel for receiving the light emitter.

19. The surgical helmet assembly of claim 9, wherein the face shield extends inferiorly so as to be configured to be at least partially directly supported by shoulders of the user.

20. The surgical helmet assembly of claim 9, wherein the helmet enclosure includes a brow bar that wraps around the light source.

* * * * *

UNITED STATES PATENT AND TRADEMARK OFFICE
CERTIFICATE OF CORRECTION

| | |
|---|---|
| PATENT NO. | : 11,284,655 B2 |
| APPLICATION NO. | : 16/874227 |
| DATED | : March 29, 2022 |
| INVENTOR(S) | : Pavalarajan et al. |

It is certified that error appears in the above-identified patent and that said Letters Patent is hereby corrected as shown below:

In the Claims

Column 24, Line 30, Claim 17, delete "claim 15," and insert --claim 16,-- therefor Signed and Sealed this
Seventeenth Day of May, 2022

Katherine Kelly Vidal
*Director of the United States Patent and Trademark Office*